United States Patent
Takaura et al.

(10) Patent No.: US 6,670,642 B2
(45) Date of Patent: Dec. 30, 2003

(54) SEMICONDUCTOR MEMORY DEVICE USING VERTICAL-CHANNEL TRANSISTORS

(75) Inventors: Norikatsu Takaura, Kokubunji (JP); Hideyuki Matsuoka, Nishitokyo (JP); Riichiro Takemura, Tokyo (JP); Kousuke Okuyama, Kawagoe (JP); Masahiro Moniwa, Sayama (JP); Akio Nishida, Tachikawa (JP); Kota Funayama, Hitachinaka (JP); Tomonori Sekiguchi, Kokubunji (JP)

(73) Assignee: Renesas Technology Corporation., Tokyo (JP)

( * ) Notice: Subject to any disclaimer, the term of this patent is extended or adjusted under 35 U.S.C. 154(b) by 5 days.

(21) Appl. No.: 10/051,188

(22) Filed: Jan. 22, 2002

(65) Prior Publication Data
US 2003/0136978 A1 Jul. 24, 2003

(51) Int. Cl.$^7$ ............................................. H01L 29/72
(52) U.S. Cl. .................. 257/67; 257/302; 257/331; 257/333; 257/351; 257/377; 257/393
(58) Field of Search .................... 257/67, 302, 331, 257/333, 351, 377, 393

(56) References Cited

U.S. PATENT DOCUMENTS

| 5,198,683 | A | 3/1993 | Sivan |
|---|---|---|---|
| 5,341,327 | A | 8/1994 | Kuriyama |
| 5,576,238 | A | 11/1996 | Fu |
| 6,204,518 | B1 | 3/2001 | Adan et al. |
| 6,229,161 | B1 | 5/2001 | Nemati et al. |
| 6,309,930 | B1 * | 10/2001 | Goebel et al. .............. 257/302 |

FOREIGN PATENT DOCUMENTS

| JP | 9-232447 | 2/1996 |
|---|---|---|
| WO | WO00/70622 | 5/1999 |

* cited by examiner

Primary Examiner—Edward Wojciechowicz

(57) ABSTRACT

The invention provides a semiconductor memory device comprising a plurality of word lines, a plurality of bit lines, and a plurality of static memory cells each having a first, second, third, fourth, fifth, and sixth transistors. While each of channels of the first, second, third, and fourth transistors are formed vertical against a substrate of the semiconductor memory device. Each of semiconductor regions forming a source or a drain of the fifth and sixth transistors forms a PN junction against the substrate. According to another aspect of the invention, the SRAM device of the invention has a plurality of SRAM cells, at least one of which is a vertical SRAM cell comprising at least four vertical transistors onto a substrate, and each vertical transistor includes a source, a drain, and a channel therebetween aligning in one aligning line which penetrates into the substrate surface at an angle greater than zero degree.

23 Claims, 52 Drawing Sheets

SEMICONDUCTOR MEMORY DEVICE USING VERTICAL-CHANNEL TRANSISTORS

BACKGROUND OF THE INVENTION

1. Field of the Invention

The invention generally relates a SRAM device having at least one vertical SRAM cell comprising vertical transistors to reduce the memory cell size. In particular, the invention relates to a SRAM device having at least one vertical SRAM cell comprising at least four vertical transistors.

2. Description of Related Arts

U.S. Pat. No. 5,576,238 refers to one species of SRAM cells including four transistors and two resistors (4T/2R), which is slow and consumes high power. The embodiment shown in its FIG. 7 has two vertical transistors formed above the resistors, which are in turn formed above two regular transistors grown on the substrate. There is no vertical transistor above any other vertical transistors.

U.S. Pat. No. 5,341,327 tried to reduce the cell size problem by adopting all thin film transistors ("TFT") in a six-transistor (6T) SRAM cell, which circuit chart is shown in its FIG. 36. As shown in its FIG. 5, a pair of transfer transistors Q3 and a pair of driver transistors Q1 are provided, which are constituted with n-type TFTs. A pair of p-type load transistors Q5 is formed on the surface of the interlayer insulation layer. The TFT 6T SRAM cell is smaller than the 4T/2R SRAM cell but still slow.

U.S. Pat. No. 5,198,683 further reduces the cell area by providing a pair of load TFTs having a vertical channel along with the other four regular transistors within a six-transistor (6T) SRAM cell. However, the vertical load TFTs are located in the same layer as the other four regular TFTs such that the sources and drains of the vertical load TFTs inevitably bent horizontally. As such, the size-reducing effect of this structure is relatively limited by its one-layer structure U.S. Pat. No. 6,309,930 shares the same problem. As shown in its FIG. 4, the ends of the drain and sources 4S/D1, 4S/D2 of the 4$^{th}$ transistor bent horizontally.

For a totally different purpose from reducing the cell size, i.e., to reduce one wiring layer, JP Pat. App. No. 09-232447 adopts a vertical channel structure for one TFT so as to share the substrate as a wiring layer between the gate electrode of the vertical TFT with another regular transistor in its FIG. 7D. Incidentally, a vertical source and a vertical drain are provided to work in conjunction with a vertical channel. The reference merely suggests applying a pair of the vertical TFTs as load transistors in the same layer with the other four regular transistors to form a SRAM cell.

A bulk 6T SRAM cell has six transistors grown in a bulk semiconductor substrate, such as single crystal silicon. A 6T bulk SRAM cell is faster than the 4T/2R SRAM cell or the 6TFT SRAM cell. It is often fabricated in CMOS (complementary metal oxide semiconductor) technology with four of the transistors being n-channel devices while the remaining two transistors are p-channel devices. This 6T configuration offers several advantages including operating at a low level of power and at a high speed. However, 6T SRAM cells utilizing transistors formed in a bulk substrate consume a large area since the bulk transistors are formed next to one another in the substrate and are essentially in the same plane. As such, it is difficult to fabricate the conventional bulk 6T SRAM to a high density.

U.S. Pat. No. 6,204,518 B1 reduces the bulk 6T SRAM cell size by stacking a pair of load transistors Q3 and Q4 above a pair of drive transistors Q1 and Q2 as well as a pair of transfer transistors Q5 and Q6. The respective circuit diagram and a cross sectional view of the structure are provided in its FIG. 1. U.S. Pat. Nos. 6,271,542 B1 and 2001/0028059 A1 take the same approach.

PCT/JP99/02505 discloses a pair of PLED devices to be incorporated in a flip-flop, nonvolatile 6T SRAM cell as in its FIG. 1. As shown in the cross sectional view of the PLED device in its FIG. 3, the insulation layers 708, 709, and 710 are provided between the source 701 and the drain 700 to reduce the leakage current to a substantially zero value. The PLED device is merely designed as an external device to the 6T SRAM cell.

U.S. Pat. No. 6,229,161 is directed to another species of SRAM cells including a negative differential resistance ("NDR") device coupled with a NMOS transistor (only two elements: 1T/1R) such that it takes less space than a 6T SRAM cell. In its FIG. 6, the NDR device with a thin vertical PNPN structure is coupled with a vertically-arranged NMOS. Since one of the drain and the source of the NMOS transistor are grown in the substrate, it bents horizontally.

Currently, there is a demand to further reduce the low-power SRAM cell size than the prior art structures so as to accommodate more compact cellular phones, PDAs, and other mobile devices.

SUMMARY OF THE INVENTION

It is a purpose of this invention to provide small and low power SRAM cells in a SRAM device.

It is another purpose of this invention to provide 64M or 128 M bit ultra low power SRAM for cellular phone, and high density cache SRAM.

According to one aspect of the invention, the semiconductor memory device comprises a plurality of word lines, a plurality of bit lines, and a plurality of static memory cells each having a first, second, third, fourth, fifth, and sixth transistors. While each of channels of the first, second, third, and fourth transistors are formed vertical against a substrate of the semiconductor memory device. Each of semiconductor regions forming a source or a drain of the fifth and sixth transistors forms a PN junction against the substrate.

According to a more specific aspect of the invention, the gate electrodes of the fifth and sixth transistors are coupled to the word lines, and each source-drain path of the fifth and sixth transistors are coupled to the bit lines. Alternatively, the gate electrode of the fifth transistor is coupled to the drain of the sixth transistor, the gate electrode of the sixth transistor is coupled to the drain of the fifth transistor, and each of the fifth and sixth transistors has the same conductivity type as the first and second transistors. Otherwise, the gate electrode of the fifth transistor is coupled to the drain of the sixth transistor, the gate electrode of the sixth transistor is coupled to the drain of the fifth transistor, and each of the fifth and sixth transistors has a different conductivity type from the first and second transistors.

According to a more specific aspect of the invention, the gate electrodes of the first and second transistors are formed on a first layer, and the gate electrodes of the third and fourth transistors are formed on a second layer. Alternatively, the gate electrode of the first transistor is formed on a first layer, the gate electrode of the second transistor is formed on a second layer, the gate electrode of the third transistor is formed on a third layer, and the gate electrode of the fourth transistor is formed on a fourth layer.

According to a more specific aspect of the invention, a column forming the channel of the first transistor is covered with a gate electrode surrounding a cylindrical surface of the column with an insulating layer therebetween. The channels of the fifth, and sixth transistor are formed vertical against the substrate, and wherein the substrate is made of single crystal silicon.

According to another aspect of the invention, the SRAM device has a plurality of SRAM cells, at least one of which is a vertical SRAM cell comprising at least four vertical transistors onto a substrate, and each vertical transistor includes a source, a drain, and a channel therebetween aligning in one aligning line which penetrates into the substrate surface at an angle greater than zero degree.

According to a more specific aspect of the invention, the angle is 90 degree.

According to a more specific aspect of the invention, the vertical SRAM cell further comprises a pair of resistors, a pair of horizontal transistors, or an additional pair of vertical transistors.

According to a more specific aspect of the invention, the pair horizontal transistors or the additional pair of vertical transistors operate as a pair of transfer, drive, or load MOS transistors, and the load transistors are PMOS transistors while the transfer and driver transistors are NMOS transistors.

According to a more specific aspect of the invention, the four vertical transistors are divided into two groups located in two different levels, and the vertical SRAM cell further comprises the pair of resistors or the additional pair of vertical transistors, either pair is arranged in one of the two levels, or above, below, or in between the two levels. Further more, the transistors or resistors located in different levels are selectively connected to each other via at least one vertical interconnect which is parallel with the aligning line.

According to an even more specific aspect of the invention, the vertical interconnect cross links with at least one of a horizontal interconnect, a horizontal Vcc beam, and a horizontal Vss beam, each of which is parallel with the substrate surface.

According to an even more specific aspect of the invention, the vertical interconnect penetrates through at least one gate electrode of the vertical transistor with a first dimension and a second dimension parallel with the substrate surface, and a third dimension parallel with the aligning line. Further more, the vertical interconnect penetrates through at least two of the gate electrodes.

According to a more specific aspect of the invention, the above-mentioned at least one vertical interconnect include two vertical interconnects connecting with two vertical transistors respectively thereby forming one unit SRAM cell thereamong in a shape of a diagonal or parallelogram on a cross section parallel with the substrate surface.

According to a more specific aspect of the invention, the vertical SRAM cell further comprises at least one pair bit lines being respectively connected to at least one of the transistors and resistors via two vertical interconnects which are parallel with the aligning line, and each of the bit lines is connected with a plurality of bit line contacts, each of which is shared by two adjacent SRAM cells of the plurality of SRAM cells.

According to a more specific aspect of the invention, each vertical transistor further includes a gate electrode with a first dimension and a second dimension parallel with the substrate surface, and a third dimension parallel with the aligning line.

According to another aspect of the invention, the SRAM device further comprises at least another vertical SRAM cell built above the vertical SRAM cell with a dielectric layer therebetween.

BRIEF DESCRIPTION OF THE DRAWINGS

The foregoing and additional features and characteristics of the present invention will become more apparent from the following detailed description considered with reference to the accompanying drawings, in which like reference numerals designate like elements and wherein.

DESCRIPTION OF THE PREFERRED EMBODIMENTS

In order to more clearly and concisely describe the subject matter of the claims, the following definitions are intended to provide guidance as to the meanings of specific terms used in the following written description. Also it is to be understood that the phraseology or terminology employed herein is for the purpose of description and not of limitation. As used herein 'A vertical transistor' built onto a substrate or an insulation layer includes a source, a drain, and a channel therebetween aligning in one aligning line which penetrates into the substrate surface at an angle greater than zero degree. In other word, it does not have to be vertical to the ground surface or any substrate surface. The end of the source or the drain of a vertical SRAM cell may deviate from the aligning line for any design consideration. Preferably, the gate electrode of the vertical transistor has a first dimension and a second dimension parallel with the substrate surface, and a third dimension parallel with the aligning line. However, such a dimensional arrangement is also subject to change for any design consideration. The vertical transistor may be a bulk transistor, a TFT, or the like.

'A vertical SRAM cell' includes at least four of the vertical transistors. For example, a 6T SRAM cell may includes a pair of traditional transistors (horizontal) or another pair of vertical transistors. A 4T/2R SRAM includes a pair of resistors. By analogy, other species of SRAM adopted at least four vertical transistors are intended in the invention.

'A vertical SRAM device' includes at least one vertical SRAM cell.

'A vertical interconnect' is an interconnect in the vertical SRAM cell for connecting between transistors, resistors, voltage lines, word lines, or bit lines in a direction generally aligning with the aligning line. In other word, it does not have to be vertical to the ground surface or any substrate surface.

'A horizontal transistor' is grown onto a substrate or an insulation layer according to the prior art which includes a pair of P-N junctions against the substrate. In other word, it does not have to be parallel with the ground surface or any substrate surface.

'A horizontal interconnect' is an interconnect in the vertical transistors with a connecting direction generally perpendicular to the aligning line. In other word, it does not have to be parallel with the ground surface or any substrate surface.

First Embodiment

Figure 1:
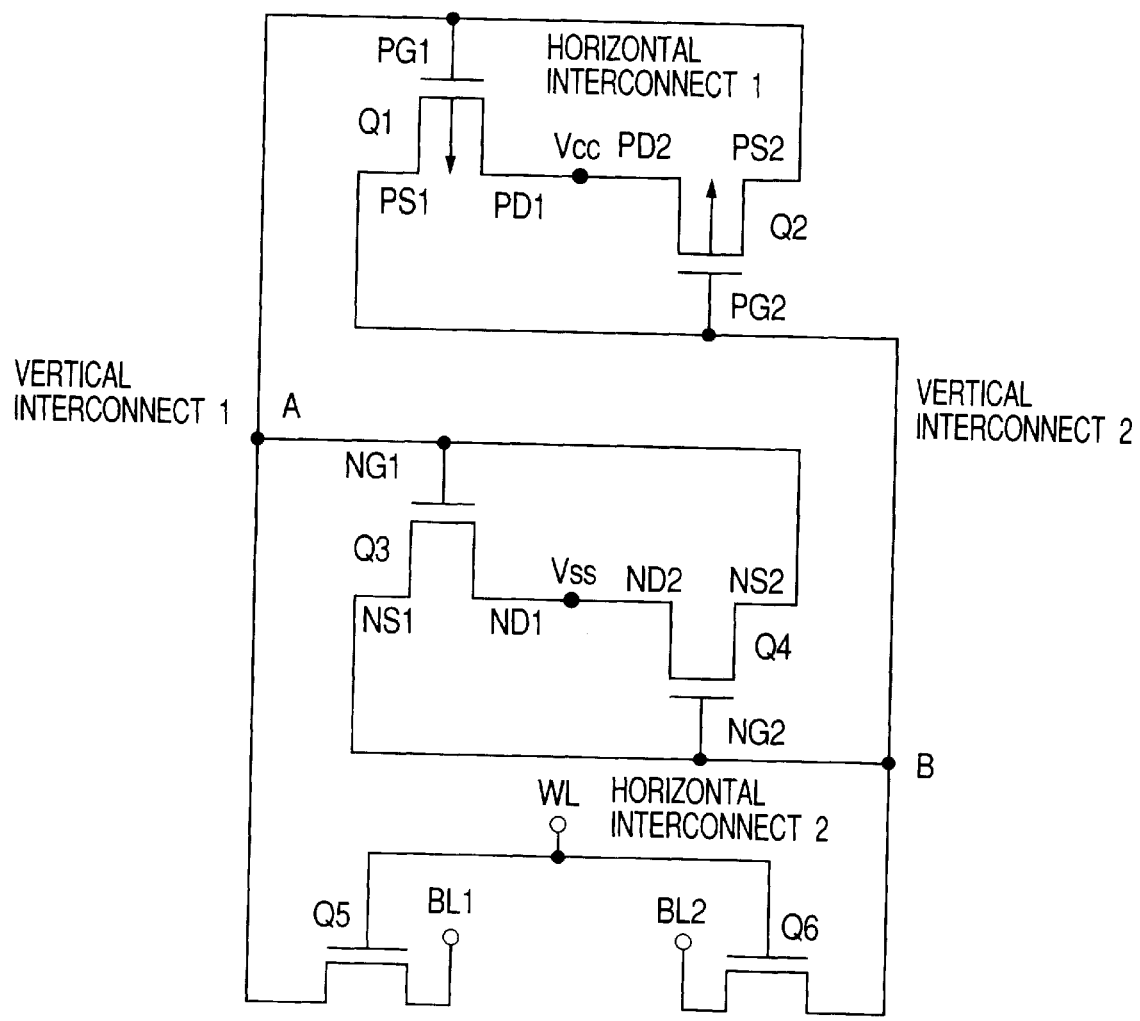
FIG. 1 is a circuit diagram of the first embodiment of the vertical SRAM cell according to the invention.

Referring to the circuit diagram in FIG. 1, a 6T vertical SRAM according to a first embodiment of the invention includes two load PMOS transistors Q1 and Q2 and two drive NMOS transistors Q3 and Q4 which are formed above two transfer NMOS transistors Q5 and Q6 made in the crystal Si wafer substrate. The positions of the load MOSs and the drive MOSs can be switched as long as the transfer MOSs stay at the bottom (in the substrate). NODE A connects the sources of the load transistor Q2, the drive transistor Q4, and the transfer transistor Q5, as well as the gate electrodes of the load transistor Q1 and the drive transistor Q3. NODE B connects the sources of the load transistor Q1, the drive transistor Q3, and the transfer transistor Q6, as well as the gate electrodes of the load transistor Q2 and the drive transistor Q4. As shown in the 3D diagram of the first embodiment (FIG. 2), Q1 includes a source 8, a gate electrode 2, and a drain 7. Q2 includes a source 8', a gate electrode 2', and a drain 7'. Q3 includes a source 6, a gate electrode 1, and a drain 5. Q4 includes a source 6', a gate electrode 1' and a drain 5'. The source and the drain of each vertical transistor in the invention have generally uniform characteristics such that they can be swapped without affecting the performance of the relevant vertical transistor. Q5, Q6 (not shown) are constructed underneath the structure shown in FIG. 2.

All the building blocks in the 3D drawings of the specification are simplified as beams, columns, bricks, boards, sticks, straps, etc., which shapes are only suggestive rather than restrictive, and they could become irregular during the semiconductor manufacturing process. In addition, the dimensions of the building blocks may be extended so as to be connected to building blocks of other SRAM cells or for other deign purposes. Further more, the orientations of the building blocks are generally arranged as (1) either vertical or horizontal, and (2) aligning with one another in parallel or crossing at 45, 60, or 90 degrees for simplification, which may be deviated for any design consideration or manufacturing limitation.

A pair of bit lines 9 (true), 9' (bar), a pair of bit line contacts 10, 10', and a word line 11 are built above the horizontal transistors. Each of the transfer transistors Q5 and Q6 includes an active region. Above the drive transistors Q3 and Q4 are two horizontal interconnect beams 3 & 3' buried in an inter-layer insulating film. The horizontal interconnect beam 3' connects Q2, Q4 to the vertical interconnect column 4, and the horizontal interconnect beam 3 connect Q1, Q3 to the vertical interconnect column 4'. Q1, Q2 are connected to Vcc beams 12, 12' respectively, and Q3, Q4 are connected to Vss beams 13, 13' respectively. FIG. 3 shows a side view of the structure in FIG. 2 looking from the plane of the front end of the word line 11 (WL). Thus, high integration and low-drive-voltage operation become possible.

The six transistors of the invention can be either bulk MOS transistors, or TFTs. The six transistors preferably are four n-channel devices and two p-channel devices, but may also be four p-channel devices and two n-channel devices enabling the SRAM to be fabricated in either NMOS or PMOS technology. Alternatively, the MOS (metal-oxide-semiconductor) transistors may be substituted by MIS (metal-insulator-semiconductor) transistors. The two regular (horizontal) transistors formed in the substrate preferably function as transfer elements. The dopant concentrations are set according to any design consideration entertained by one skilled in the art. A disadvantage with implementing a vertical SRAM design is that fabrication complexity is increased in comparison to a conventional 6T SRAM cell as a result of the additional horizontal and the vertical interconnects.

The process flow of the first embodiment is explained below as an example of this invention. The other embodiments of the invention can be implemented on an area of different size using a similar manufacturing process. The fabrication of this cell structure is based on existing CMOS technology with additional epitaxial growth steps to build the vertical transistors, and this process can be similar to conventional DRAM capacitor stacking techniques with the capacitor being replaced by the vertical transistors.

Figure 2:
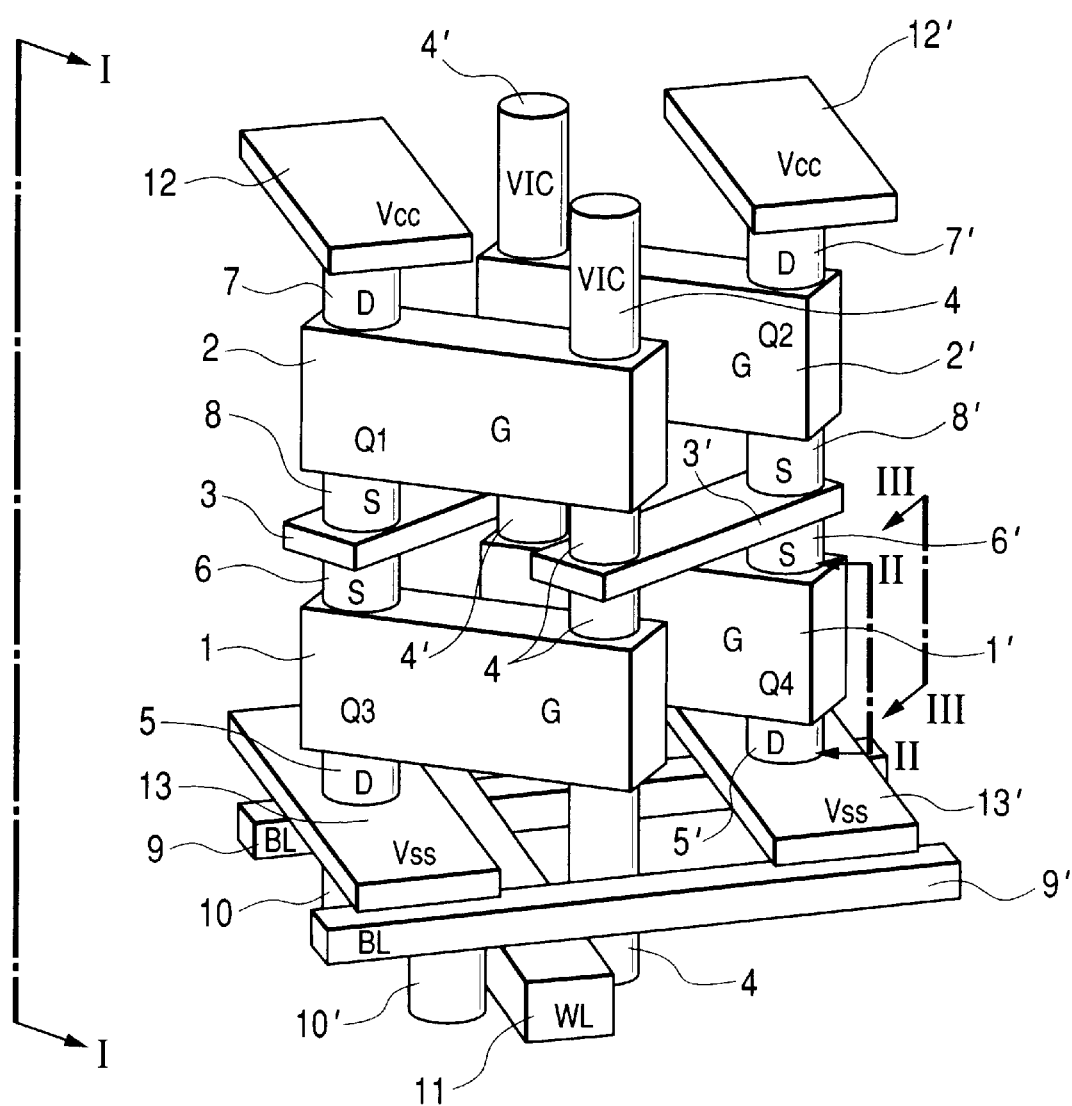
FIG. 2 is a three-dimensional (3D) perspective view of the structure of the first embodiment of the vertical SRAM cell according to the invention in FIG. 1.
Figure 3:
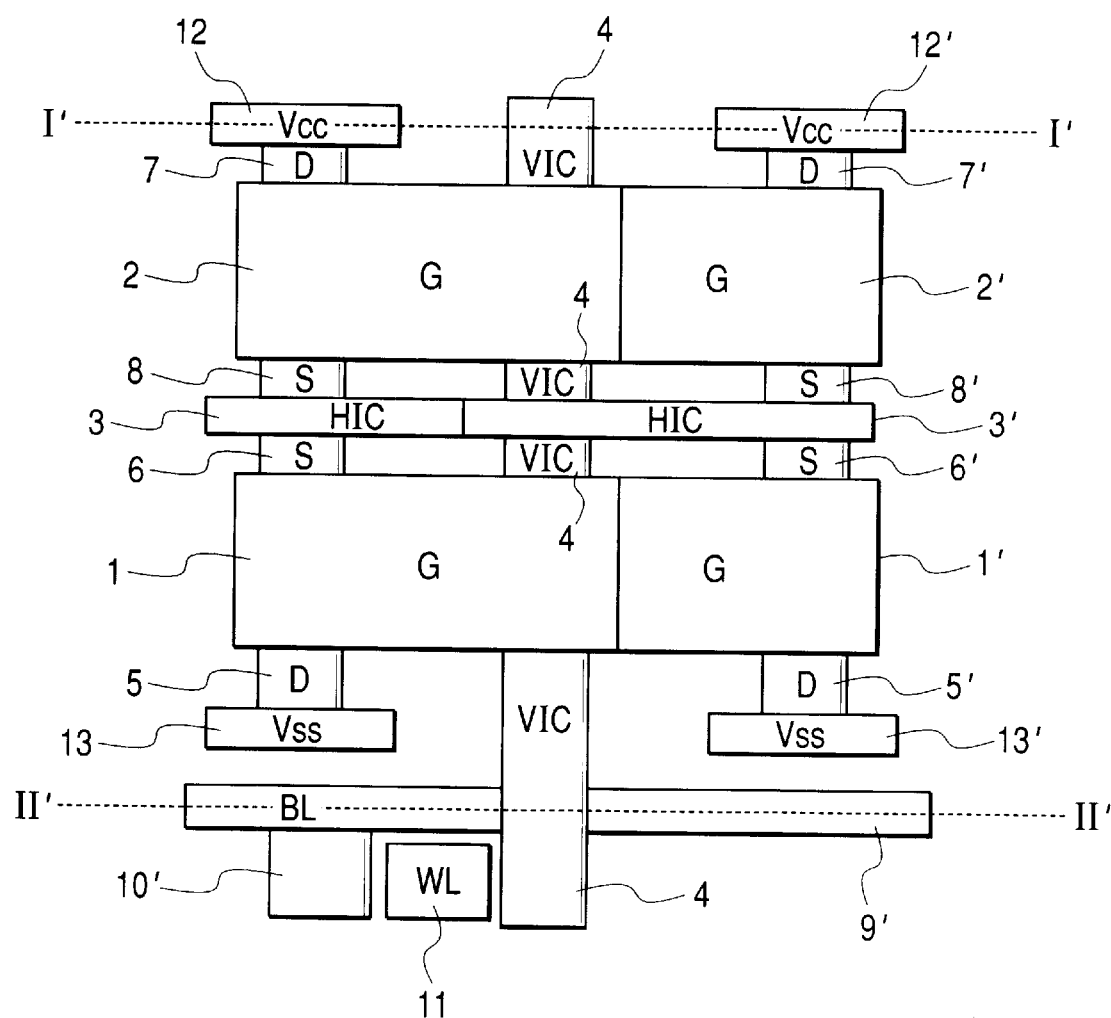
FIG. 3 shows a side view of the 3D structure in FIG. 2 from the plane of the front end of the word line 11 (WL).
Figure 4:
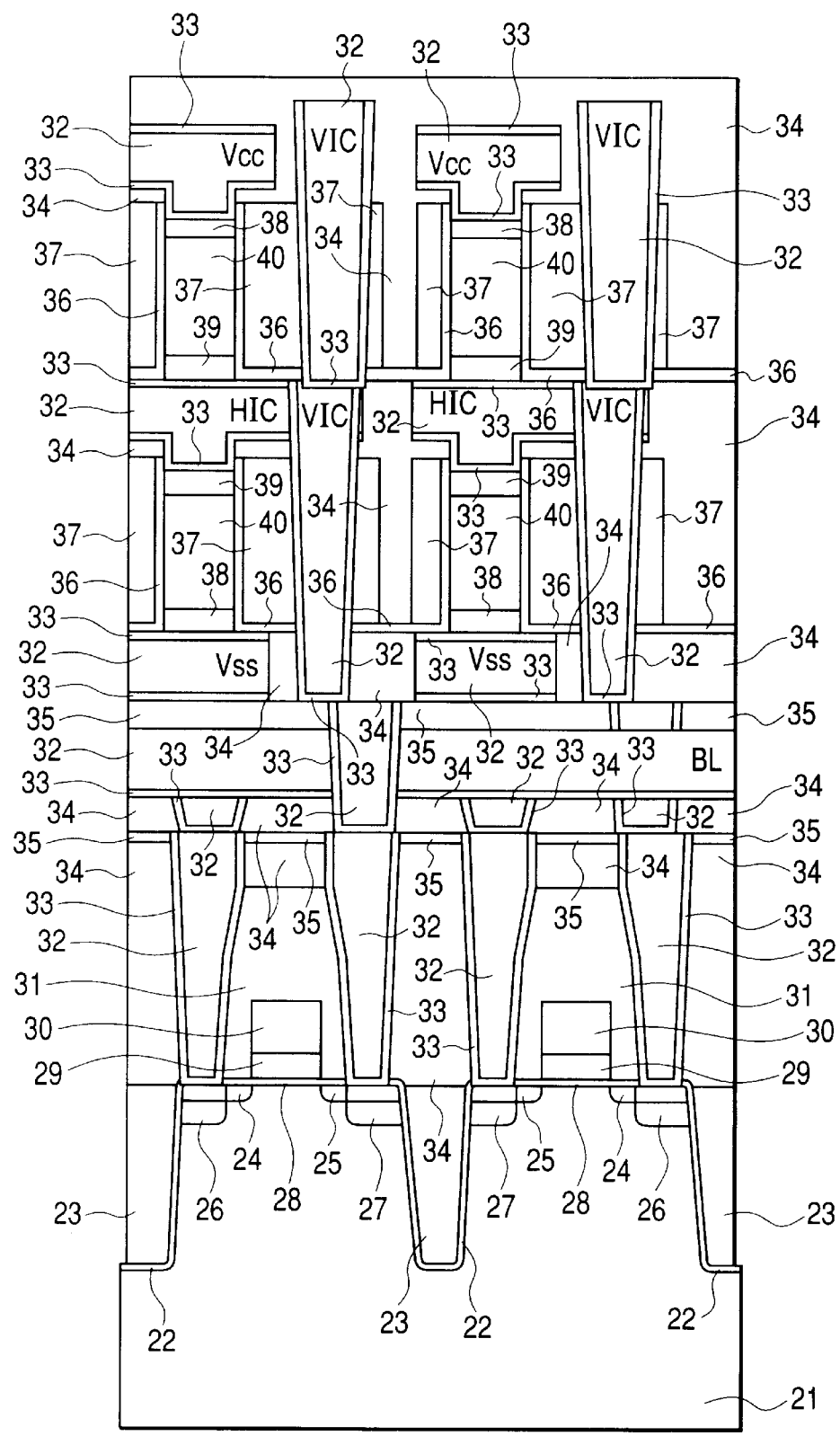
FIG. 4 depicts a cross sectional view of the vertical SRAM cell taken at plane I—I of FIG. 2.

The cross sectional view of the vertical SRAM cell in FIG. 2 taken at plane I—I is shown in FIG. 4 (two adjacent SRAM cells are shown). The process for manufacturing the vertical SRAM cell starts with growing the two horizontal NMOS transistors Q5, Q6 on a silicon substrate 21, building two vertical PMOS transistors Q3, Q4 on the top of Q5, Q6, then applying the same steps to stack two vertical NMOS transistors Q1, Q2 on the top of Q3, Q4. In the following discussion, 32 denotes a tungsten layer or plug, 33 denotes a barrier metal, 34 denotes an interlayer dielectric layer, 35 denotes a silicon nitride (p-SiN) layer, 36 denotes silicon dioxide gate dielectric of a vertical transistor, 37 denotes a poly-silicon gate region or electrode of a vertical transistor, 38 denotes a poly-silicon source region of a vertical transistor, 39 denotes a poly-silicon drain region of a vertical transistor, and 40 denotes a poly-silicon channel region of a vertical transistor. A dash and a number is attached to the above numbers to represent different layers of the same material in the SRAM cell. The relative dimensions of the components are generally in proportion to FIG. 4.

Figure 5:
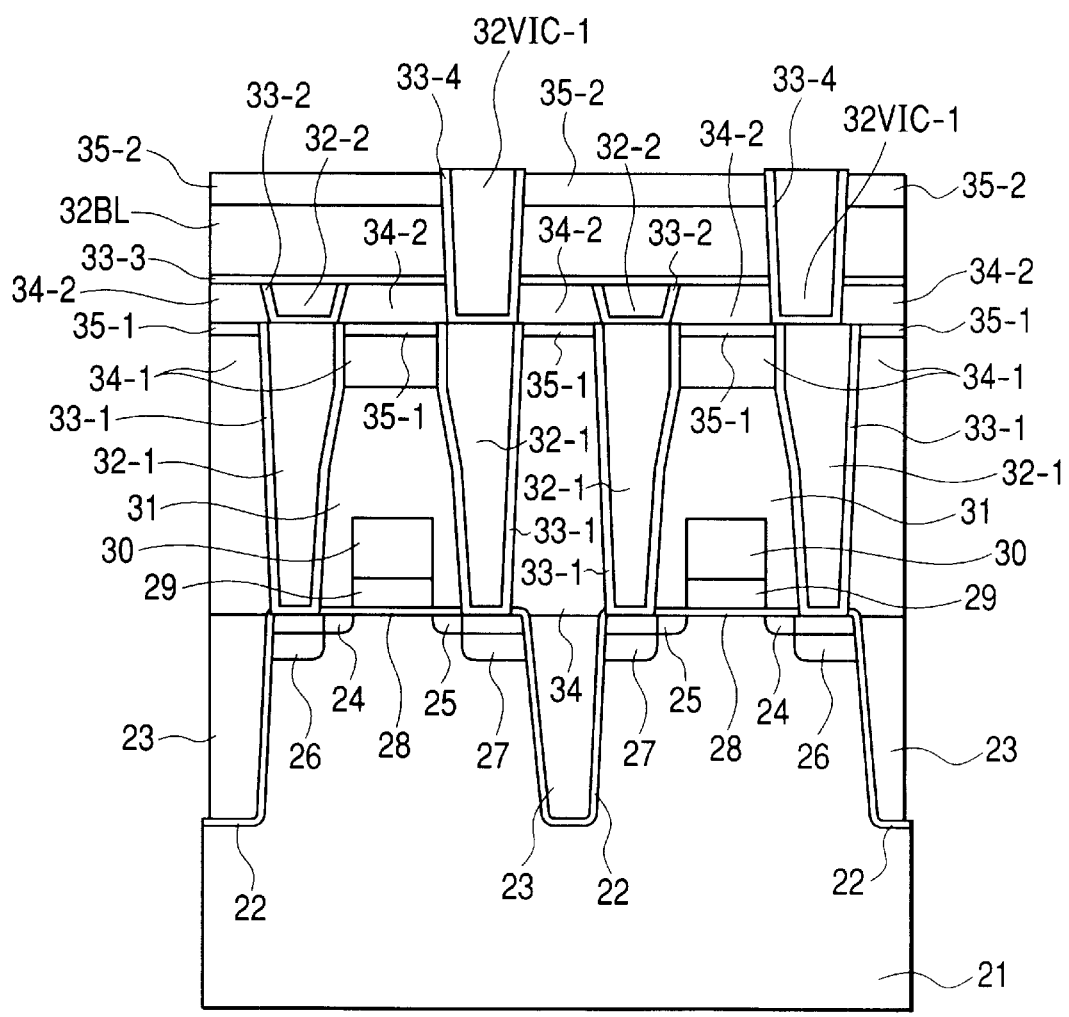
FIG. 5 depicts a cross sectional view of the first pair of transistors (horizontal) of the vertical SRAM cell in FIG. 4.

As shown in the cross sectional view of the first pair of transistors of the vertical SRAM cell of FIG. 5, the two NMOS horizontal transistors Q5, Q6 are formed with the traditional method by etching two holes on the p-type silicon substrate 21, depositing a linear silicon dioxide (diffusion barrier) 22 according to a STI LOCUS (Local Oxidization of Silicon) method, then filling the holes with a gap fill silicon dioxide 23. Then a thin gate silicon dioxide film 28 is generated by thermal oxidation. A poly-silicon gate electrode 29 is thermally and integrally formed with a word line WL. The gate electrode 29 (word line WL) may be constituted of a two-layer conductor film comprising a low resistance polysilicon film doped with an n-type impurity (e.g. P (phosphorus)) and a W silicide (WSi) film, or a three-layer conductor film wherein a low resistance polysilicon film, a TiN (titanium nitride) film and a W film are built up in sequence. A shallow source region 24 and a shallow drain region 25 are formed by ion-implanting impurity into the substrate 21, and a deep source region 26 and a deep drain region 27 are also ion-implanted into the substrate 21.

A silicon nitride film 31, a first interlayer dielectric 34-1, and a silicon nitride 35-1 are deposited by a CVD method over the gate electrode 29 in sequence. Then through anisotroic etching via photoresist masks into the three layers 31, 34-1, and 35-1 to form a side wall spacer next to the gate electrode 29 as well as four connection holes. The insulating film 31 may be constituted of a silicon oxide film in place of the silicon nitride film. A first set of tungsten plugs 32-1 is deposited by sputtering inside the connection holes after the deposition of a first barrier metal 33-1. Al alloy may be used in place of tungsten.

A second interlayer dielectric 34-2 is deposited by a CVD method. Then through anisotroic etching via a photoresist mask into the second interlayer dielectric 34-2, a first pair of BL contact holes are formed. A second barrier metal 33-2, a second tungsten layer 32-2 are deposited in sequence by a CVD method over the surface and into the pair of bit lines contact holes. Then the layers 33-2 and 32-2 are etched back to an even level with the surface of the second interlayer dielectric 34-2. Then a third barrier metal 33-3 and a tungsten layer 32BL are deposited in sequence by a CVD method over the surface. Then through anisotroic etching via photoresist masks into the 33-3, 32BL layers, a pair of BL beams are formed. The second interlayer dielectric 34-2 is again deposited over the surface and into the space between the BL 25 beams. Then the second interlayer dielectric 34-2 is etched back to a even level with the top of the BL beams: Accordingly, a pair of BL beams alternate with the interlayer dielectric beams 34-2 on the surface. Meanwhile, a pair of BL contacts (10, 10') are formed to connect one of the tungsten plug 32-1 to one of the BL beams.

A silicon nitride 35-2 is deposited by a CVD method. Then through anisotroic etching via 30 a mask into the two layers 34-2, 35-2 (area between the 32BL beams) to form a pair of vertical interconnect holes (to be connected via corresponding vertical interconnects to the to-be-built vertical transistors Q1, Q2, Q3, or Q4). A first pair of tungsten vertical interconnect 32VIC-1 are deposited by sputtering inside the connection holes after the deposition of a third barrier metal 33-3.

Figure 11:
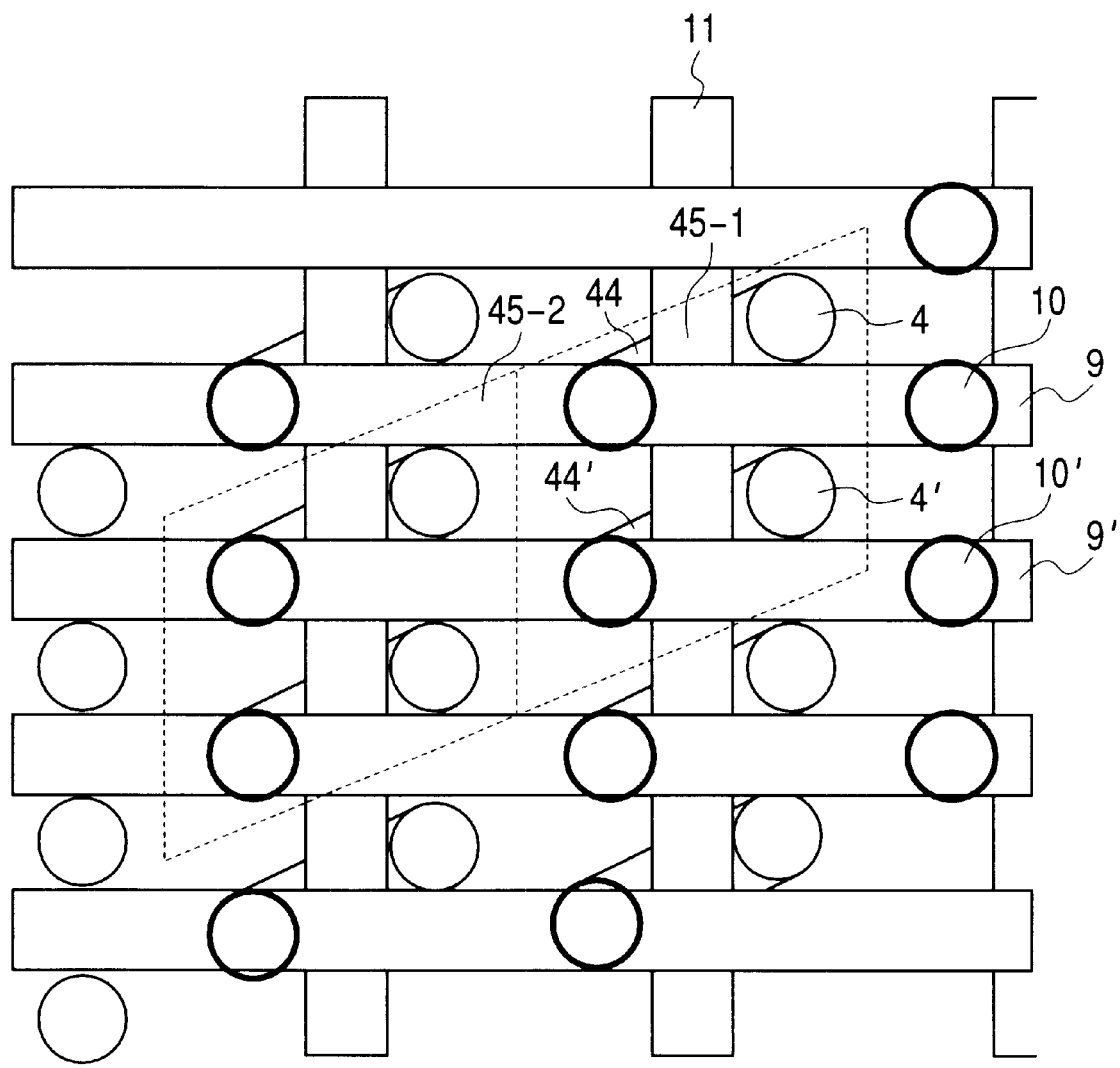
FIG. 11 schematically shows a top view of the horizontal transistors in the layout of a plurality of SRAM cells of the first embodiment of FIG. 2.

By looking down from a plane II'—II' in FIG. 3, FIG. 11 schematically shows the top view of the horizontal transistors in the layout of a plurality of SRAM cells of the first embodiment of FIG. 2. In particular, 44 & 44' denotes two active regions of the a pair of horizontal transistors Q5, Q6. Such a configuration allows the active regions of regular transistors extending along a line intersecting with the word lines and the bit lines at an angle other than 90 degree or 180 degree. 45 denotes an area for the unit cell of the first embodiment in FIG. 2. As shown in FIG. 4, one first pair of the vertical interconnects 32-1, 32VIC-1 connect the drains of Q5, Q6 to Q3, Q4. 32-1, 32VIC-1 do not have to be 100% aligned with 4 & 4' in consideration of alignment margins and other design needs.

Figure 6:
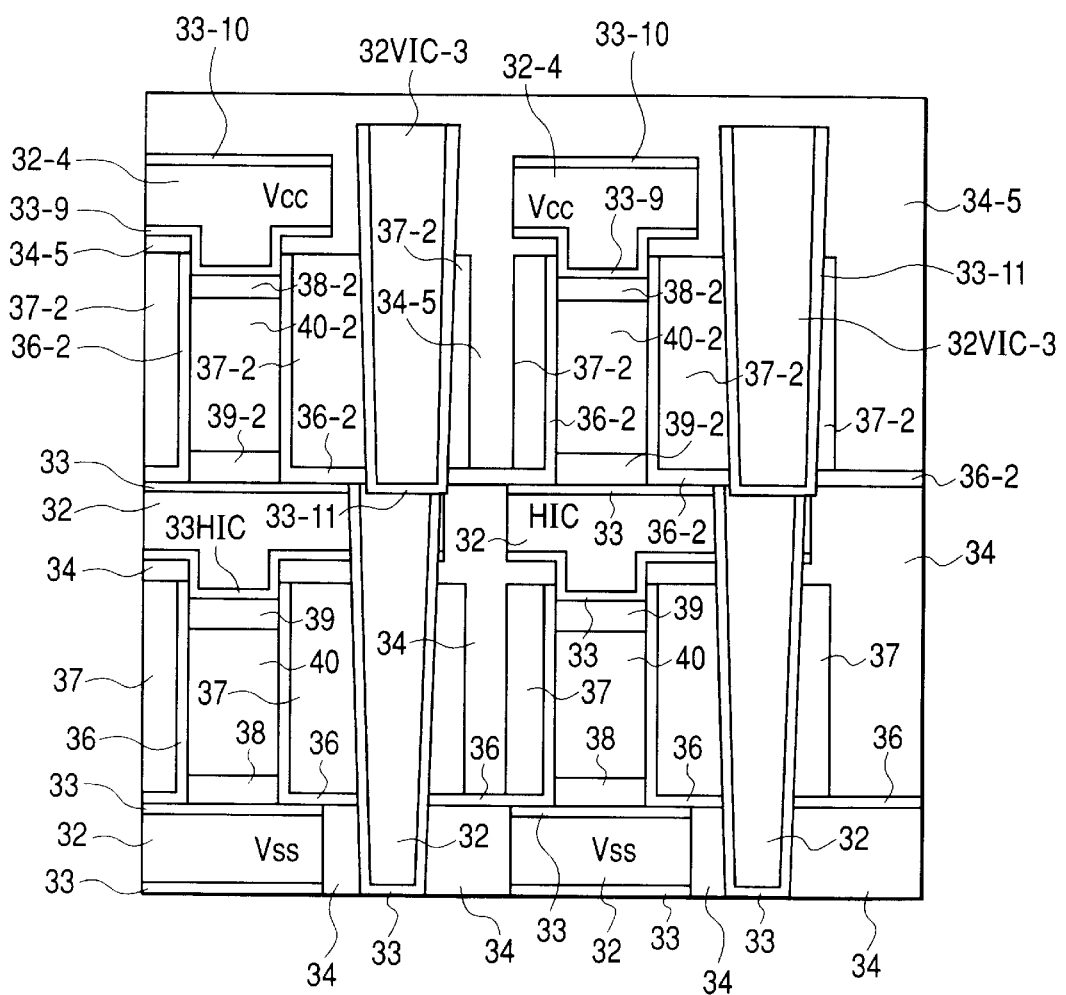
FIG. 6 depicts a cross sectional view of the second and third pairs of transistors (vertical) of the vertical SRAM cell in FIG. 4.
Figure 7A:
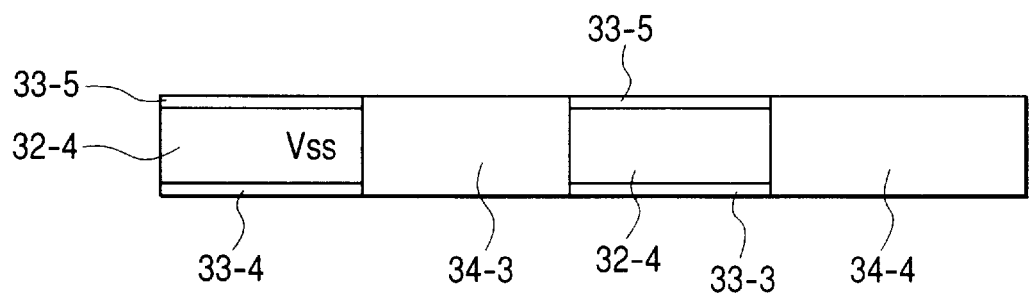
FIGS. 7A–D depict the sequential process of building the second pair of transistors (vertical) of the vertical SRAM cell in FIG. 4.

Next, the two vertical NMOS transistors Q3, Q4 shown as the bottom portion of FIG. 6 are built on the top of the horizontal transistors Q5, Q6 of FIG. 4 according to the steps depicted in FIGS. 7A–D. Referring now to FIG. 7A, a fourth barrier metal 33-4, a fourth tungsten layer 32-4, and a fifth barrier metal 33-5 are deposited in sequence by a CVD method. Then through anisotroic etching via photoresist masks into the above-mentioned layers, some valleys are formed. A third interlayer dielectric 34-3 is deposited on the whole surface, including the valleys, then etched back to a even level with the fifth barrier metal 33-5 to form a pair of voltage beams Vss alternating with the interlayer dielectric beams 34-3.

Figure 7B:
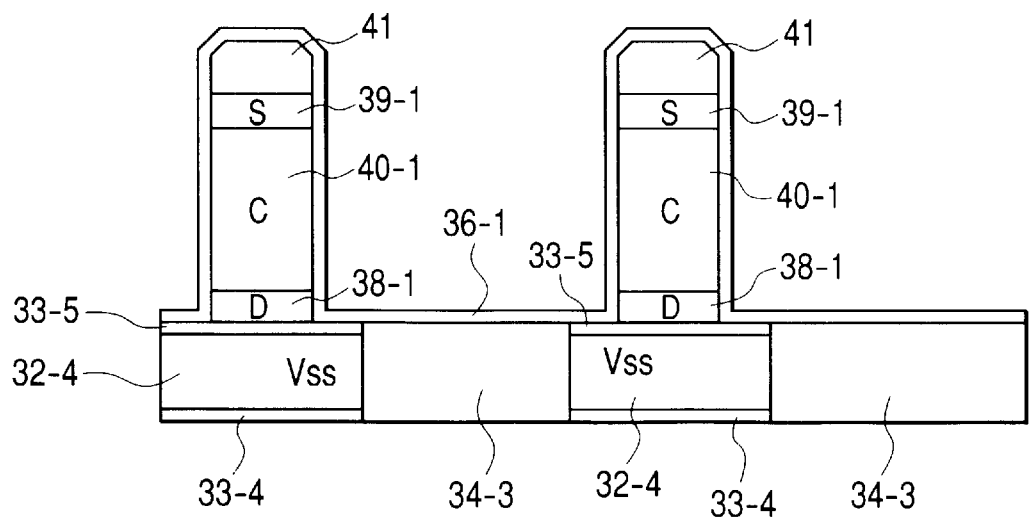

Referring next to FIG. 7B, the vertical Source-Channel-Drain columns (S-C-D) of the NMOS transistors Q3, Q4 are formed as follows. A first poly-silicon source layer 38-1 (doped with an n-type impurity, ex. P. As), a first poly-silicon channel layer 40-1 (doped with an p-type impurity, ex. B, BF$_2$), and a first poly-silicon drain layer 39-1 (doped with an n-type impurity, ex. P, As) are deposited in sequence by a CVD method. It is also possible to form the first poly-silicon source layer 38-1, the first poly-silicon channel layer 40-1, and the first poly-silicon drain layer 39-1 by ion-implanting. A first mask layer (completely removed later so it is not shown in the final structure of FIG. 7B) is deposited on the surface, then etched away via a first mask to form a pair of first mask caps 41. The first mask caps 41 then are used as a mask for etching into the three poly-silicon layers 38-1, 40-1, 39-1 into two S-C-D columns. A first gate silicon dioxide dielectric layer 36-1 is then deposited all over the surface, including the top and sides of the S-C-D columns.

Figure 7C:
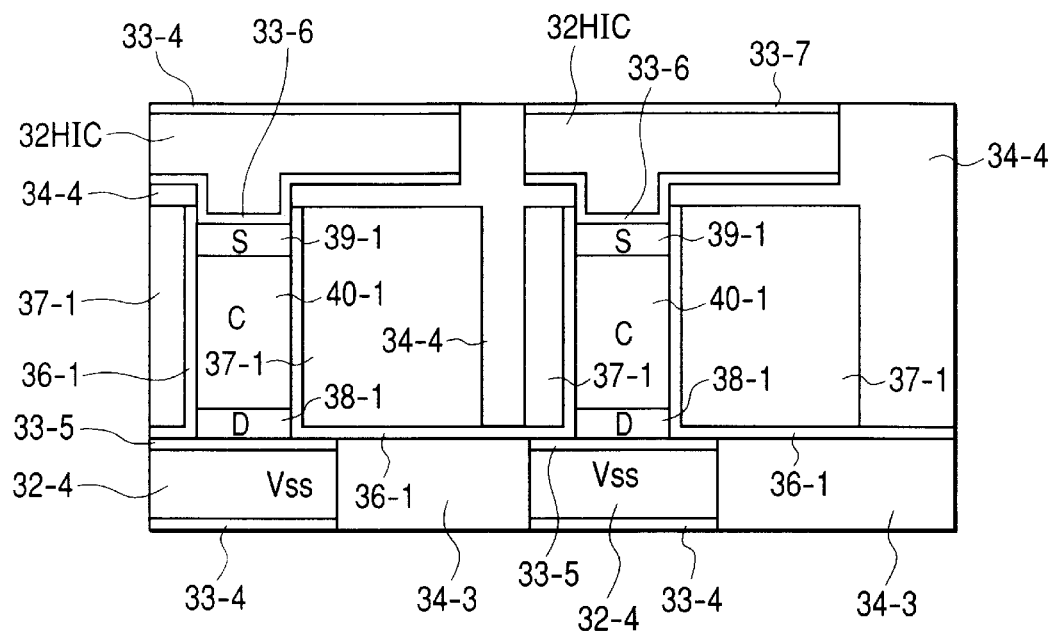

Referring to FIG. 7C, a gate electrode interlayer dielectric 34-4 is deposited on the whole surface then etched back to a even level right above the first mask caps 41. A second mask layer (completely removed later so it is not shown in the final structure of FIG. 7C) is deposited on the surface then etched via a second mask to form a pair of second mask caps (not shown). The second mask caps then are used as a mask for etching the gate electrode interlayer dielectric 34-4 into a pair of gate dielectric columns 34-4. Then a gate electrode poly-silicon 37-1 is deposited on the whole surface then etched back to a even level with the tops of the S-C-D columns. By this step, the gate silicon dioxide dielectric layer 36-1 on the tops of the S-C-D columns and the second mask caps are completely removed, while the first mask caps 41 remain.

The first mask caps 41 then are again used as a mask for etching back a thin layer from the gate electrode poly-silicon 37-1 and the gate dielectric columns 34-4. And the gate electrode interlayer dielectric 34-4 is again deposited on the whole surface then etched back to an even level right above the first mask caps 41. As such, the gate electrode poly-silicon 37-1 is surrounded by the gate dielectric 34-4 except at the surfaces facing the gate silicon dioxide dielectric 36-1. Then the first mask caps 41 are removed by etching onto the top of the S-C-D columns.

A sixth barrier metal 33-6 and a tungsten layer 32HIC (horizontal interconnect) are deposited in sequence by a CVD method. The tungsten layer 32HIC is etched back to an even surface, then the seven barrier metal 33-7 is deposited all over the surface. Then through anisotroic etching via a photoresist mask into the three layers 33-6, 32HIC, and 33-7 to form a horizontal interconnect between one S-C-D column. Then the gate electrode interlayer dielectric 34-4 is deposited for the third time on the whole surface then etched back to a even level right above the seventh barrier metal 33-7.

Figure 7D:
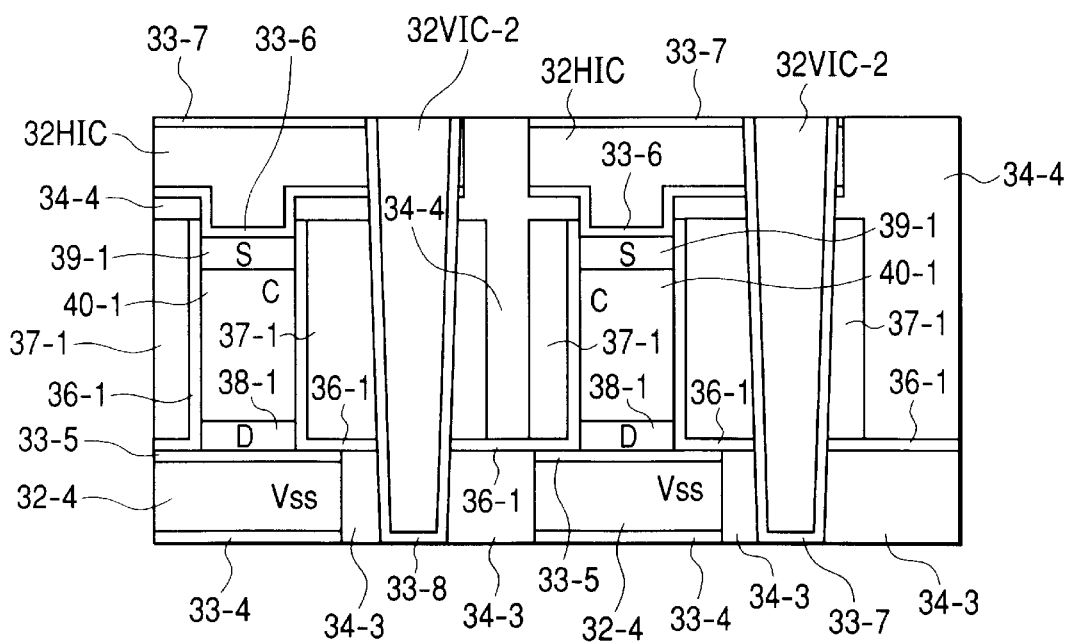

Referring to FIG. 7D, a third mask layer (completely removed later so it is not shown in the final structure of FIG. 7D) is deposited on the surface, then etched away via a third mask to form a pair of third mask caps (not shown). The third mask caps then are used as a mask for etching through all the layers in the FIG. 7C into two vertical interconnect holes. An eighth barrier metal 33-8, a tungsten layer 32VIC-2 (vertical interconnect) are then deposited all over the surface and filled insides the vertical interconnect holes. The third mask caps are then removed. As such, the two vertical NMOS transistors Q3, Q4 are completed.

Figure 8A:
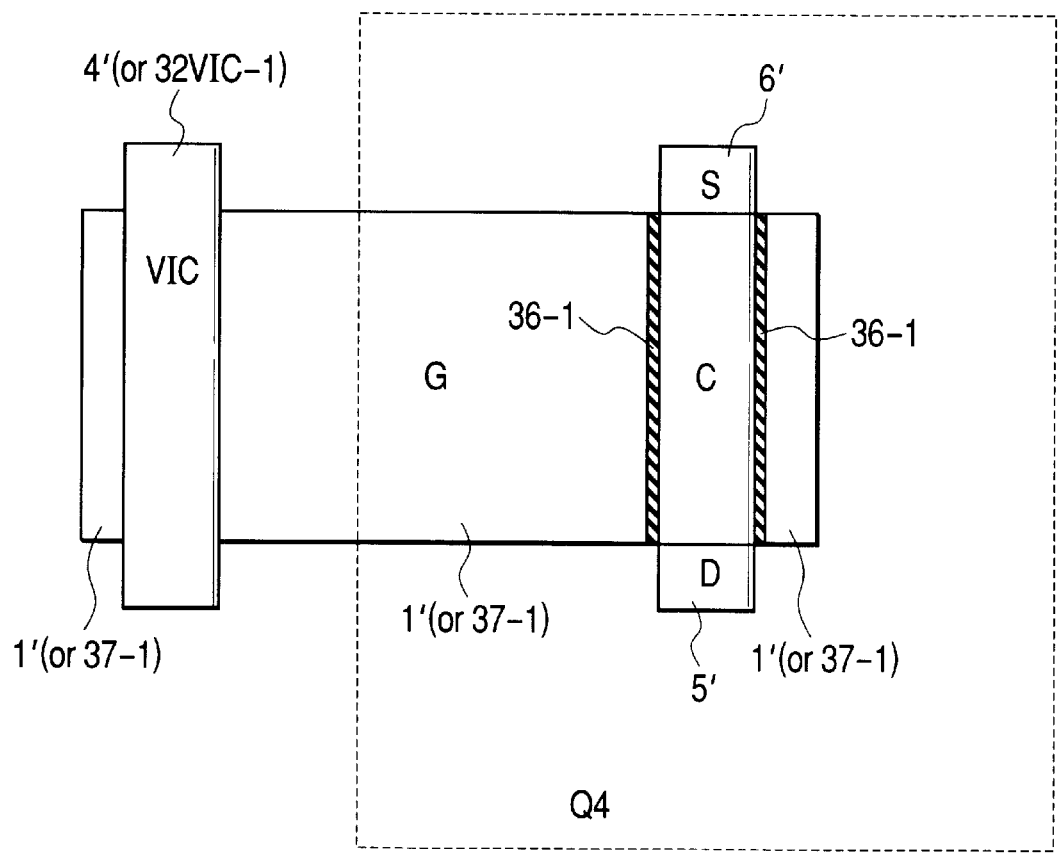
FIGS. 8A–D shows the 3D correlation between a vertical interconnect, a vertical transistor, and the gate electrode embedding the vertical interconnect and the vertical transistor made according to FIGS. 7A–D.
Figure 8B:
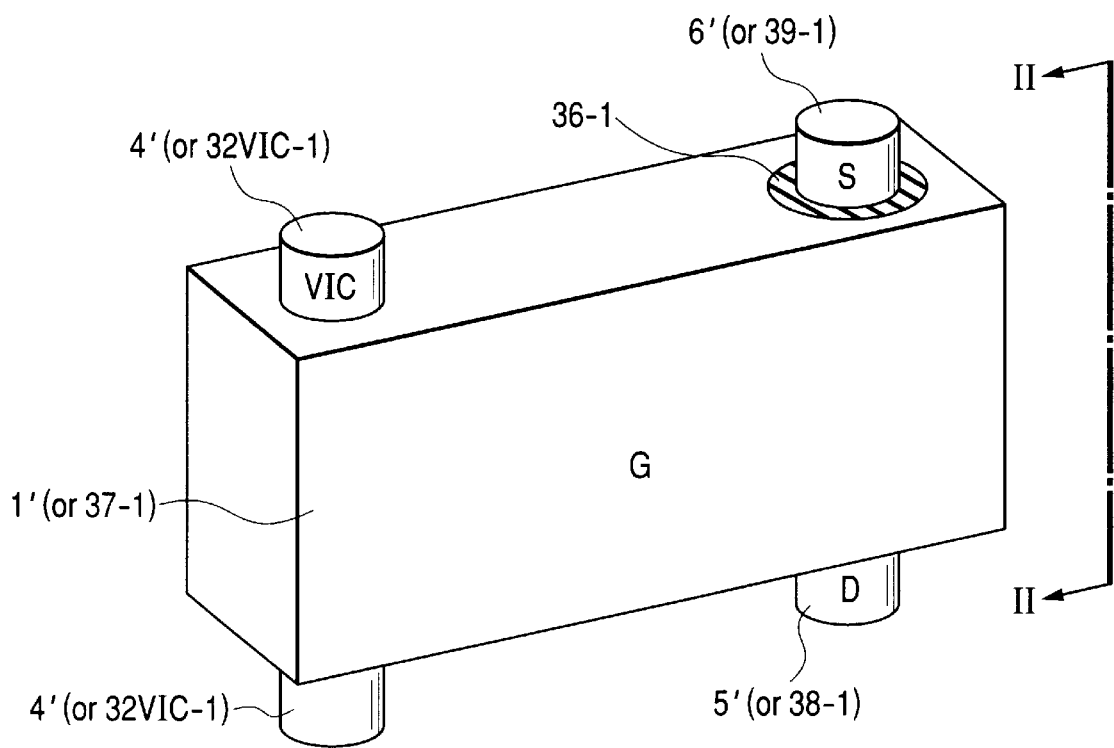
Figure 8C:
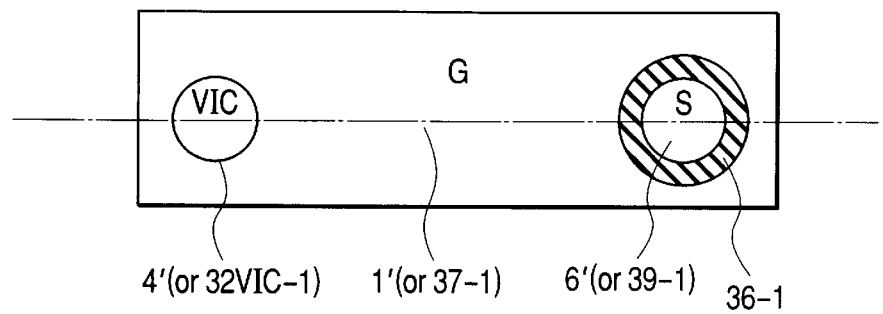
Figure 8D:
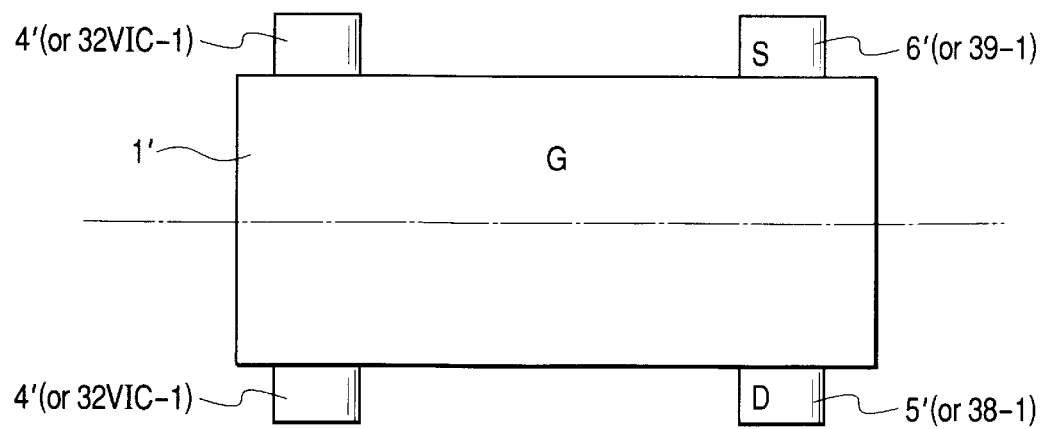

To look at the processing from a 3D perspective by taking FIG. 2 at a partial cross-section plane II—II, FIG. 8A shows an enlarged cross-sectional view of Q4 and the vertical interconnect 4' (or tungsten 32VIC-2). As mentioned, Q4 includes a source 6' (or poly-silicon 39-1), a gate electrode 1' (or poly-silicon 37-1), and a drain 5' (or poly-silicon 38-1). In particular, the silicon dioxide gate dielectric wall 36-1 is cylindrical. FIG. 8B shows a 3D perspective view of the structure in FIG. 8A, and FIG. 8C shows a top view of the structure in FIG. 8A. By looking at FIG. 2 from a partial cross-section plane III—III, FIG. 8D shows an enlarged side view of the gate electrode block 1' embedded with the S-C-D column of Q4 and a vertical interconnect column 4'.

Figure 9:
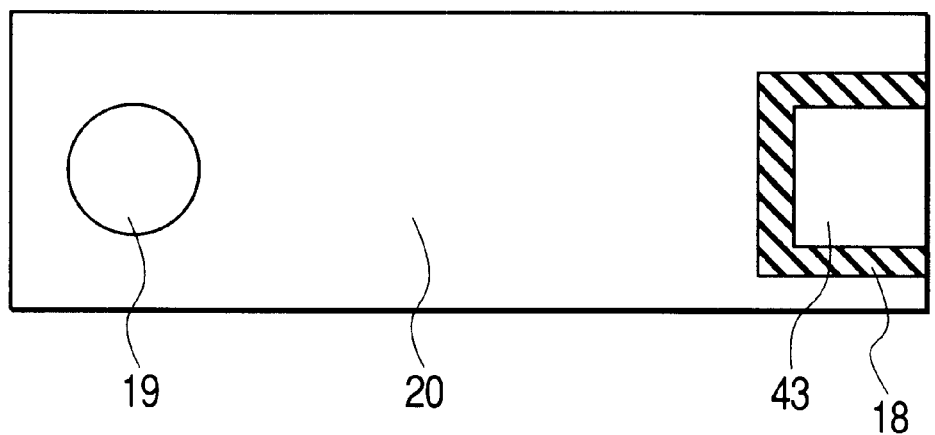
FIG. 9 shows a variation of the vertical transistor in FIGS. 8A–D by changing the shape of the S-C-D column and the silicon dioxide gate dielectric wall of the vertical transistor.

FIG. 9 shows a variation of the vertical transistor in FIGS. 8A–D by changing the shape of the S-C-D column and the silicon dioxide gate dielectric wall 36-1 from cylindrical to square. In addition, the silicon dioxide gate dielectric wall 36-1 is no longer wrapping all sides of the S-C-D column, but only three sides. In another variation, the gate electrode block in FIGS. 8A–D is condensed in to a cylindrical wall wrapping over the silicon dioxide gate dielectric wall 36-1 and surrounded by one insulation material.

Finally, the two vertical PMOS transistors Q1, Q2 (sources and drains doped with an n-type impurity, ex. P, As and a channel doped with an p-type impurity, ex. B, $BF_2$) are deposited in sequence by a CVD method shown in the top portion of FIG. 6 are built on the top of the vertical NMOS transistors Q3, Q4 of FIG. 7 with steps similar to those described above, except substituting the tungsten layer 32HIC (horizontal interconnect) with a pair of tungsten beams 32-4 (Vcc).

Figure 10:
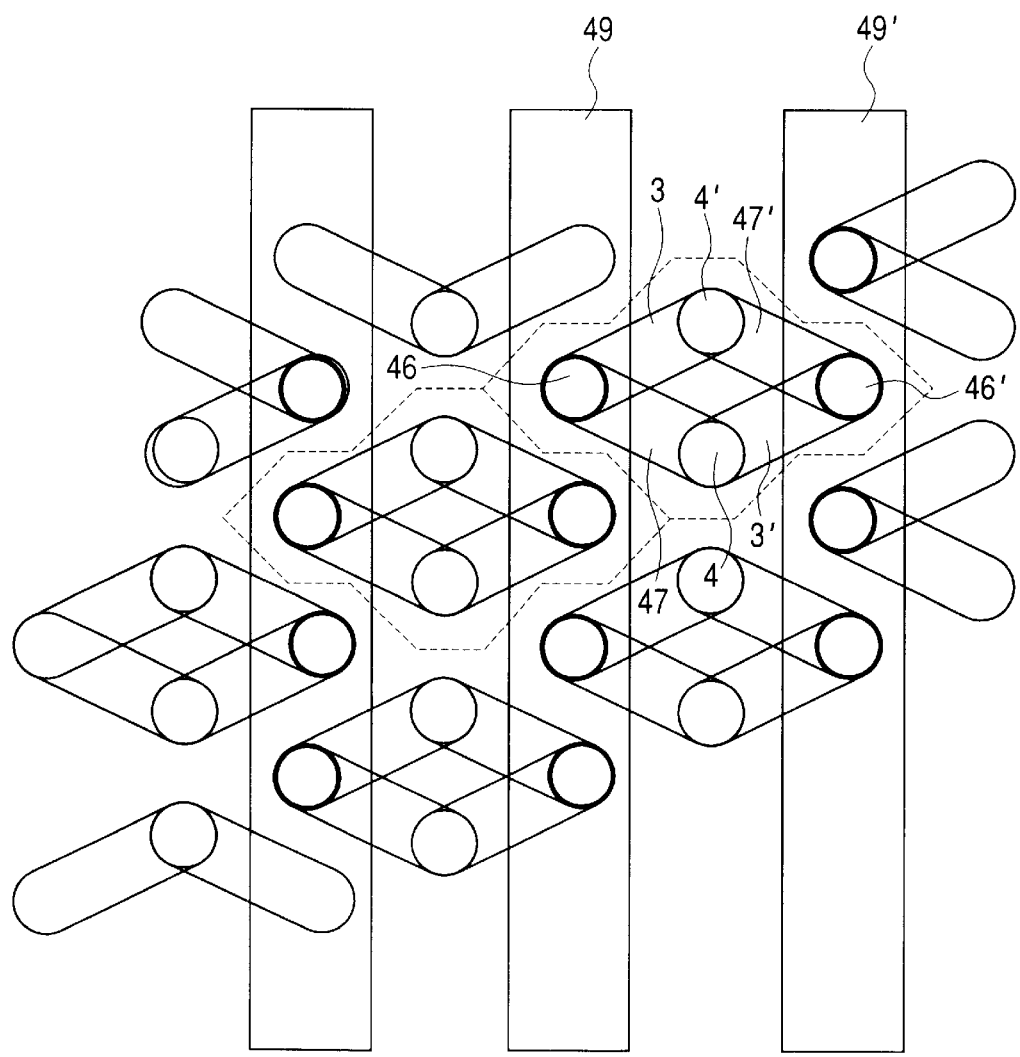
FIG. 10 schematically shows a top view of the vertical transistors in the layout of a plurality of SRAM cells of the first embodiment of FIG. 2.

By looking down from a plane I'—I' in FIG. 3, FIG. 10 schematically shows the top view of the vertical transistors in the layout of a plurality of SRAM cells of the first embodiment of FIG. 2. In particular, the shape of a unit cell of the vertical transistors (parallelogram) in FIG. 10 is different from the shape of the unit cell of the horizontal transistors in FIG. 11. 46 & 46' denote the positions of a pair of vertical transistors Q1, Q2 stacking on the top of another pair of vertical transistors Q3, Q4. 47 & 47' denote the positions of the pair of gate electrodes 2, 2' stacking on the top of another pair of gate electrodes 1 & 1'. Any such stacking does not have to be precise due to alignment margins or any other design consideration. 49 & 49' denote the positions of the pair of Vcc beams stacking on the top of the pair of Vss beams, which are shared by a plurality of SRAM cells. By arranging one unit cell head to head with another unit cell, the two unit cells share Vss and Vcc. 3 & 3' denote the pair of horizontal interconnects. 4 and 4' denote the pair of vertical interconnects built at one step or two separate steps as described above. In particular, the 4 and 4' in FIG. 10 overlap (stack directly on top of) the 4 and 4' in FIG. 11.

There are many conceivable variations of the just described manufacturing method. For example, masks and layers made of SiO2 can be produced by means of a deposition process or by means of thermal oxidation. Polysilicon can be doped not only during but also after the deposition.

Figure 13:
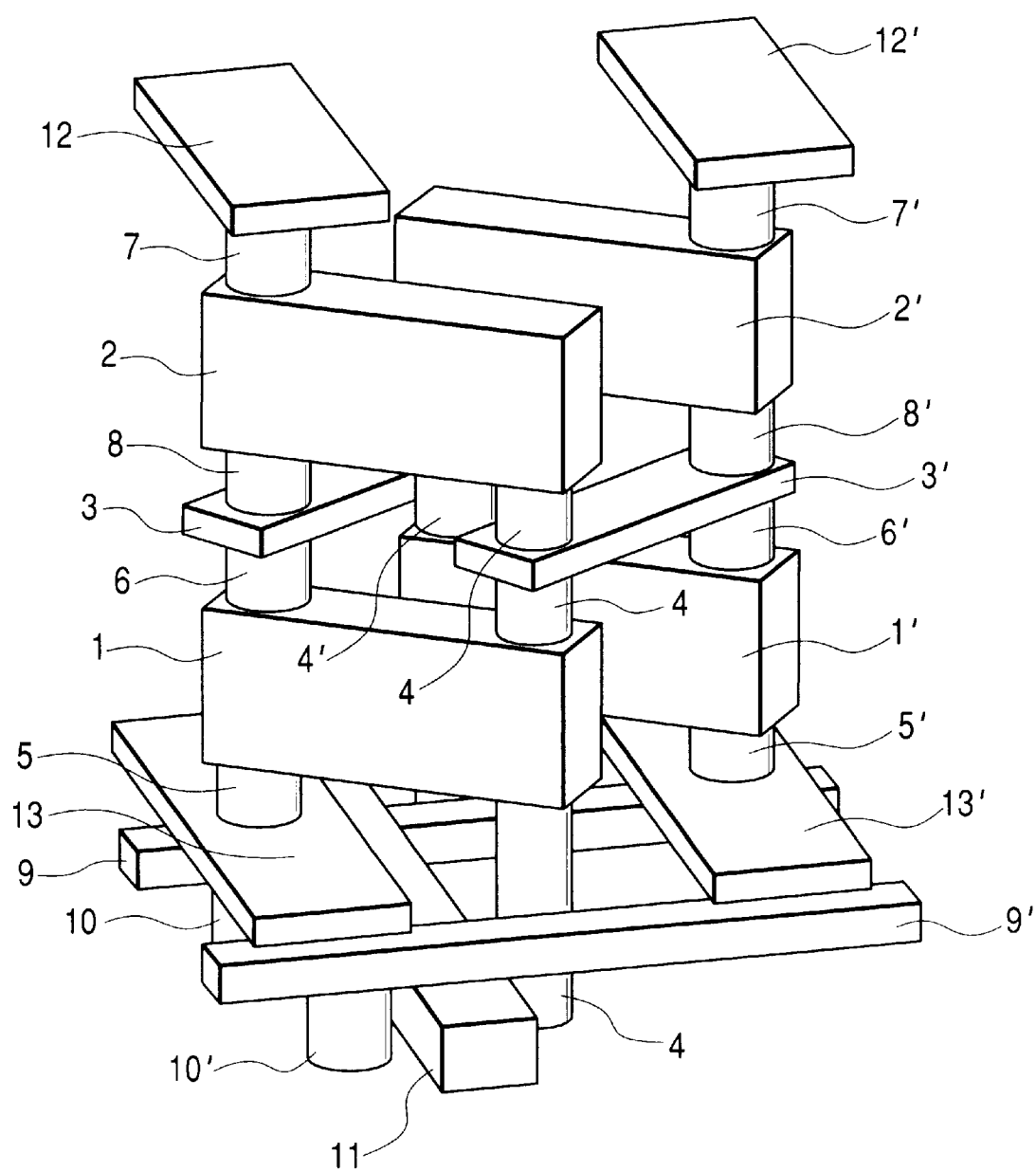
FIG. 13 shows the modified embodiment 1-1 modified from the first embodiment in FIG. 2.
Figure 14:
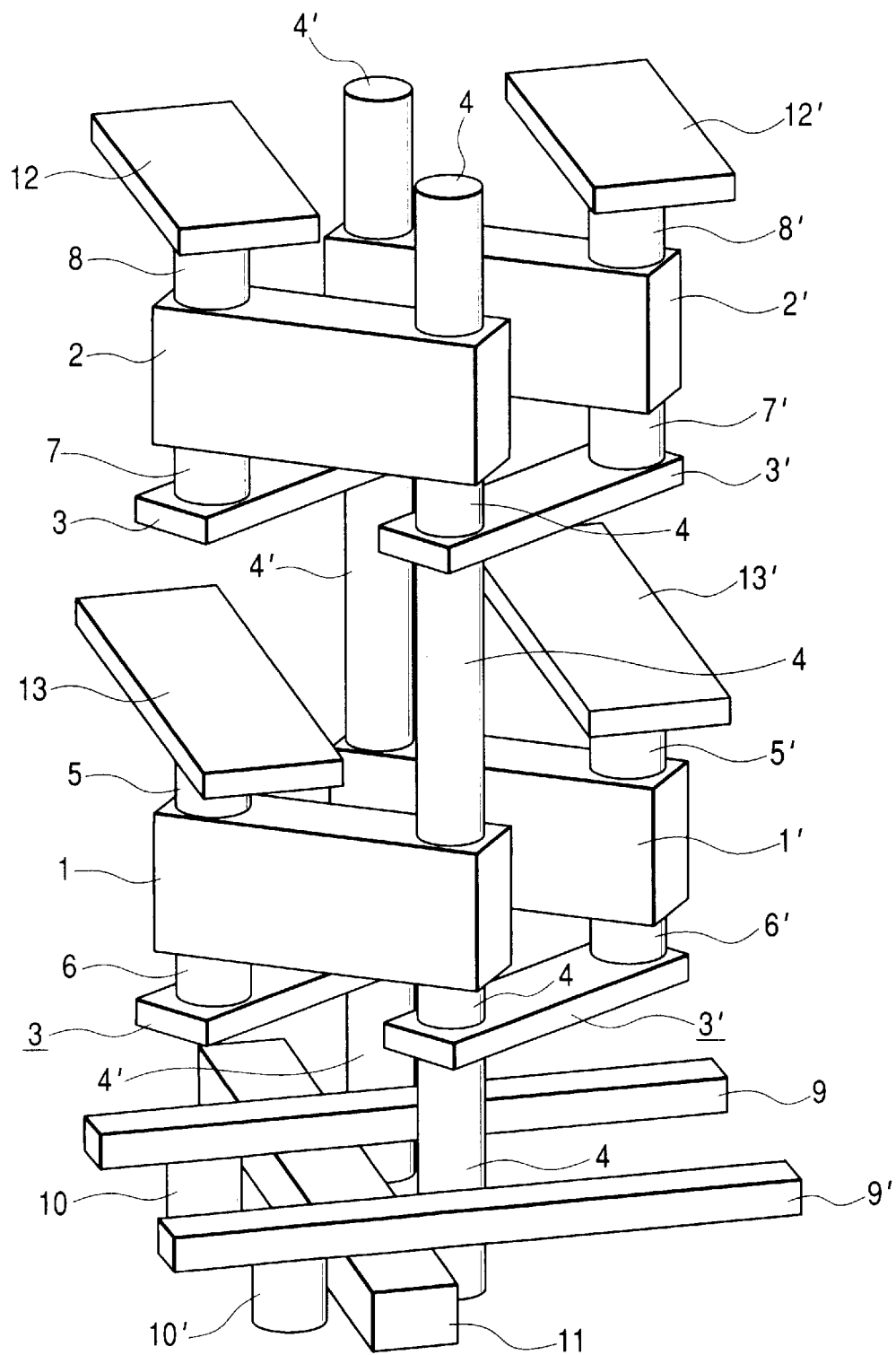
FIG. 14 shows the modified embodiment 1-2 modified from the first embodiment in FIG. 2.

In addition, the first embodiment can be easily modified by shifting around the levels, the building blocks, or their portions. For example, the whole level of Q1, Q2, and Vcc may be switched with the level of Q3, Q4, and Vss. As shown in FIG. 13, a modified embodiment 1-1 chops off the top portion of the vertical interconnects 4, 4' in FIG. 2 from the gate electrodes 2, 2' so as to reduce the manufacturing difficulty associated with long plugs. According to FIG. 14, another modified embodiment 1-2 has a separate pair of horizontal interconnects 3, 3' for Q3, Q4 (rather than shared between Q1, Q3 and Q2, Q4) so as to reduce any undesired interference between Q1 and Q3 as well as Q2 and Q4. In addition, Vss beams are moved up between Q1 and Q3 as well as Q2 and Q4 respectively. Therefore, the channel direction (S—>D) of Q3, Q4 is reversed to be consistent with the channel direction of Q1, Q2. Alternatively, the top portion of the vertical interconnects 4, 4' in FIG. 14 can also be chopped off from the gate electrodes 2, 2' so as to reduce the manufacturing difficulty associated with long plugs.

Alternatively, as discussed later in the seventh embodiment, the load transistors Q5, Q6 may be eliminated from the first embodiment. Because the effective area occupied by the SRAM cell is reduced in all the modifications, the area of the semiconductor substrate 21 can also be reduced thereby increasing the number of cells manufactured in one wafer.

Figure 12:
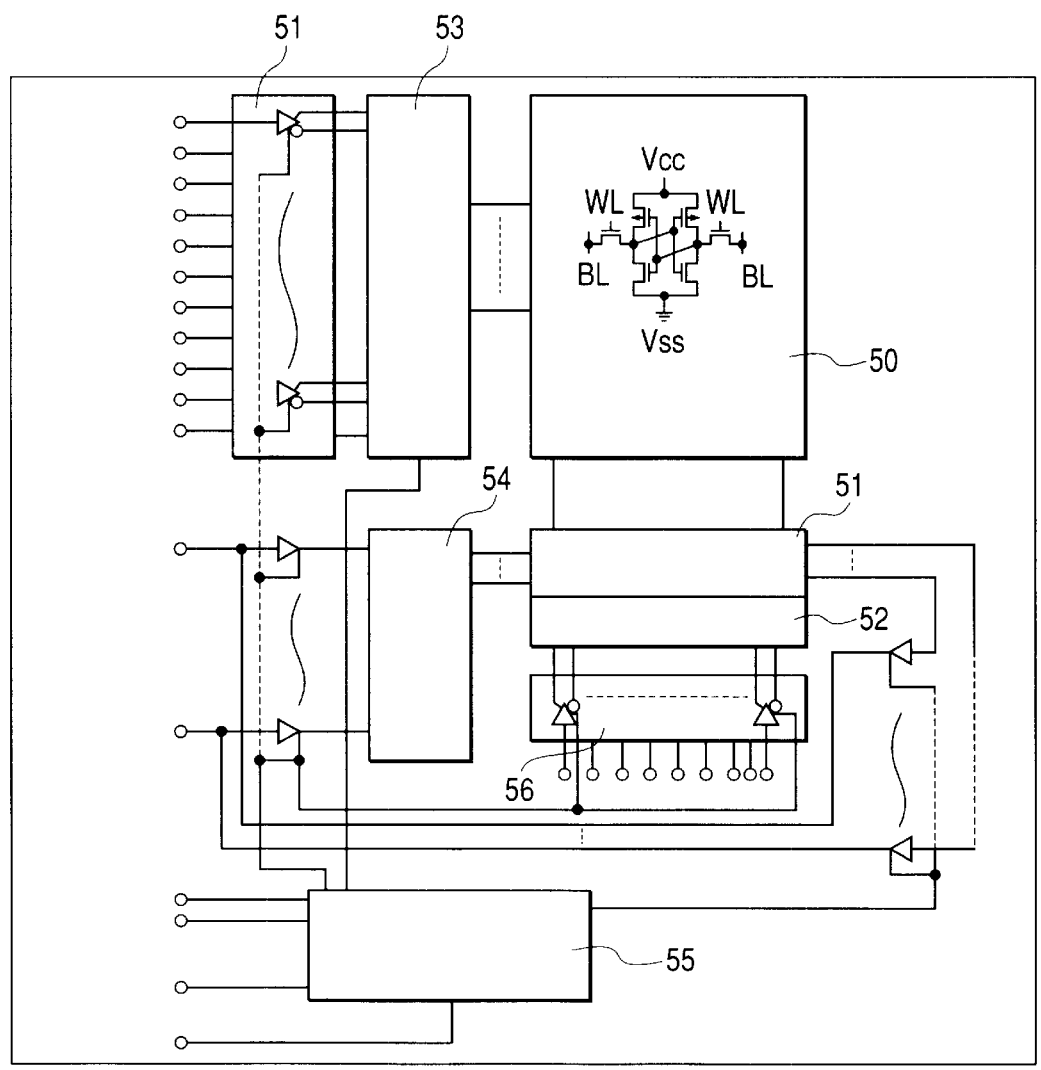
FIG. 12 schematically shows a circuit employing a SRAM composed of the unit SRAM cells of the first embodiment or its modifications of the invention.

FIG. 12 schematically shows a circuit employing a SRAM matrix 50 including a plurality of the unit SRAM cells of the first embodiment or its modifications according to the invention. The circuit includes a column I/O 51, a column decoder 52, a row decoder 53, an input data control 54, a control logic 55, a column address buffer 56, and a row address buffer 57. The vertical transistors can be applied not only in the SRAM matrix 50, but also in all other peripheral devices, such as the column decoder 52, to reduce the required surface area on the wafer so as to reduce the size of the device and the whole circuit.

Second Embodiment

Figure 15:
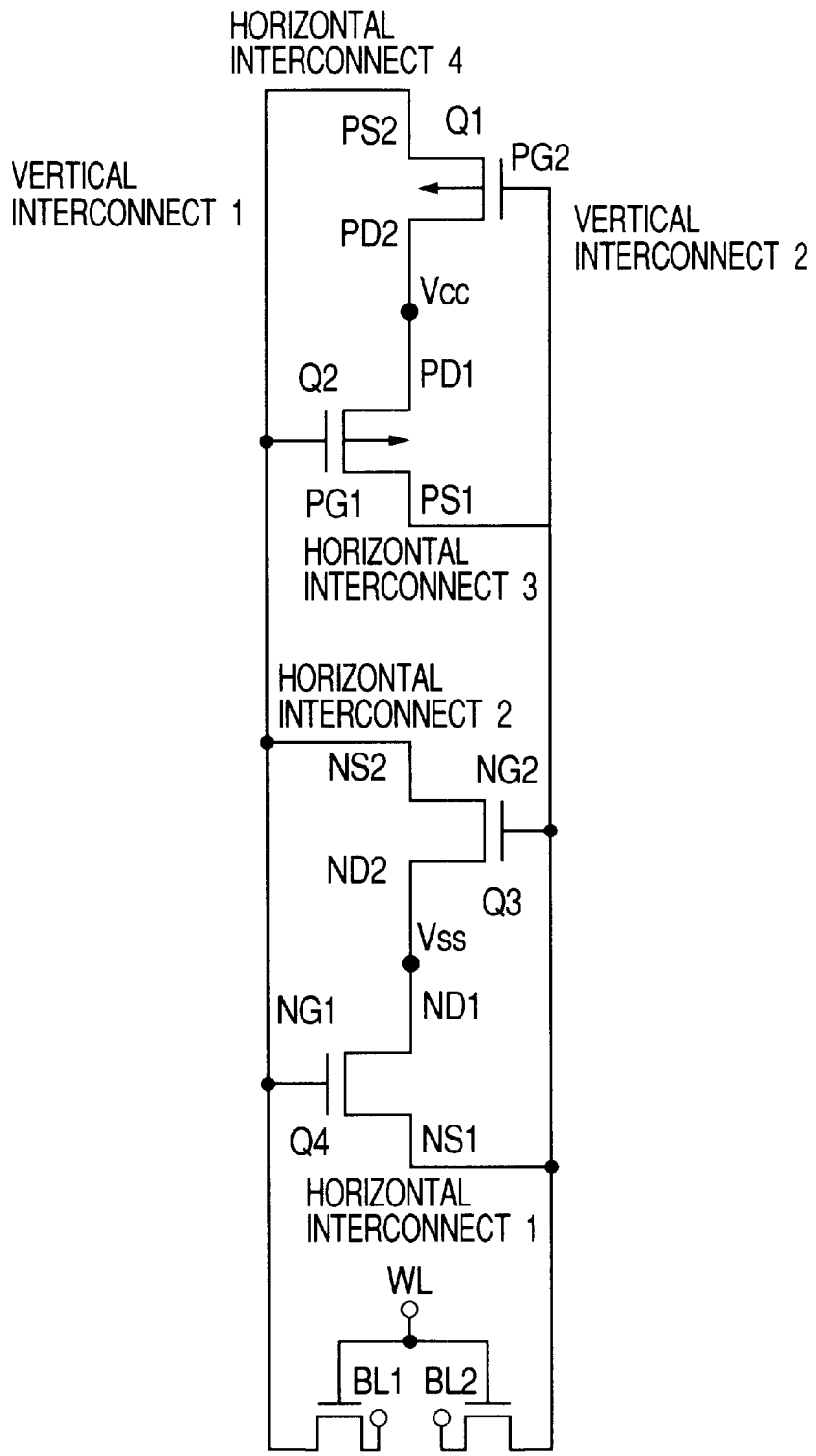
FIG. 15 is a circuit diagram of the second embodiment of the vertical SRAM cell according to the invention.
Figure 16:
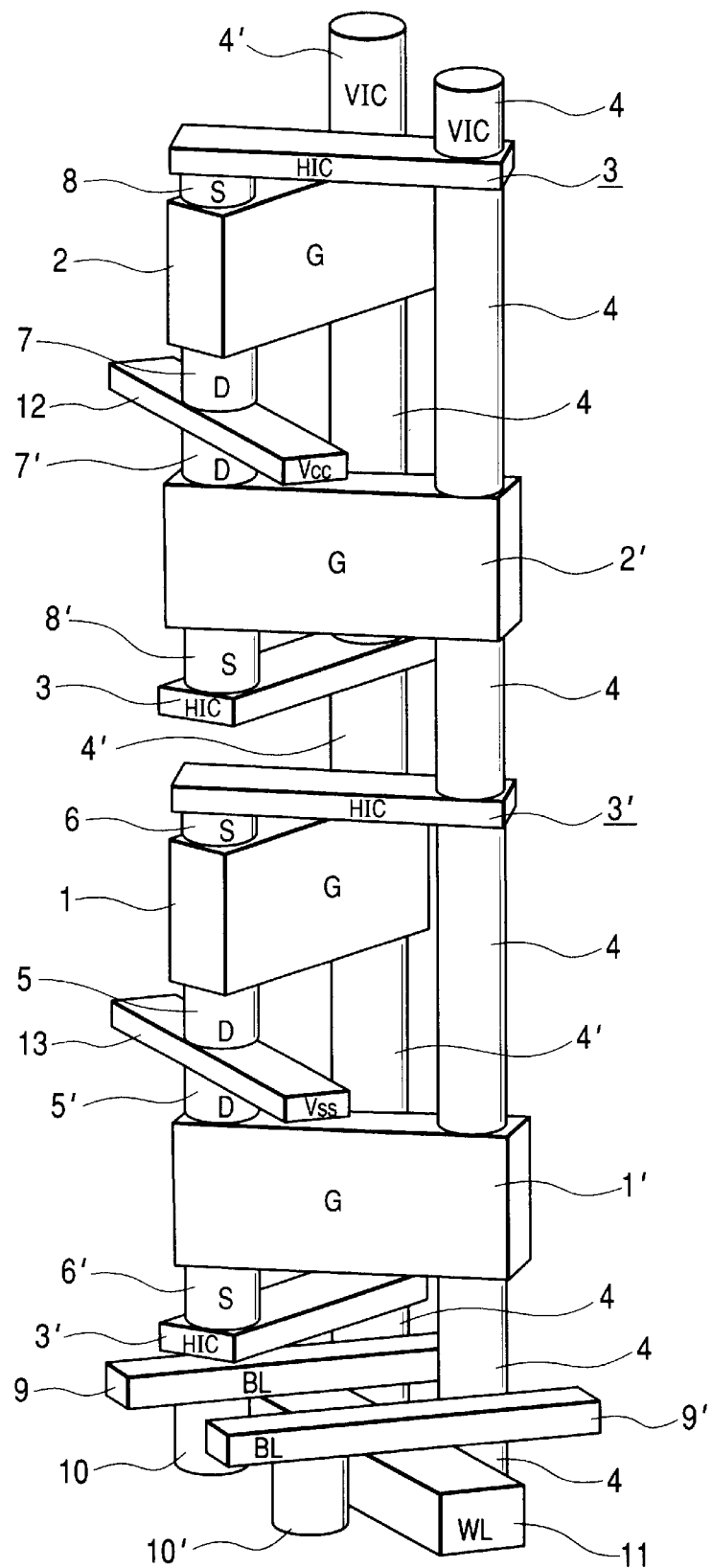
FIG. 16 is a 3D perspective view of the structure of the second embodiment of the vertical SRAM cell according to the invention in FIG. 15.

Referring to the circuit diagram in FIG. 15, a 6T vertical SRAM according to a second embodiment of the invention includes two load PMOS transistors Q1 and Q2 and two drive NMOS transistors Q3 and Q4 located in four different levels above two transfer NMOS transistors Q5 and Q6 made in the substrate. The levels of the load MOSs and the drive MOSs can be switched as long as the transfer MOSs stay at the bottom (in the substrate). As shown in the 3D diagram of the second embodiment (FIG. 16), Q1 includes a source 8, a gate electrode 2, and a drain 7. Q2 includes a source 8', a gate electrode 2', and a drain 7'. Q3 includes a source 6, a gate electrode 1, and a drain 5. Q4 includes a source 6', a gate electrode 1', and a drain 5'. Q5, Q6 (not shown) are constructed underneath the structure shown in FIG. 16. A pair of bit lines 9, 9', a pair of bit line contacts 10, 10', and a word line 11 are built above the horizontal transistors. Each of the transfer transistors Q5 and Q6 includes an active region.

Above the transistors Q1 and Q3 are two horizontal interconnect beams 3 & 3' geneally parallel with the gate electrodes 2' of Q2, 1' of Q4, which connect Q1, Q3 to the vertical interconnect column 4 respectively. Below the transistors Q2 and Q4 are two horizontal interconnect beams 3 & 3'geneally parallel with the gate electrodes 2 of Q1, 1 of Q3, which connect Q2, Q4 to the vertical interconnect column 4' respectively. Q1, Q2 are connected to one Vcc beams 12, and Q3, Q4 are connected to one Vss beam 13, respectively. Thus, high integration and low-drive-voltage operation become possible. The required area on the substrate has reduced to about ¾ of that in the first embodiment, and the number of Vcc, Vss beams is reduced to a half than the first embodiment due to this sharing feature. However, the number of horizontal interconnects and the length of the vertical interconnects are doubled.

Figure 17:
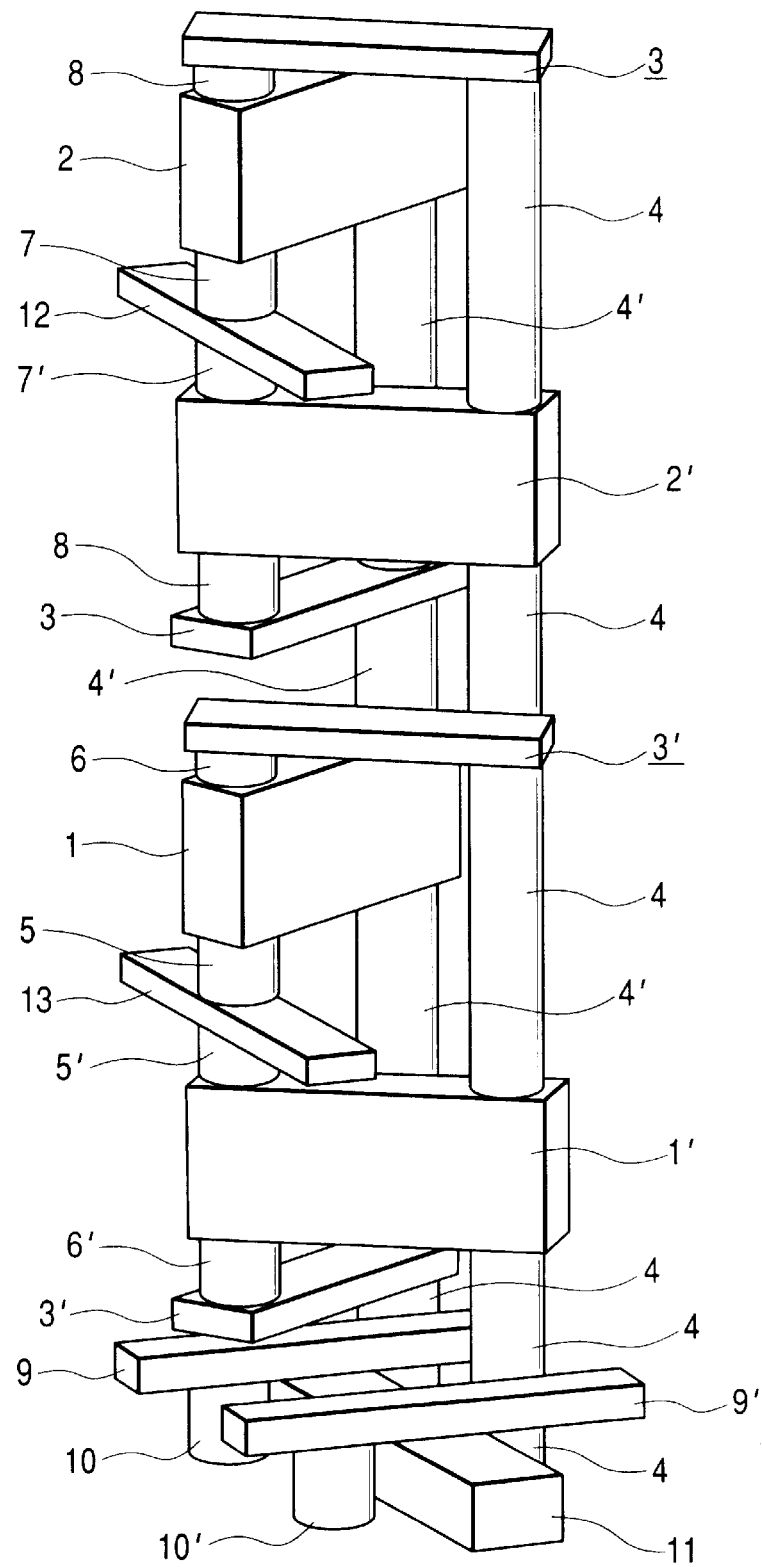
FIG. 17 shows the modified embodiment 2-1 modified from the second embodiment in FIG. 16.

The second embodiment can also be easily modified by shifting around the levels, the building blocks or their portions. As shown in FIG. 17, a modified embodiment 2-1 chops off the top portion of the vertical interconnects 4, 4' in FIG. 16 from the gate electrode 2 so as to reduce the manufacturing difficulty associated with long plugs. Alternatively, as discussed later in the seventh embodiment, the load transistors may be eliminated from the second embodiment.

Figure 18:
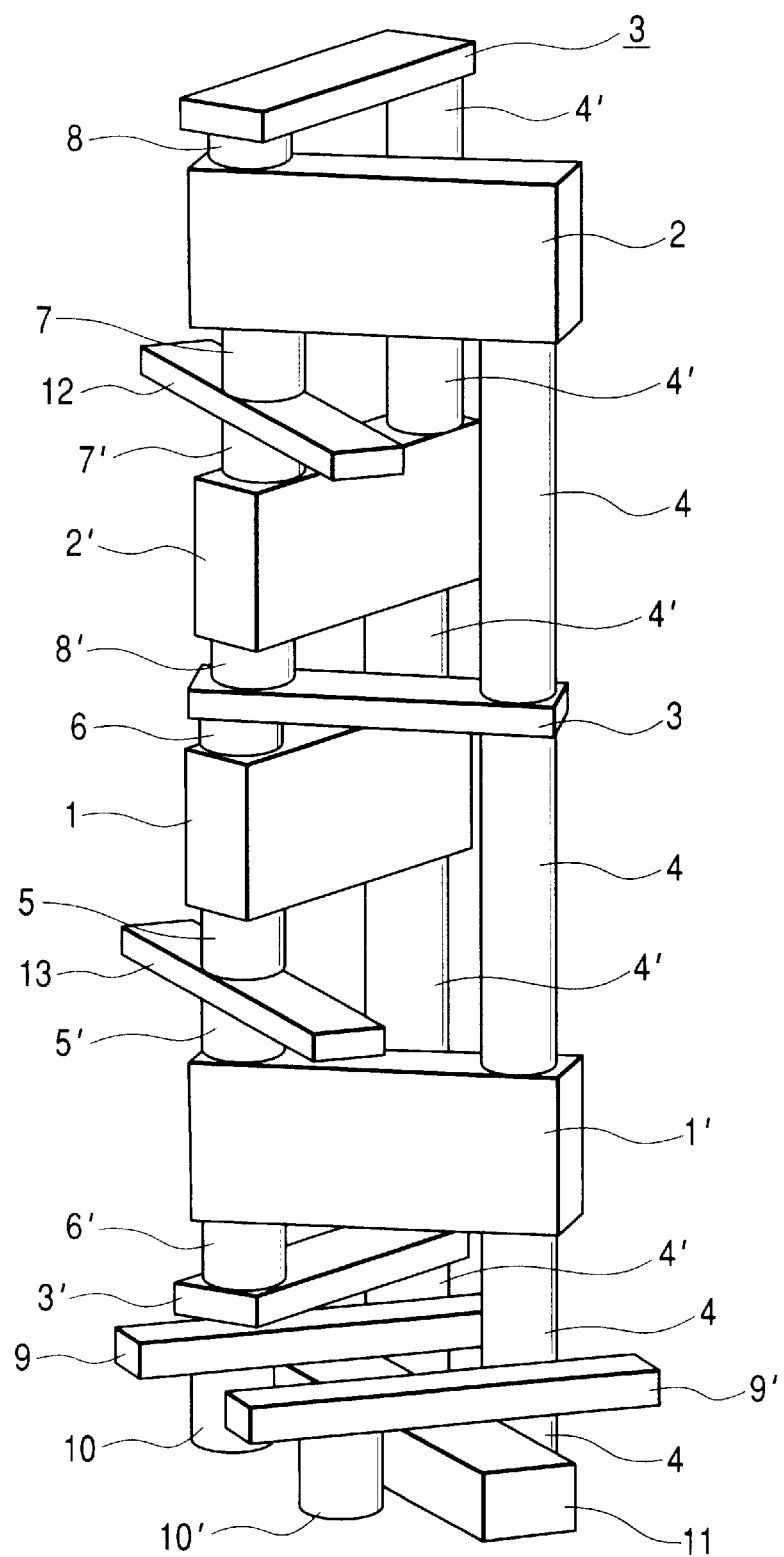
FIG. 18 shows the modified embodiment 2-2 modified from the second embodiment in FIG. 16.
Figure 19:
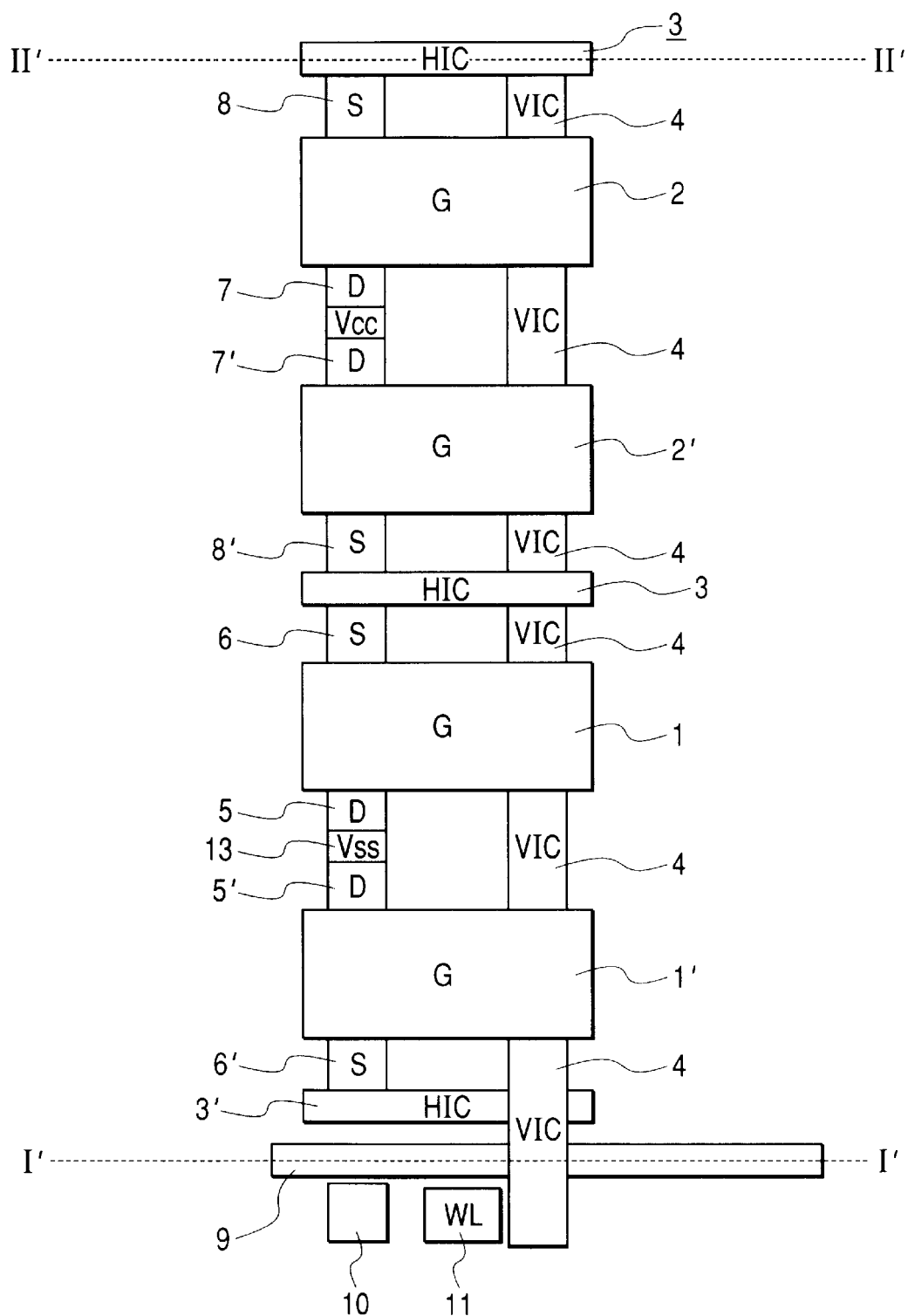
FIG. 19 shows a side view of the 3D structure in FIG. 20 from the plane of the front end of the word line 11 (WL).

Referring to FIG. 18, a modified embodiment 2-2 has a shared horizontal interconnect between Q2 and Q3. Accordingly, the total number of horizontal interconnects per cell is reduced from four in FIG. 19 to three. As a result, the orientations of the gate electrode blocks of Q1, Q2 are swapped such that the horizontal interconnects 3 and 3' in FIG. 17 are aligned in FIG. 20 so as to be combined into one horizontal interconnect 3. FIG. 19 shows the side view of the 3D structure in FIG. 18 from the plane of the front end of the word line 11 (WL).

Figure 20:
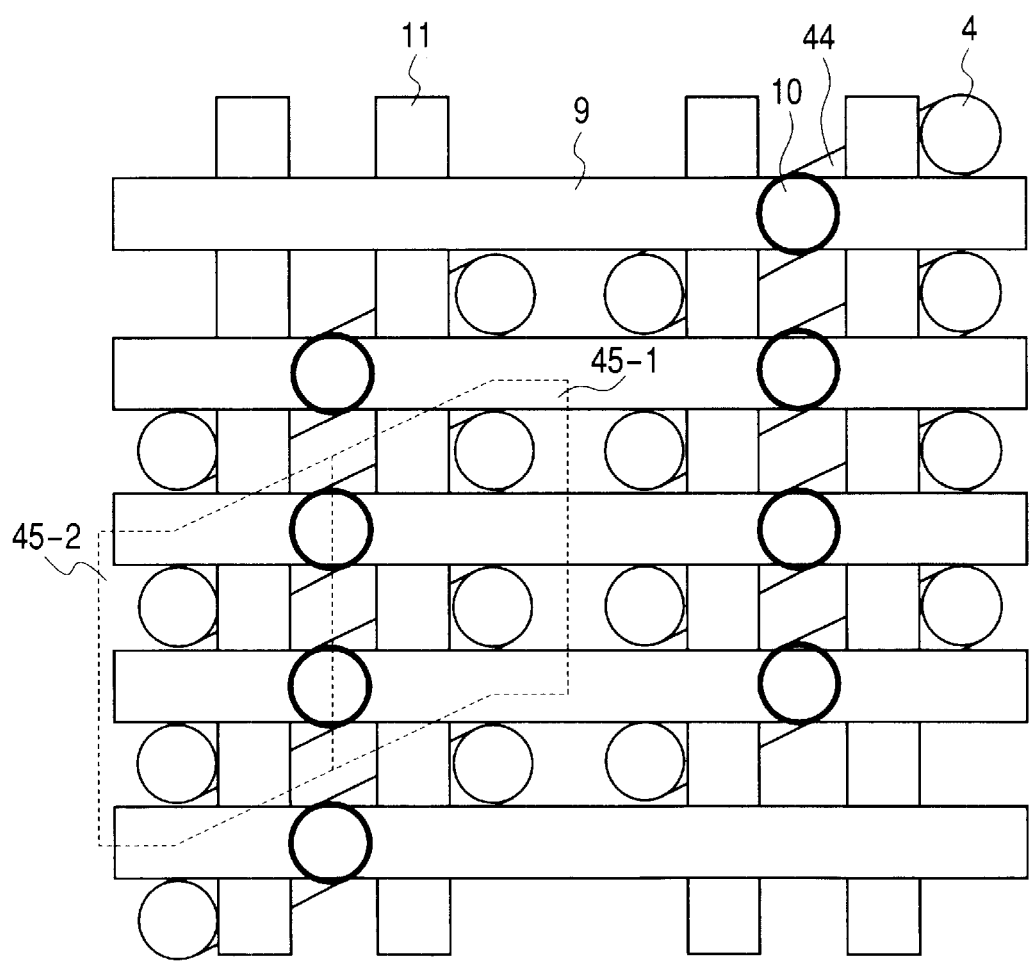
FIG. 20 schematically shows a top view of the horizontal transistors in the layout of a plurality of SRAM cells of the second embodiment of FIG. 16.

By looking down from a plane I'—I' in FIG. 19, FIG. 20 schematically shows the top view of the horizontal transistors in the layout of a plurality of SRAM cells of the second embodiment of FIG. 18. In particular, 44 denotes an active region of one of the horizontal transistors Q5, Q6. The bit line contact 10 connects on of the drains of Q5, Q6 to one BL beam. By arranging the unit cell 45-1 back to back with the unit cell 45-2, the two unit cells share bit line contacts. On the other hand, each of the SRAM cell 45-1 and the SRAM cell 45-2 in the first embodiment connects to respective bit line contacts (FIG. 11). As such, the number of bit line contacts in the second embodiment is reduced to half of the number of the first embodiment.

Figure 21:
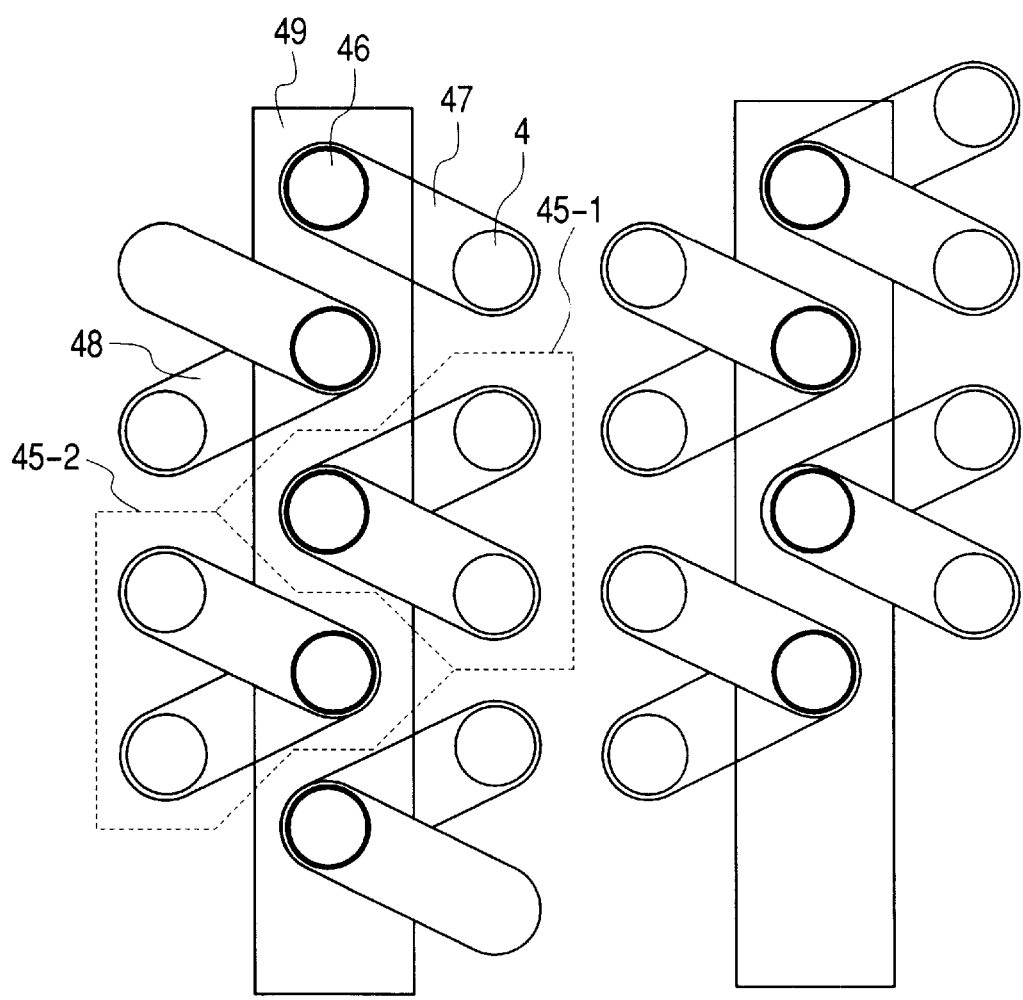
FIG. 21 schematically shows a top view of the first vertical transistor Q1 in the layout of a plurality of SRAM cells of the second embodiment of FIG. 16.

By looking down from a plane II'—II' in FIG. 19, FIG. 21 schematically shows the top view of the first vertical transistor Q1 in the layout of a plurality of SRAM cells of the second embodiment of FIG. 18. In particular, the shape of a unit cell of the horizontal transistors (parallelogram) in FIG. 20 is different from the shape of the unit cell of the vertical transistors in FIG. 21. 46 denotes the vertical transistor Q1 (stacking on the top of other three vertical transistors Q2, Q3, Q4). 47 denotes the gate electrode 2 right above another gate electrode 1', and 48 denotes the horizontal interconnect 3 which is right above another horizontal interconnect 3' with two gate electrodes 2', 1 located therebetween. 49 denotes the single Vcc beam right on the top of the single Vss beam, which are shared by a plurality of SRAM cells. Any such stacking or topping is not precise due to alignment margins or any other design consideration. As in the first embodiment in FIG. 10, by arranging the unit cell 45-1 head to head with the unit cell 45-2 in 22, the two unit cells share Vss and Vcc.

Figure 22:
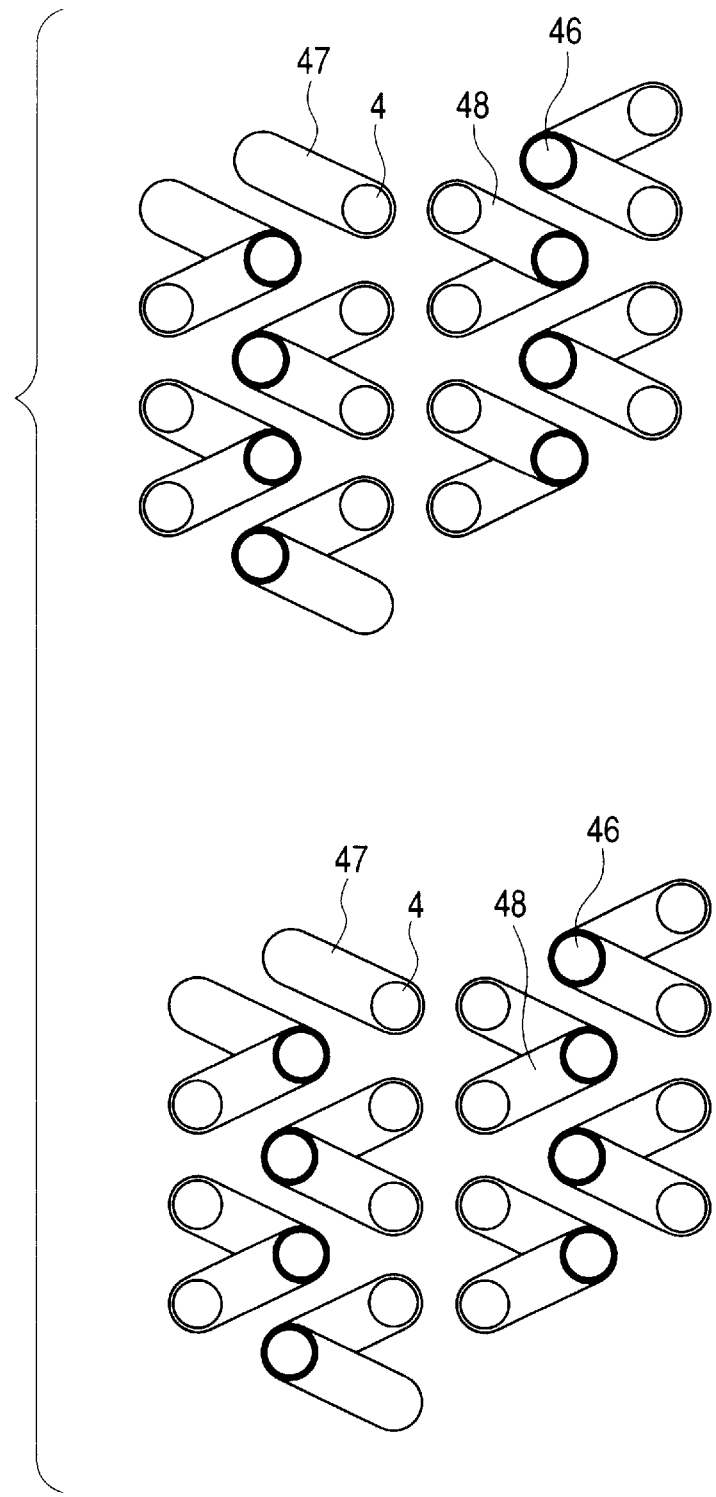
FIG. 22 schematically shows a top view of the first vertical transistor Q1 in the layout of a plurality of SRAM cells of the second modified embodiment of FIG. 20.

Similar to FIG. 21, FIG. 22 schematically shows the top view of the first vertical transistor Q1 in the layout of a plurality of SRAM cells of the second modified embodiment of FIG. 18. 47 and 48 also denote the gate electrode 2 and the horizontal interconnect 3, but the gate electrode 2 is placed under the horizontal interconnect 3 in FIG. 22, rather than above the horizontal interconnect 3 in FIG. 21.

Because the effective area occupied by the SRAM is reduced in all the modifications, the required area of the semiconductor substrate can also be reduced, allowing the number of cells manufactured in one wafer to be increased. The process flow of the second embodiment is similar to the one of the first embodiment and easily to be figured out by one skilled in the art.

Third Embodiment

Figure 23:
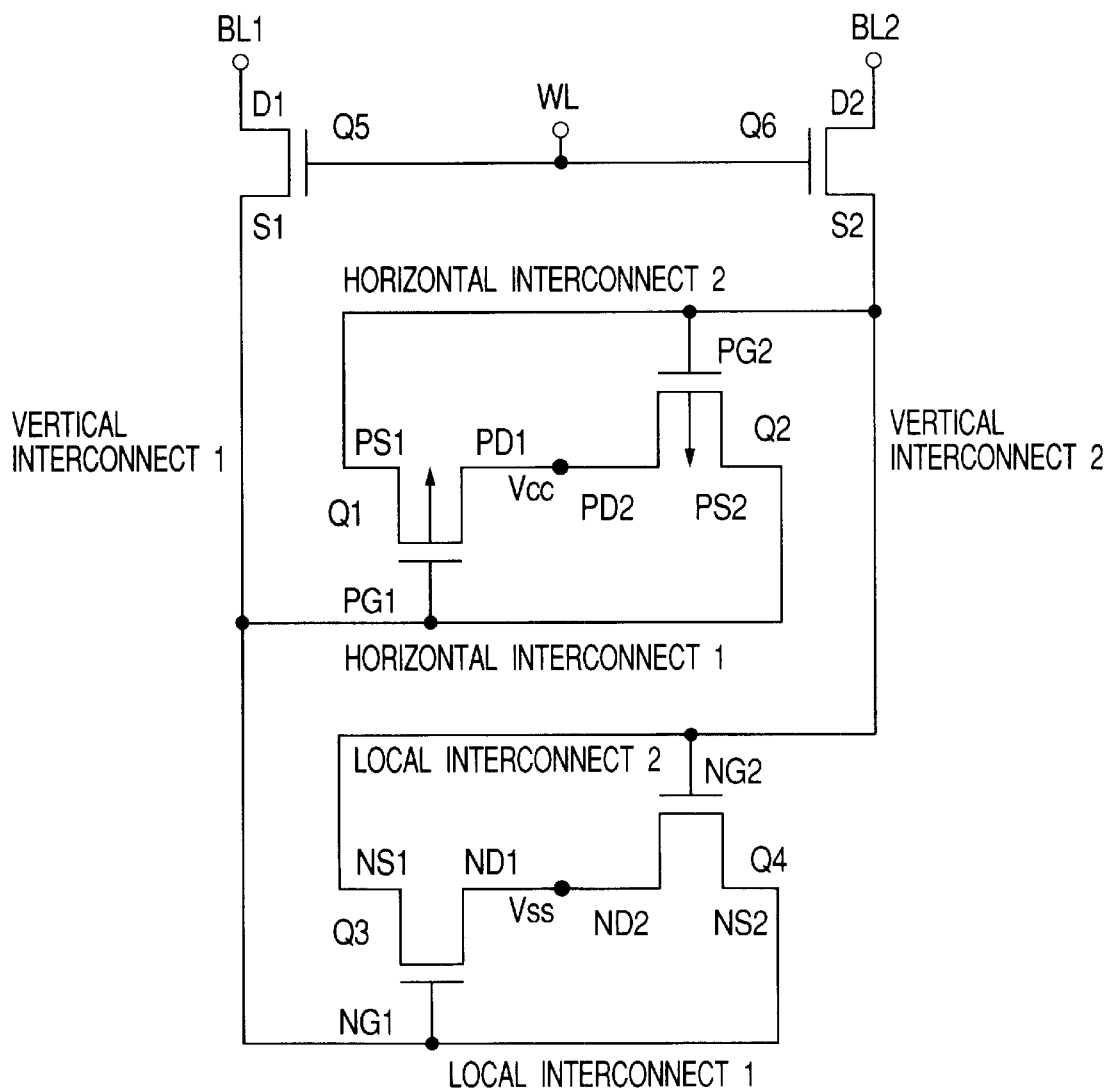
FIG. 23 is a circuit diagram of the third embodiment of the vertical SRAM cell according to the invention.
Figure 24:
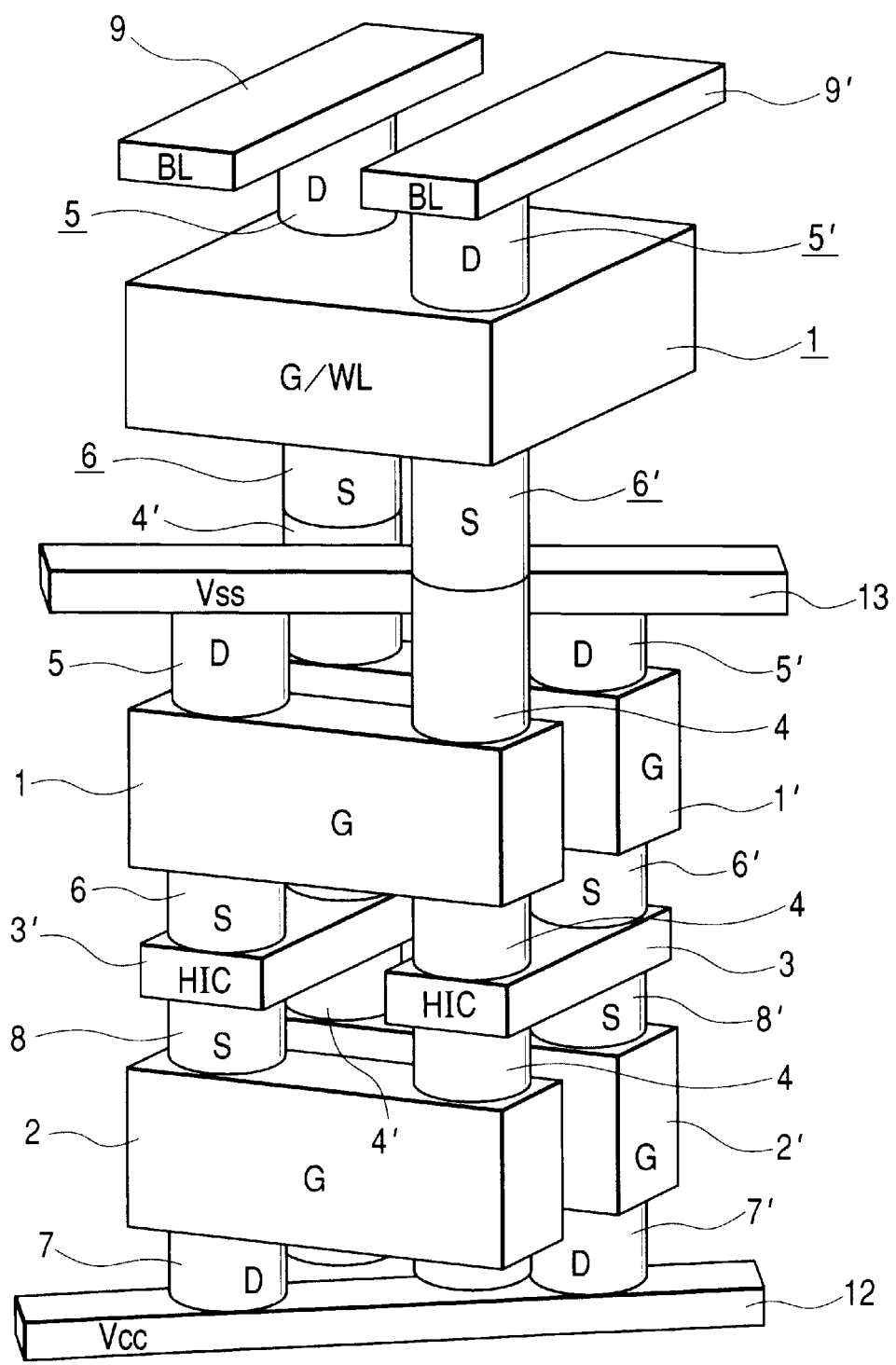
FIG. 24 is a 3D perspective view of the structure of the third embodiment of the vertical SRAM cell according to the invention in FIG. 23.
Figure 25:
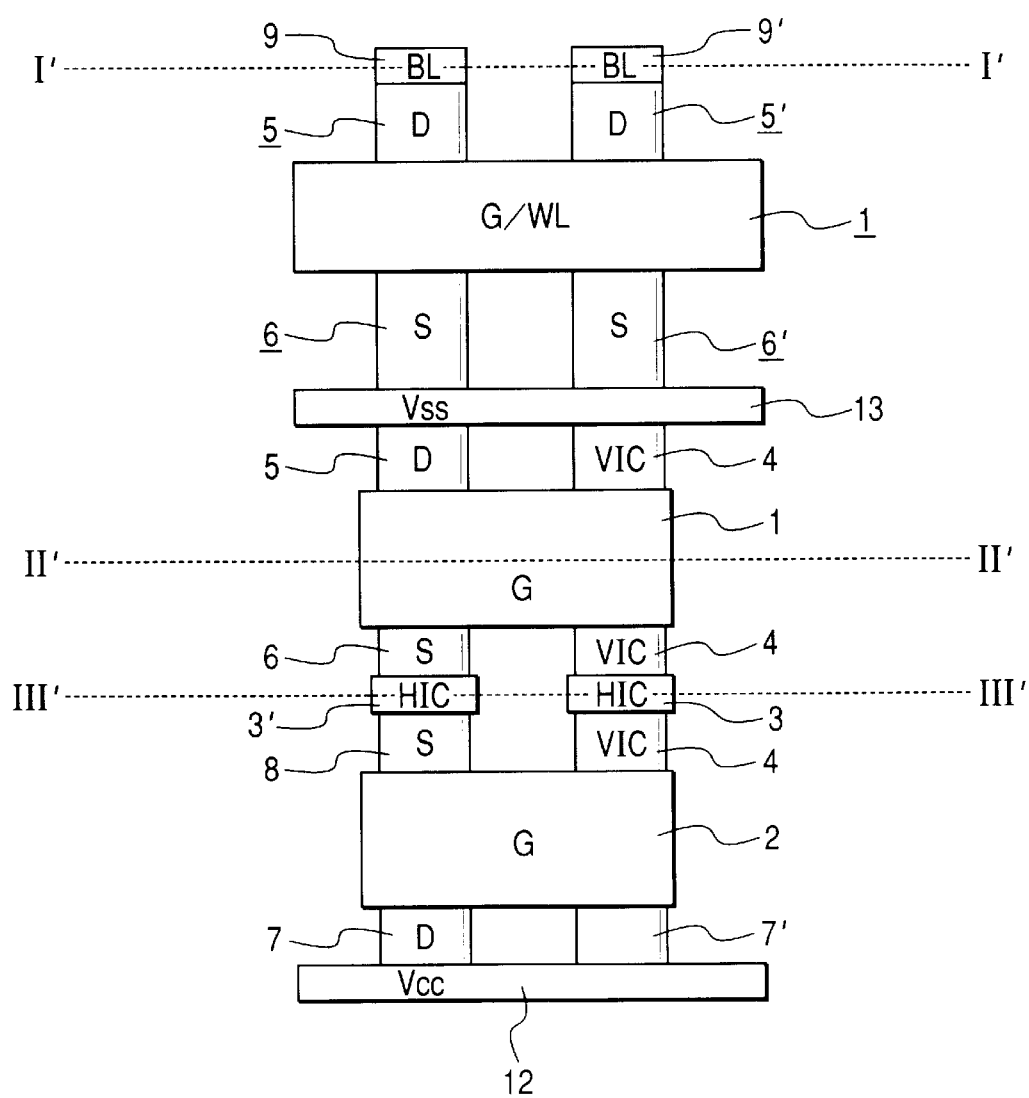
FIG. 25 shows a side view of the 3D structure in FIG. 24 from the plane of the front end of the word line 11 (WL).

The third embodiment can be obtained by taking away the substrate from the first embodiment, namely, by substituting the two regular transistors Q5, Q6 with a third pair of vertical transistors Q5, Q6. Referring to the circuit diagram in FIG. 23, a 6T vertical SRAM according to a third embodiment of the invention further moves the transfer transistors Q5, Q6 of the first embodiment to the top of the two load PMOS transistors Q1 and Q2 and the two drive NMOS transistors Q3 and Q4. As shown in the 3D diagram of the third embodiment (FIG. 24). The levels of the load MOSs and the drive MOSs can be switched as long as the transfer MOSs stay within a shared gate electrode block. In fact, the whole 3D structure in FIG. 24 can even be built upside down. Q1 includes a source 6, a gate electrode 1, and a drain 5. Q2 includes a source 6', a gate electrode 1', and a drain 5'. Q3 includes a source 8, a gate electrode 2, and a drain 7. Q4 includes a source 8', a gate electrode 2', and a drain 7'. Q5 includes a source 6, a gate electrode 1, and a drain 5. Q6 includes a source 6', a gate electrode 1, and a drain 5'. In particular, Q5, Q6 are directly stack on the tops of pair of vertical interconnects 4, 4'. The block 1 is embedded with the gate electrodes of Q5, Q6, and the word line 11 (shared gate/WL). A pair of bit lines 9, 9' are moved to the top to be directly connected with Q5, Q6 such that no bit line contact is necessary. FIG. 25 shown a side view of the structure in FIG. 24 looking from the plane of the front end of the bit lines 9, 9'(BL). The unit cell is made only with vertical MOSFETs over the Si substrate.

Above the drive transistors Q3 and Q4 are two horizontal interconnect beams 3 & 3' buried in an inter-layer insulating film. The horizontal interconnect beam 3 connects Q2, Q4 to the vertical interconnect column 4, and the horizontal interconnect beam 3' connect Q1, Q3 to the vertical interconnect column 4'. Q1, Q2 are connected to one shared Vcc beam 12, and Q3, Q4 are connected to one shared Vss beam 13. The single Vss beam right above the single Vcc beam is shared by a plurality of SRAM cells. Thus, high integration and low-drive-voltage operation become possible. The third embodiment has a smaller unit cell size than the first embodiment since its vertical Q5, Q6 take less space than the horizontal Q5, Q6 in the first embodiment. The third embodiment also has a lower unit cell height than the second embodiment due to its three levels (rather than four levels) vertical structure.

Figure 26:
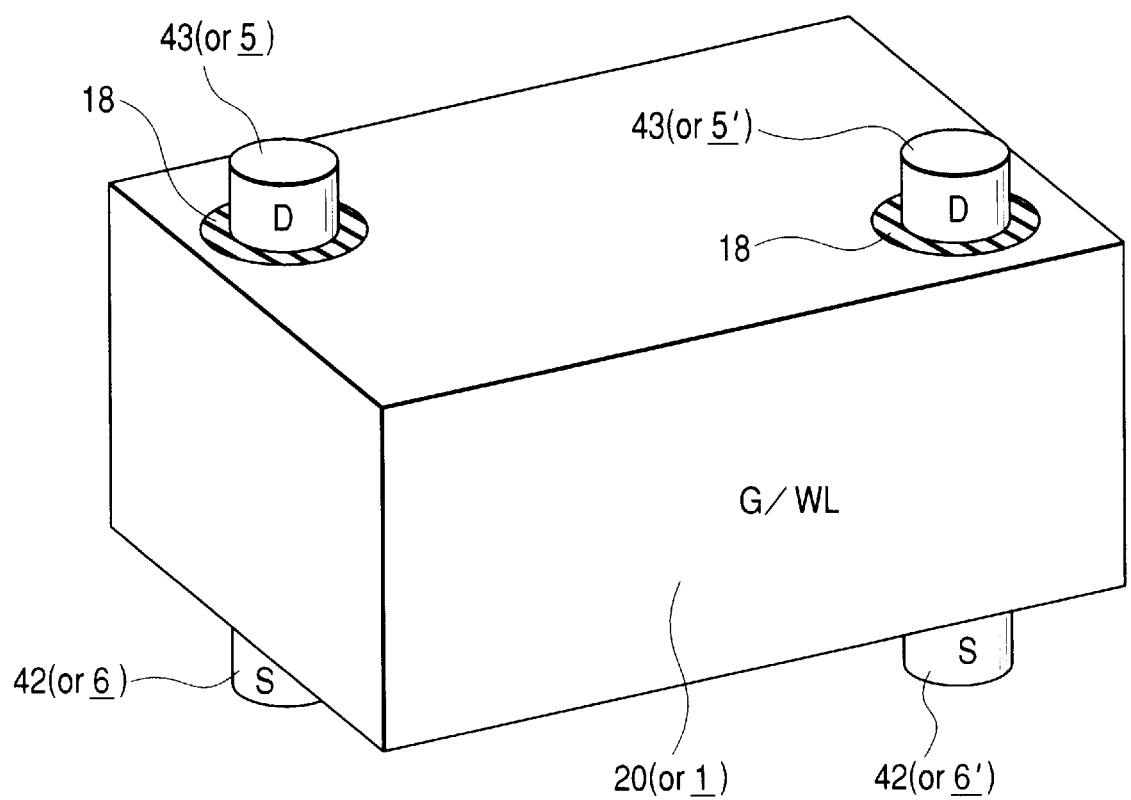
FIG. 26 shows an enlarged perspective view of Q5, Q6 by taking a partial perspective view of the top gate electrode block in FIG. 24.

Taking a partial perspective view of the top gate electrode block in FIG. 24, FIG. 26 shows an enlarged perspective view of Q5, Q6 embedded in two diagonal corners of the gate electrode block 20 (or 1). As mentioned in the first embodiment, the silicon dioxide gate dielectric wall 18 of Q5, Q6 are both cylindrical. And the gate electrode block 1 is embedded with Q5 and Q6. The shared-gate-electrode feature is applicable only for a pair of transfer transistors (but not a pair of load or drive transistors).

Figure 27:
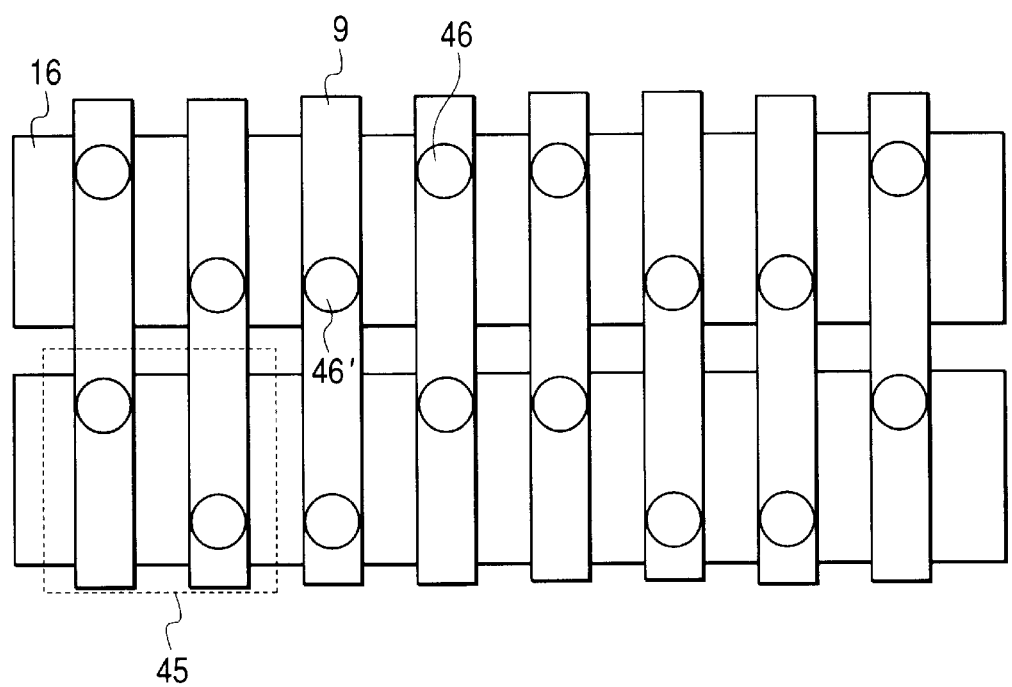
FIG. 27 schematically shows a top view of the vertical transfer transistors Q5, Q6 in the layout of a plurality of SRAM cells of the third embodiment of FIG. 24.

By looking down from a plane I'—I' in FIG. 25, FIG. 27 schematically shows the top view of the vertical transfer transistors Q5, Q6 in the layout of a plurality of SRAM cells of the third embodiment of FIG. 24. In particular, 46 denotes one of the vertical transistors Q5, Q6 stacking on the tops of the vertical interconnects 4', 4. 16 denotes a long block structure embedded with a plurality of blocks 1 which is embedded with the gate electrodes of Q5, Q6, and the word line 11. 45 denotes an area for the unit cell of the second embodiment in FIG. 24.

Figure 28:
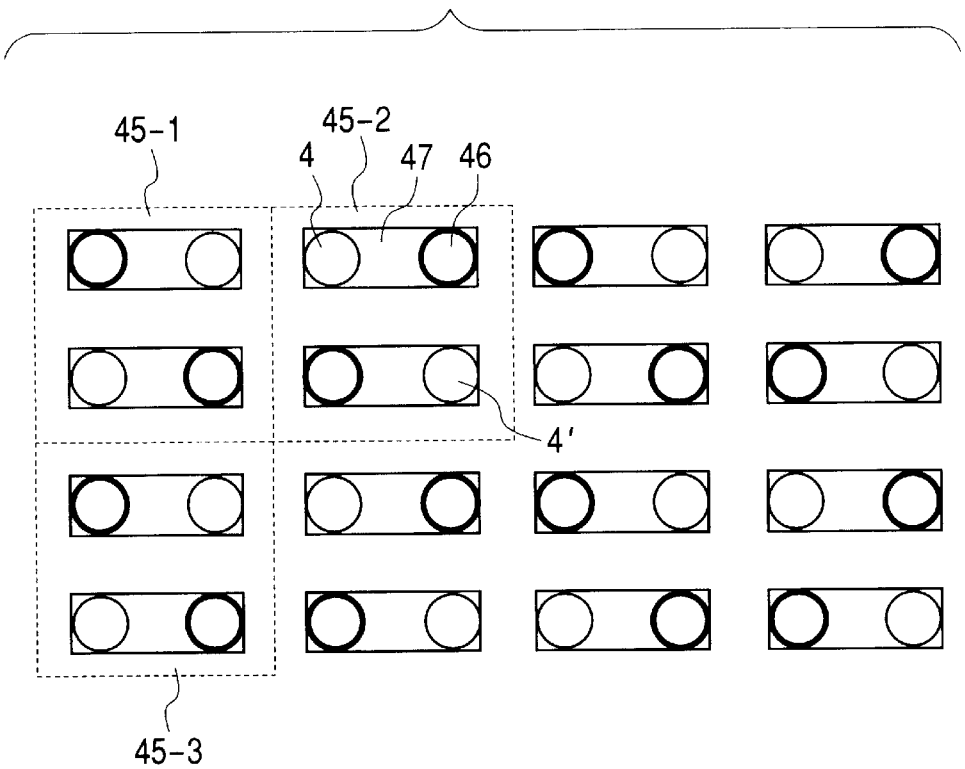
FIG. 28 schematically shows a common top view of the vertical load/drive transistors Q1/Q3, Q2/Q4 in the layout of a plurality of SRAM cells of the third embodiment of FIG. 24.

By looking down from a plane II'—II' in FIG. 25, FIG. 28 schematically shows the common top view of the vertical load/drive transistors Q1/Q3, Q2/Q4 in the layout of a plurality of SRAM cells of the third embodiment of FIG. 24. In particular, 46 denotes the vertical transistor Q2 stacking on the top of another vertical transistor Q4 rather than any the vertical interconnect. 47 denoted the gate electrode 1' of Q2 which is above the gate electrode 2' of Q4. 45 denotes an area for the unit cell of the third embodiment in FIG. 24. By arranging the unit cell 45-1 head to head with the unit cell 45-2, the two unit cells share Vss and Vcc. On the other hand, by arranging the unit cell 45-1 parallel with the unit cell 45-3, the two unit cells do not share Vss and Vcc. Any such stacking or topping is not precise due to alignment margins or any other design consideration.

The layout of the third embodiment in FIG. 28 has a pair of vertical transistors set at two diagonal corners of a square and a pair of vertical interconnects set at the other two diagonal corners of the square. On the other hand, the corresponding layout of the first embodiment if FIG. 10 has a pair of vertical transistors set at two diagonal corners of a parallelogram and a pair of vertical interconnects set at the other two diagonal corners of the parallelogram. The corresponding layout of the second embodiment if FIG. 21 has one vertical transistor set at one corner of a triangle and a pair of vertical interconnects set at the other two corners of the triangles.

Figure 29:
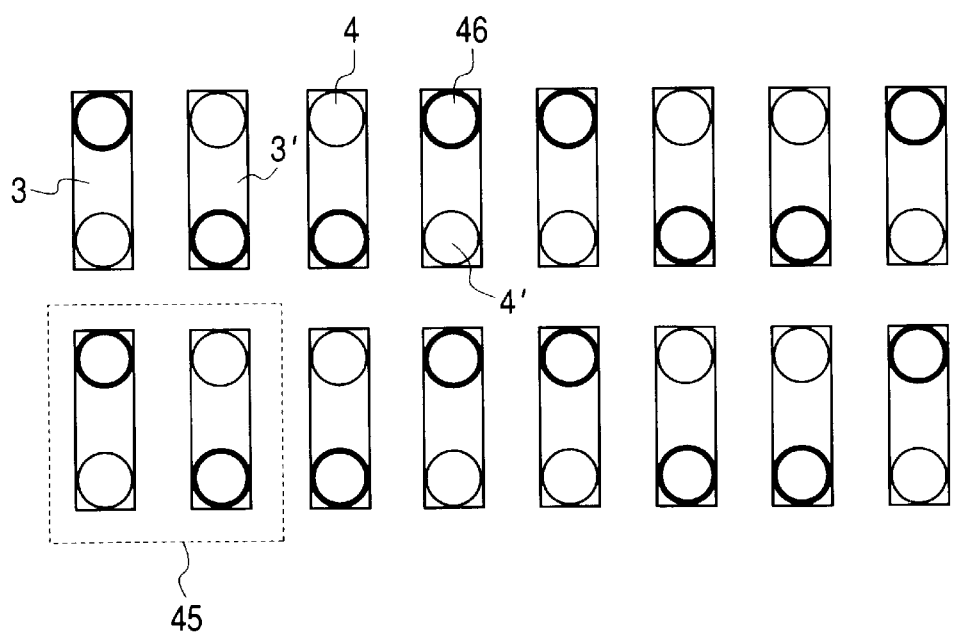
FIG. 29 schematically shows a top view of the horizontal interconnects in the layout of a plurality of SRAM cells of the third embodiment of FIG. 24.

By looking down from a plane III'—III' in FIG. 25, FIG. 29 schematically shows the top view of the horizontal interconnects in the layout of a plurality of SRAM cells of the third embodiment of FIG. 24. The interconnect 3 is perpendicular to the position of gate electrodes of the drive/load transistors 47 in FIG. 28. The shape of a unit cell of the vertical transistors (square) in FIG. 28 is he same as the shape of the unit cell of the horizontal interconnects in FIG. 29.

The vertical SRAM cell of the third embodiment is made only with vertical MOSFETs over the substrate of Si or polysilicon. The properties of the vertical MOSFETs with the Si substrate is different from those on a polysilicon substrate. The Si substrate is preferred so as to provide better mobility and less leakage current.

The third embodiment can also be easily modified by shifting around the levels, the building blocks or their portions. For example, the whole level of Q1, Q2, and Vcc may be switched with the level of Q3, Q4, and Vss. Alternatively, as discussed later in the seventh embodiment, the load transistors may be eliminated from the third embodiment.

Figure 30A:
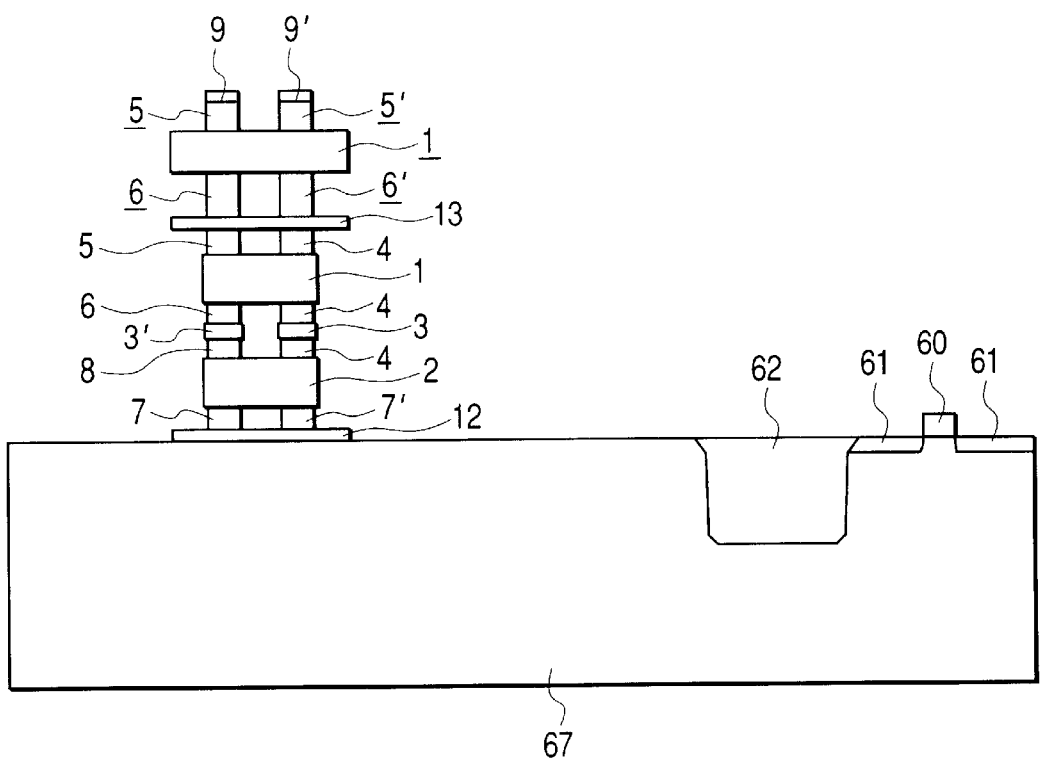
FIGS. 30A–C are fragmentary cross sections showing the correlation of a SRAM cell of the third embodiment (FIG. 25) with a peripheral control device.
Figure 30B:
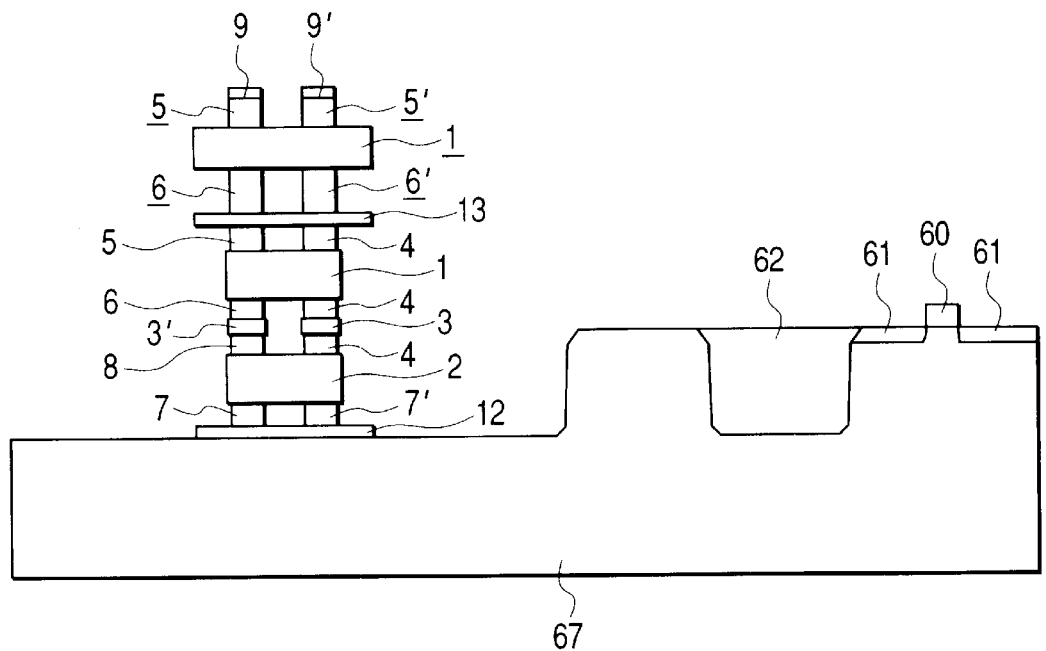

The third embodiment can also be applied in the SRAM matrix 50 in FIG. 12, which uses the SRAM matrix 50 as the main memory. The process flow of the third embodiment is similar to the one of the first embodiment and easily to be figured out by one skilled in the art. Due to the no-substrate nature of the third embodiment, it can be arranged differently with respect to peripheral control devices from the first and second embodiments FIGS. 30A, 30B are fragmentary cross sections showing a SRAM cell of the third embodiment (FIG. 25) along with a peripheral control device (ex. the decoder 52). The decoder 52 is an example of any peripheral circuit device other than another SRAM cell according to the invention. The decoder 52 is grown according to the traditional method in the substrate thus it includes one horizontal MOSFET with a gate electrode 60, source/drain regions 61, ad a shallow trench isolation 62. In FIG. 30A, the vertical SRAM cell is built directly on the top of the substrate. In contrast, the vertical SRAM cell of FIG. 30B is built inside a trench which is obtained via the same SIT process as the shallow trench isolation 62. As such, the wiring between the vertical SRAM cell of FIG. 30B and the decoder 52 is shorter and easier to make then the arrangement in FIG. 30A. In other words, the vertical SRAM cell can be built either on the substrate surface or in a trench on the substrate surface.

Figure 30C:
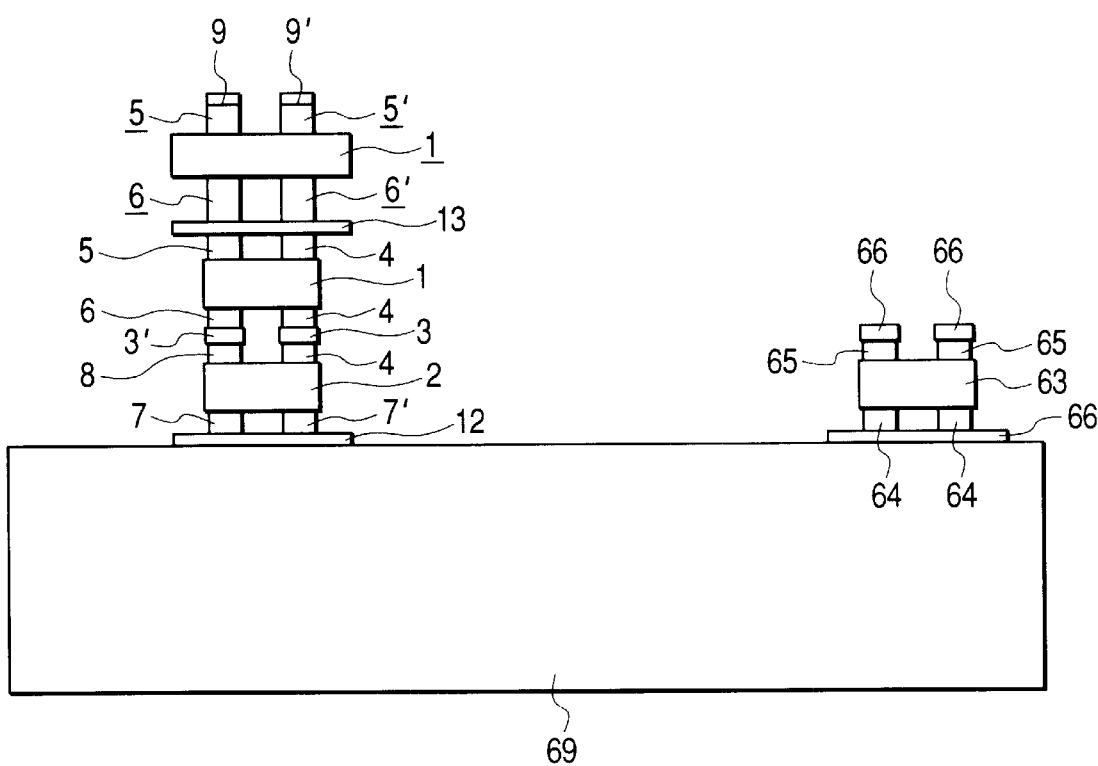

Alternatively, the vertical SRAM cell of the third embodiment can be built directly on top of the peripheral horizontal MOSFET grown in the substrate as shown in FIG. 30C. As such, the connection wire is significantly shortened, and the required area is also significantly reduced.

As mentioned in the discussion of the first embodiment, any peripheral control devices can also be built with vertical transistors. As shown in FIG. 30C, another decoder 53 includes a peripheral straight vertical MOSFET (without using the silicon substrate), which include a gate electrode 63, a source 64 and a drain 65. Since the peripheral vertical MOSFET is also built on top of the Si or poly-silicon substrate, the decoder 53 is easily connected with the vertical SRAM cell of the third embodiment with a wire 66 on the substrate.

In addition, the Si substrate in FIG. 30A can be substituted by a dielectric layer 69 such that the vertical SRAM cell built on the dielectric layer 69 in FIG. 30C is placed on top of the vertical SRAM cell in FIG. 30A. As such, the area size is further reduced by such a multiple-vertical-layer structure.

In a nutshell, it is possible for the third embodiment to further reduce the effective area of the circuit than the first embodiment by (1) burying any traditional peripheral devices underneath a vertical SRAM cell; (2) adopting straight vertical peripheral devices (without using the substrate) to be connected with a straight vertical SRAM cell; and/or (3) stacking one or more straight vertical SRAM cells on the top of each other to form a multiple-vertical-layer structure.

Fourth Embodiment

Figure 31:
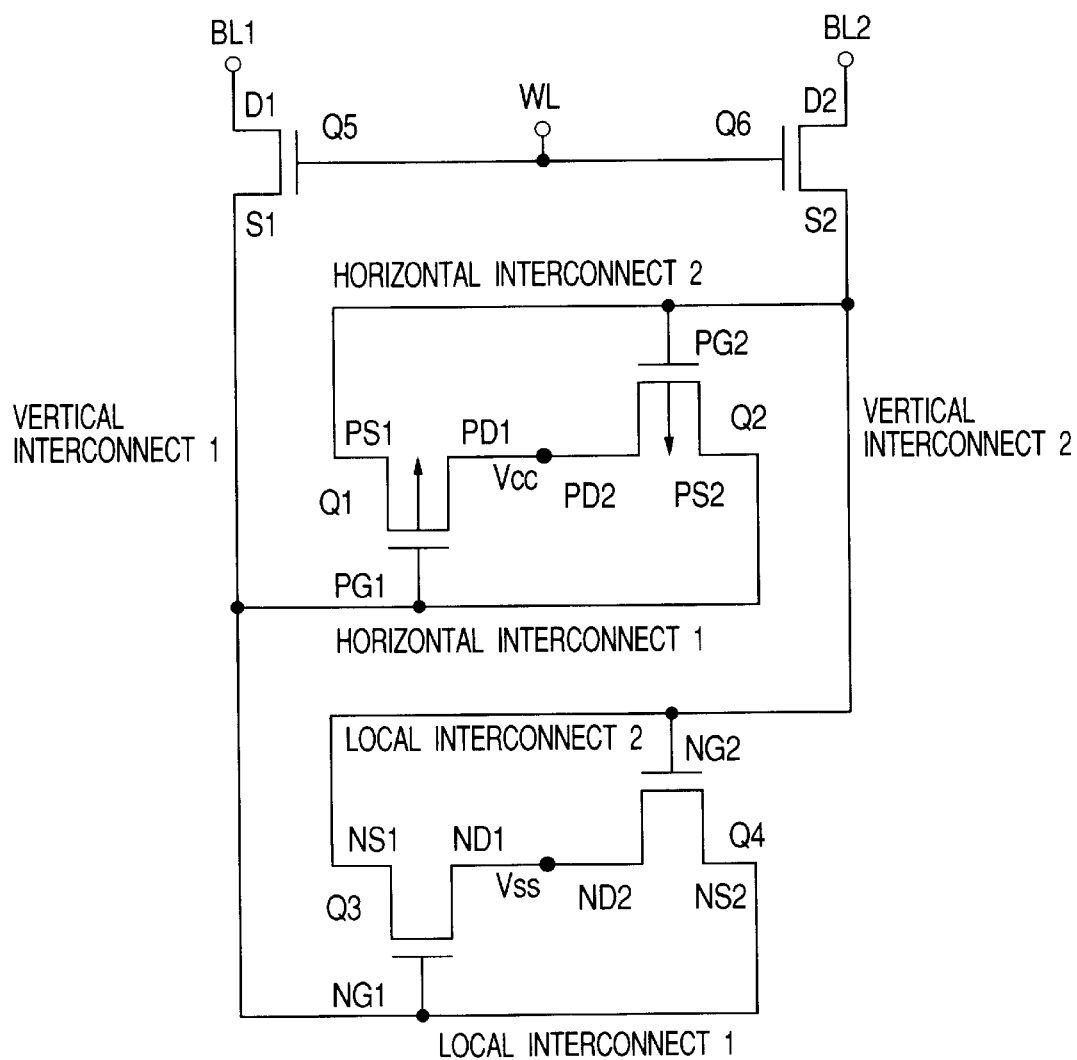
FIG. 31 is a circuit diagram of the fourth embodiment of the vertical SRAM cell according to the invention.

The fourth embodiment is hybrid of the first and third embodiments. This embodiment is obtained by substituting the bottom pair of vertical transistors in the third embodiment with a pair of horizontal transistor in the first embodiment. Referring to the circuit diagram in FIG. 31 (exactly the same as FIG. 23), a 6T vertical SRAM according to the fourth embodiment of the invention includes two transfer NMOS transistors Q5 and Q6 formed on the top of two load PMOS transistors Q1 and Q2, which are in turn formed on the top of two drive NMOS transistors Q3 and Q4 grown in the substrate. The levels of the load MOSs and the drive MOSs can be switched as long as the transfer MOSs stay within a shared gate electrode block. As shown in the 3D diagram of the fourth embodiment (FIG. 32), Q1 includes a source 8, a gate electrode 2, and a drain 7. Q2 includes a source 8', a gate electrode 2', and a drain 7'. Q5 includes a source 6, a gate electrode 16, and a drain 5. Q6 includes a source 6', a gate electrode 16 and a drain 5'. Q3, Q4 (not shown) are constructed underneath the 3D structure shown in FIG. 32.

Figure 33:
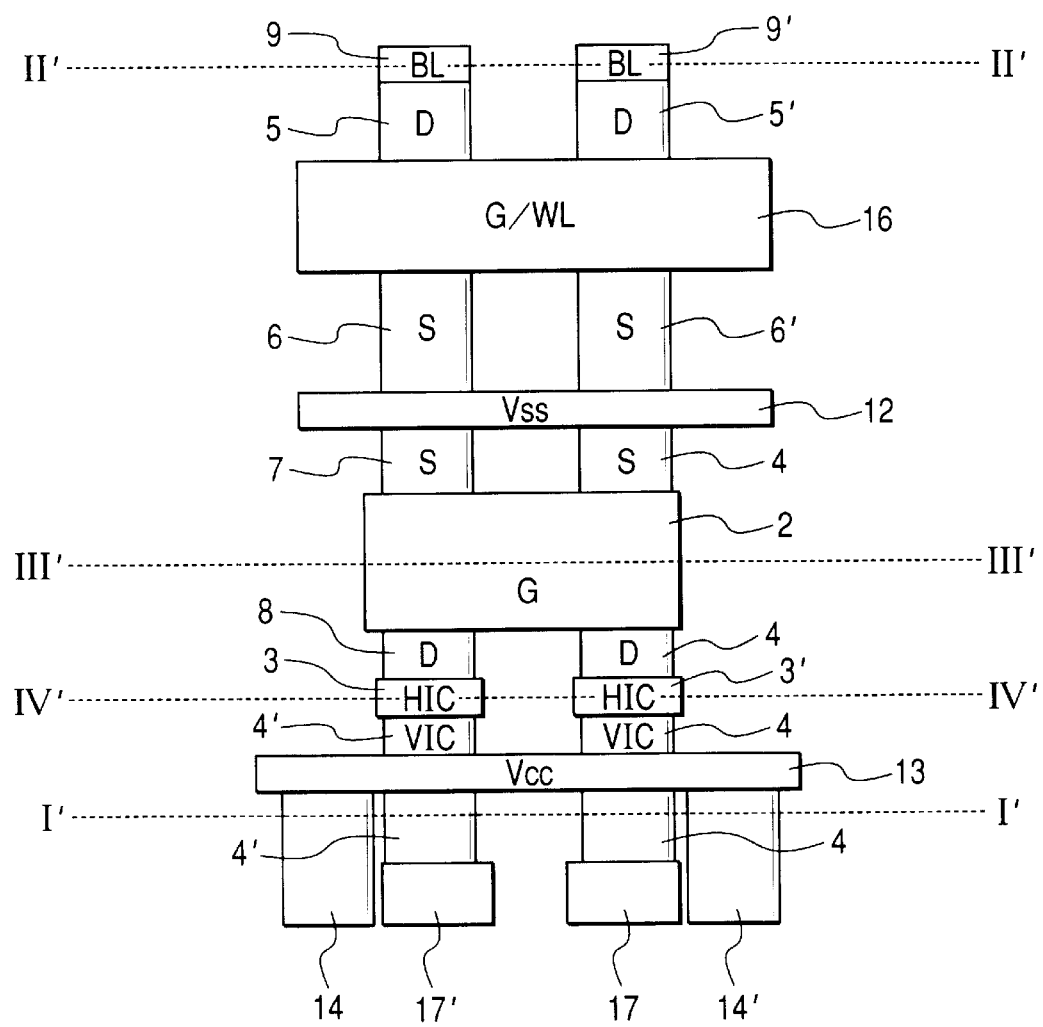
FIG. 33 shows a side view of the 3D structure in FIG. 32 from the plane of the front end of the bit lines 9, 9'(BL).

A Vcc beam and a pair of horizontal interconnects 17, 17' are built above the horizontal transistors. Each of the drive transistors Q3 and Q4 includes an active region. The block 16 is embedded with the gate electrodes of Q5, Q6, and the word line 11 (shared gate/WL). A pair of bit lines 9, 9' are moved to the top to be directly connected with Q5, Q6 such that no bit line contact is necessary. FIG. 33 shown a side view of the structure in FIG. 31 looking from the plane of the front end of the bit lines 9, 9'(BL).

The horizontal interconnect beam 17 connects Q4 to the vertical interconnect column 4, and the horizontal interconnect beam 17' connects Q3 the vertical interconnect column 4'. Above the drive transistors Q3 and Q4 are a pair of horizontal interconnect beams 3, 3' buried in an inter-layer insulating film. The horizontal interconnect beam 3 connects Q2 to the vertical interconnect column 4, and the horizontal interconnect beam 3' connect Q1 to the vertical interconnect column 4'. Q1, Q2 are connected to Vss beams 12, 12' respectively, and Q3, Q4 are connected to a Vcc beam 13 with Vcc contacts 14, 14'. The Vss beam right above the Vcc beam is shared by a plurality of SRAM cells. FIG. 33 shows a side view of the structure in FIG. 31 looking from the plane of the front ends of the horizontal interconnects 17, 17' (HIC). Thus, high integration and low-drive-voltage operation become possible.

Figure 32:
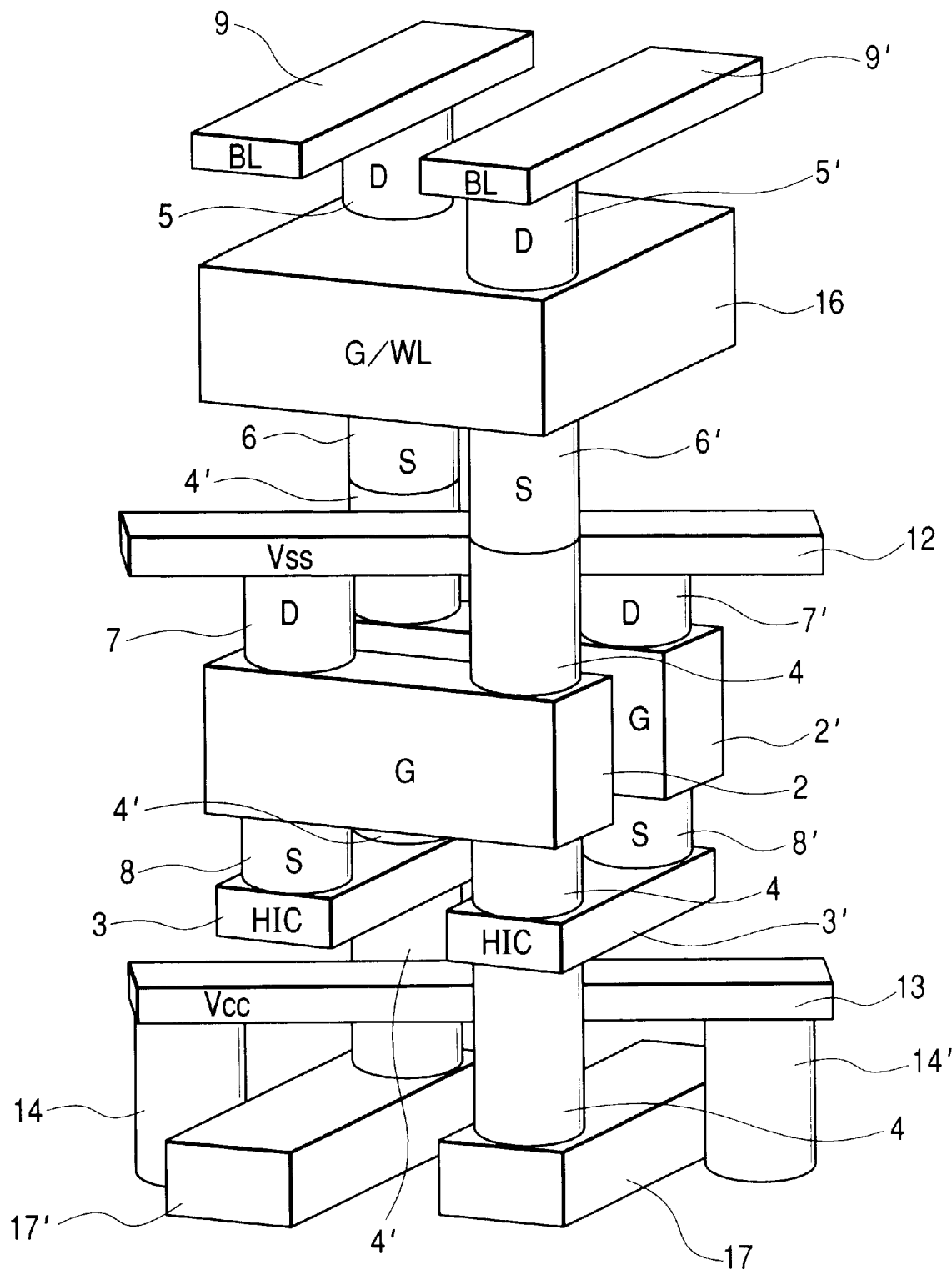
FIG. 32 is a 3D perspective view of the structure of the fourth embodiment of the vertical SRAM cell according to the invention in FIG. 31.
Figure 34:
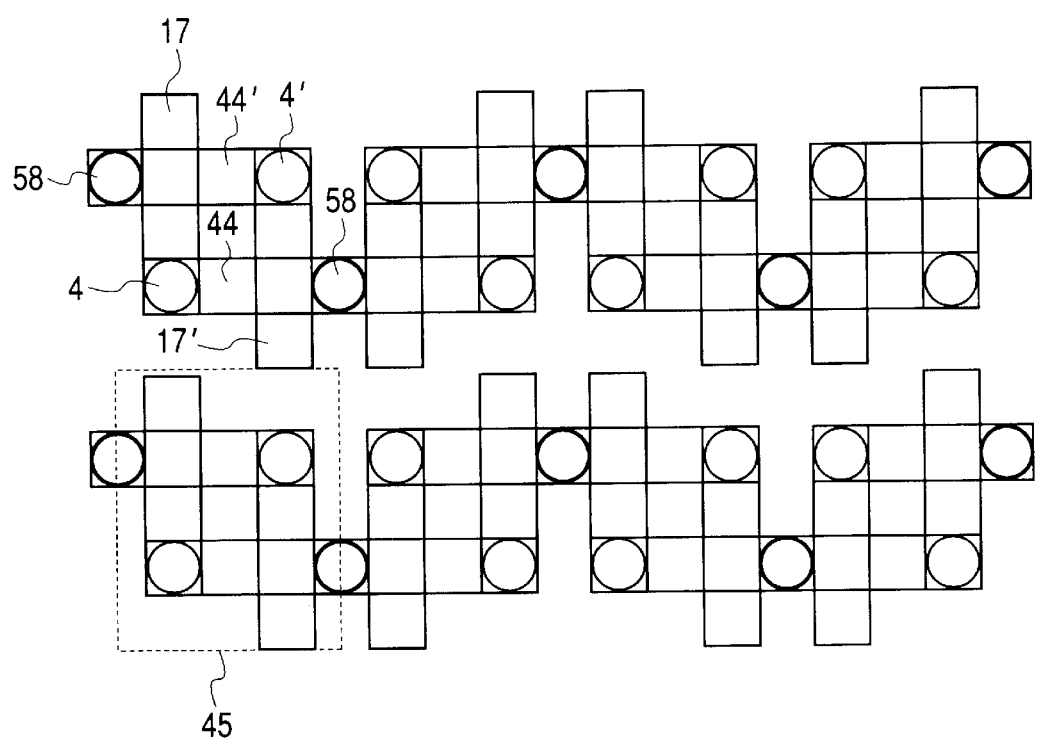
FIG. 34 schematically shows a top view of the horizontal transistors in the layout of a plurality of SRAM cells of the fourth embodiment of FIG. 32.

By looking down from a plane I'—I' in FIG. 33, FIG. 34 schematically shows the top view of the horizontal transistors in the layout of a plurality of SRAM cells of the fourth embodiment of FIG. 32. 17, 17' denote the two horizontal interconnects. 58 denotes Vss/Vcc contacts. 45 denotes an area for the unit cell of the fourth embodiment in FIG. 32. Comparing within the third embodiment, its bigger horizontal driver transistors are faster than its vertical transfer transistors, and they can easily be grown in the Si substrate. Comparing with other embodiments (FIGS. 11, 20), this embodiment requires bigger area space in the substrate than the first, second and third embodiments. However, the prior three embodiments do not have the mentioned internal comparison feature of the fourth embodiment.

Figure 35:
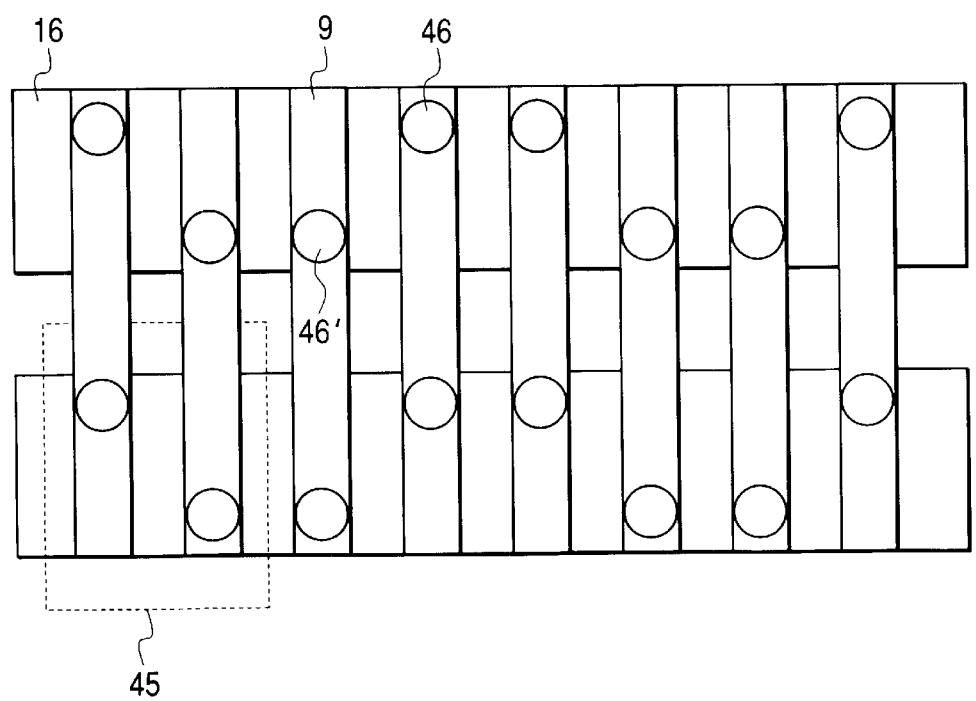
FIG. 35 schematically shows a top view of the vertical transfer transistors Q5, Q6 in the layout of a plurality of SRAM cells of the fourth embodiment of FIG. 32.

By looking down from a plane II'—II' in FIG. 33, FIG. 35 schematically shows the top view of the vertical transfer transistors Q5, Q6 in the layout of a plurality of SRAM cells of the fourth embodiment of FIG. 32. In particular, 46, 46' denote the vertical transistor Q5, Q6 stacking on the top of the vertical interconnect 4', 4, respectively. 16 denotes a long block structure embedded with a plurality of blocks 16 which is embedded with the gate electrodes of Q5, Q6, and the word line 11. 45 denotes an area for the unit cell of the fourth embodiment in FIG. 32. Comparing with the third embodiment, FIG. 35 looks almost the same as FIG. 27 except its lower block 16 is longer, such as 25% longer, than the one of the third embodiment. This is a direct result of the layout in FIG. 36 and the 3D structure in FIG. 32.

Figure 36:
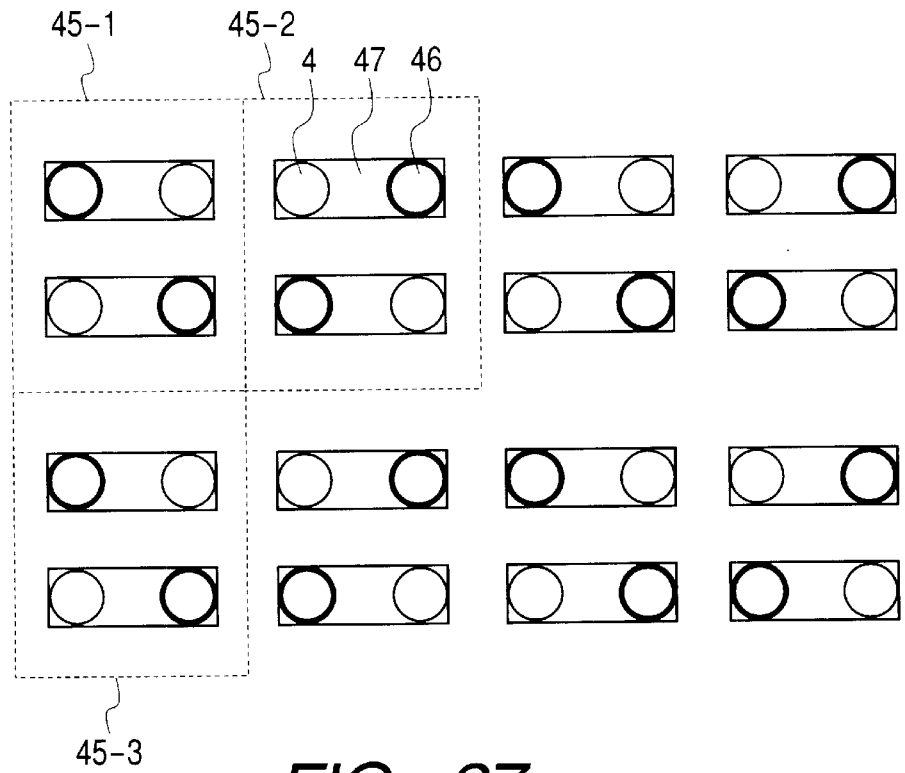
FIG. 36 schematically shows a top view of the vertical load transistors Q1, Q2 in the layout of a plurality of SRAM cells of the fourth embodiment of FIG. 32.

By looking down from a plane III'—III' in FIG. 33, FIG. 36 schematically shows the top view of the vertical load transistors Q1, Q2 in the layout of a plurality of SRAM cells of the fourth embodiment of FIG. 32. In particular, 46 denotes the vertical transistor Q2 stacking on the top of a horizontal interconnect 3 rather than any vertical interconnect or vertical transistor as in the prior embodiment. 47 denoted the gate electrode 2' of Q2. By arranging the unit cell 45-1 head to head with the unit cell 45-2, the two unit cells share Vss and Vcc. On the other hand, by arranging the unit cell 45-1 parallel with the unit cell 45-3, the two unit cells do not share Vss and Vcc. Any such stacking or topping is not precise due to alignment margins or any other design consideration. Comparing with the third the embodiment, FIG. 36 looks almost the same as FIG. 28 except its lower row is longer, such as 25% longer, than the one of the third embodiment. This is also a direct result of the following layout and the 3D structure in FIG. 32. The fourth embodiment has a layout in FIG. 33 having the same shape as the third embodiment but with a pair of vertical transistors set at two diagonal corners of a larger square and a pair of vertical interconnects set at the other two diagonal corners of the square. Therefore, the smallest pitch of the fourth embodiment is larger than the one in the third embodiment, and the respective one in the first and second embodiments as well.

Figure 37:
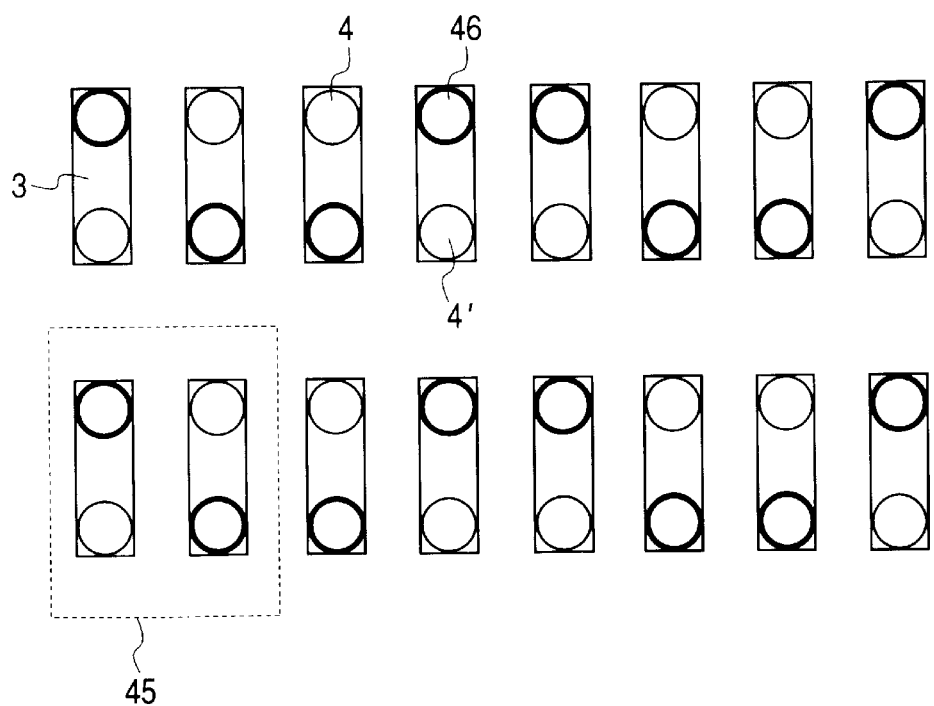
FIG. 37 schematically shows a top view of the horizontal interconnects in the layout of a plurality of SRAM cells of the fourth embodiment of FIG. 32.

By looking down from a plane VI'—VI' in FIG. 33, FIG. 37 schematically shows the top view of the horizontal interconnects in the layout of a plurality of SRAM cells of the fourth embodiment of FIG. 32. The interconnect 3 is perpendicular to the position of gate electrodes of the drive/load transistors 47 in FIG. 36. Comparing with the third embodiment, FIG. 37 looks almost the same as FIG. 29 except its lower row is longer, such as 25% longer, than the one of the third embodiment. By analogy, this is also a direct result of the above-mentioned layout and the 3D structure in FIG. 32.

The fourth embodiment can also be easily modified by shifting around the building blocks or their portions. As discussed later in the seventh embodiment, the load transistors may be eliminated from the fourth embodiment.

The process flow of the fourth embodiment is similar to the one of the first embodiment or any other prior embodiments, which is easily to be figured out by one skilled in the art.

Fifth Embodiment

Figure 38:
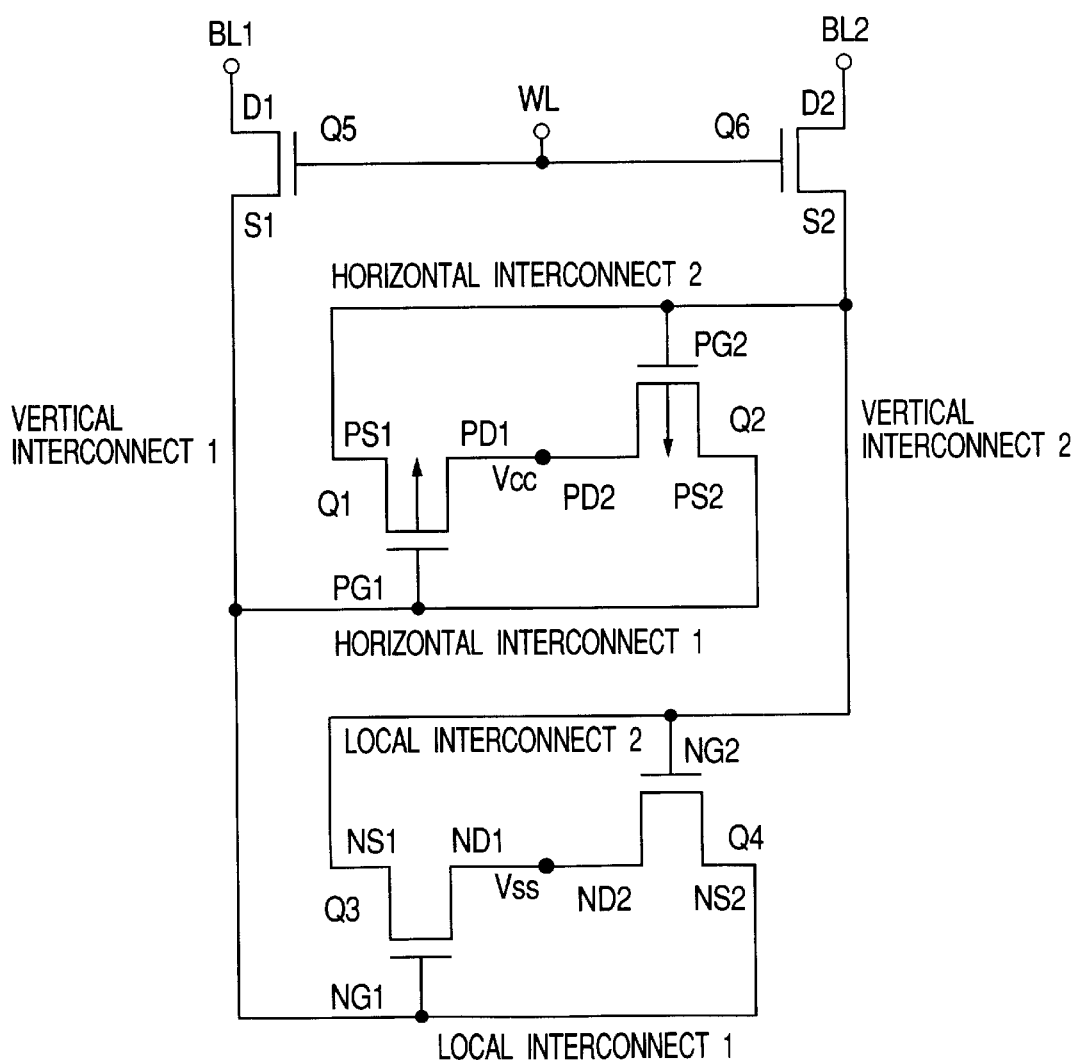
FIG. 38 is a circuit diagram of the fifth embodiment of the vertical SRAM cell according to the invention.

The fifth embodiment is obtained by switching Q1, Q2 with Q3, Q4 in the fourth embodiment, then putting the four vertical transistors Q5, Q6, Q3, Q4 into the same level. Referring to the circuit diagram in FIG. 38 (similar to FIG. 31), a 6T vertical SRAM according to the fifth embodiment of the invention includes two transfer NMOS transistors Q5 and Q6 formed in the same level with the two drive NMOS transistors Q3 and Q4 above of two load PMOS transistors Q1 and Q2 made in the crystal Si wafer substrate. The drive MOSs are preferred to be the same conductivity type as the transfer MOSs (embedded within a shared gate electrode block) so as to combine the manufacturing process for the drive MOSs with the transfer MOSs into one. As shown in the 3D diagram of the fifth embodiment (FIG. 39), Q3 includes a source 6, a gate electrode 1, and a drain 5. Q4 includes a source 6', a gate electrode 1', and a drain 5'. Q5 includes a source 6, a gate electrode 16, and a drain 5. Q6 includes a source 6', a gate electrode 16 and a drain 5'. Q1, Q2 (not shown) are constructed underneath the 3D structure shown in FIG. 39.

A pair of bit lines 9, 9' are connected to the top of Q5, Q6 such that no bit line contact is necessary. Each of the load transistors Q1 and Q2 includes an active region. A Vcc beam and a pair of horizontal interconnects 17, 17' are built above the horizontal transistors. The block 16 is embedded with the gate electrodes of Q5, Q6, and the word line 11 (shared gate/WL). FIG. 40 shows a side view of the structure in FIG. 39 looking from the plane of the front end of the word line 16 (G/WL).

The horizontal interconnect beam 17 connects Q6 to the vertical interconnect column 4, and the horizontal interconnect beam 17' connects Q5 the vertical interconnect column 4'. Above the drive transistors Q3 and Q4 are a pair of horizontal interconnect beams 3, 3' buried in an inter-layer insulating film. The horizontal interconnect beam 3 connects Q3 to the vertical interconnect column 4, and the horizontal interconnect beam 3' connect Q4 to the vertical interconnect column 4'. An additional pair of horizontal interconnects 3, 3' are provided in this embodiment than the fourth embodiment. The horizontal interconnect beam 3 connects Q6 to the vertical interconnect column 4, and the horizontal interconnect beam 3' connect Q5 to the vertical interconnect column 4'. Q3, Q4 are connected to one shared Vss beam 12, and Q1, Q2 are connected to a Vcc beam 13 with Vcc contacts 14, 14'. Thus, high integration and low-drive-voltage operation become possible. Comparing with all prior embodiments, the unit cell height of this embodiment is lowest since only a single vertical transistor level is required. On the other hand, both the first and fourth embodiments have two vertical levels, the third embodiment has three vertical levels, and the second embodiment has four vertical levels.

Figure 39:
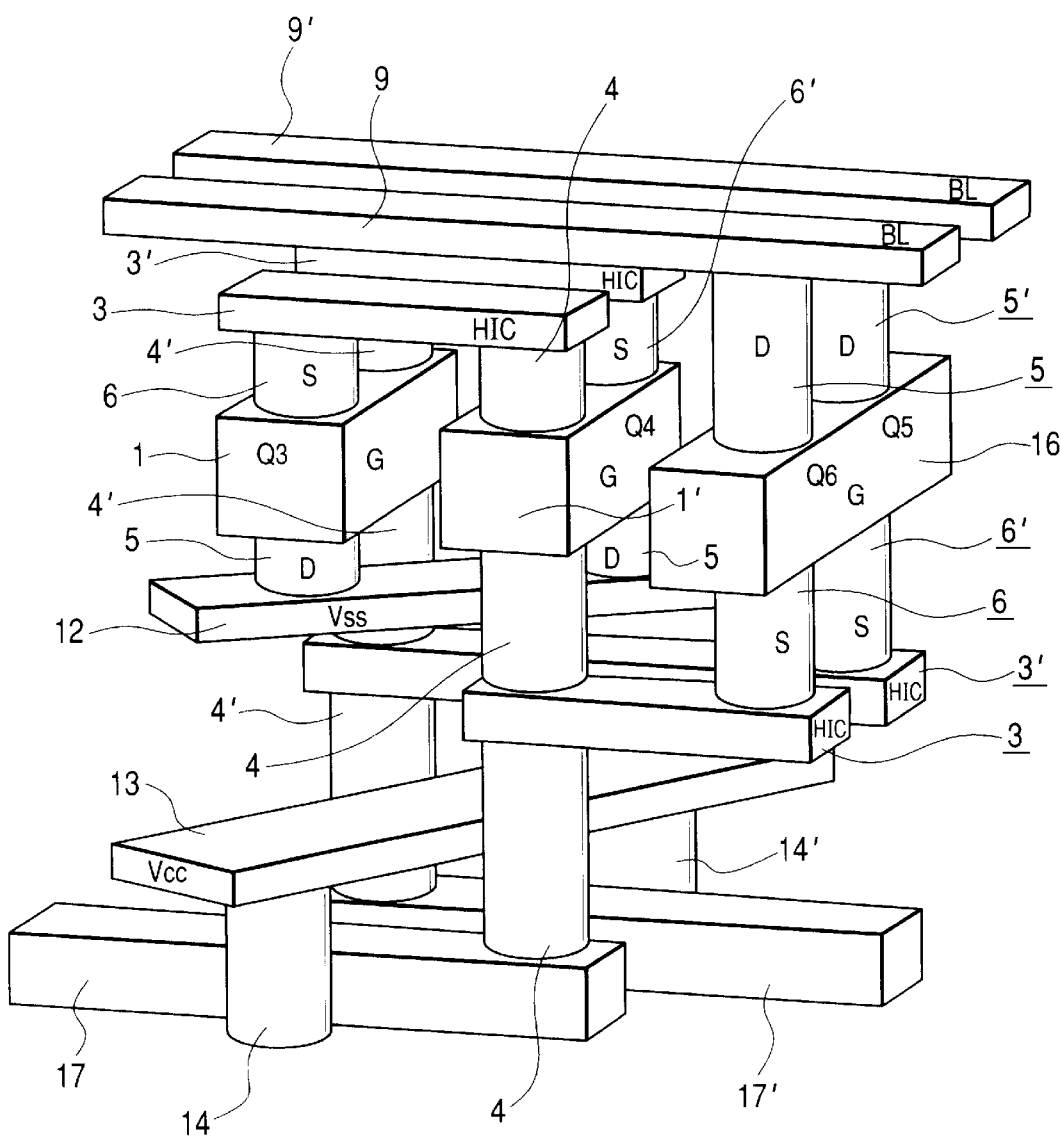
FIG. 39 is a 3D perspective view of the structure of the fifth embodiment of the vertical SRAM cell according to the invention in FIG. 38.
Figure 40:
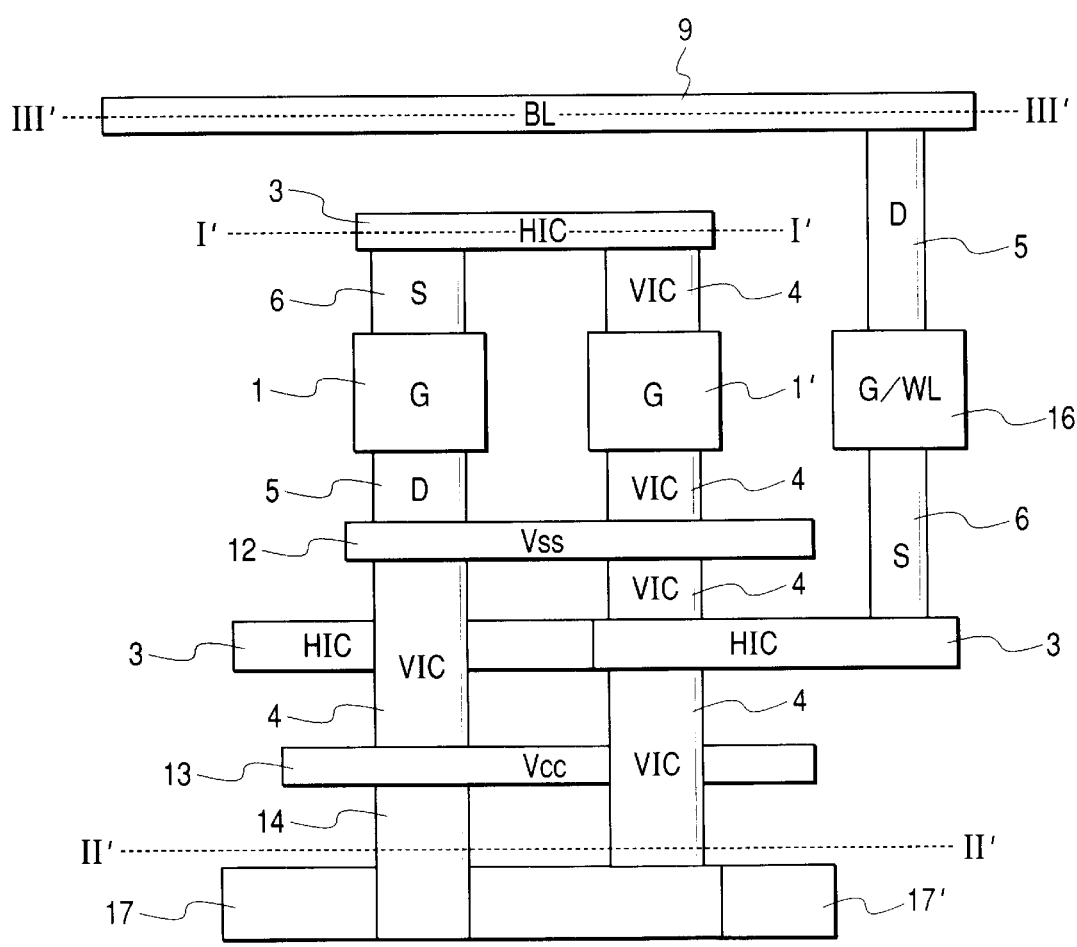
FIG. 40 shows a side view of the 3D structure in FIG. 39 from the plane of the front end of the word line 16 (G/WL).
Figure 41:
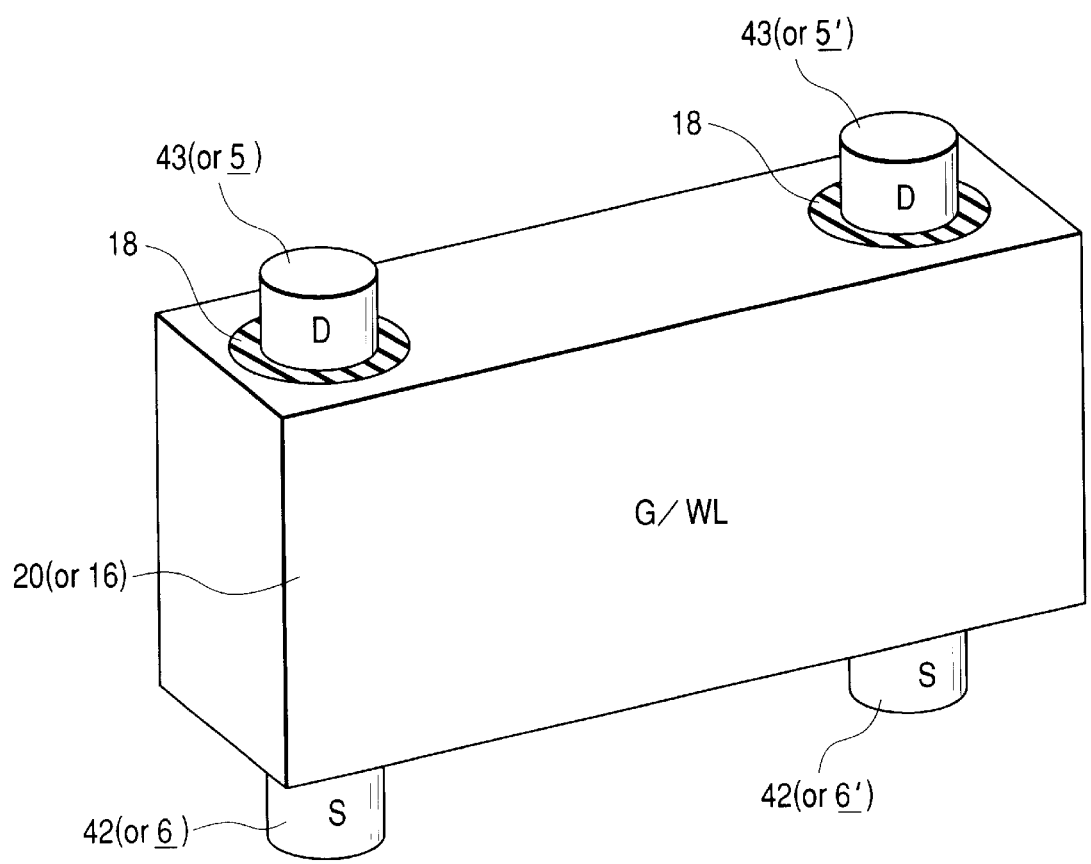
FIG. 41 shows an enlarged perspective view of Q5, Q6 by taking a partial perspective view of the top gate electrode block in FIG. 39.

Taking a partial perspective view of the top gate electrode block in FIG. 39, FIG. 41 shows an enlarged perspective view of Q5, Q6 embedded at two ends of the gate electrode block 20 (or 16). As mentioned in the first embodiment, the silicon dioxide gate dielectric wall 18 of Q5, Q6, are both cylindrical. And the gate electrode block 16 is embedded with Q5 and Q6. The shared-gate-electrode feature is applicable only for a pair of transfer transistors (but not a pair of load or drive transistors).

Figure 42:
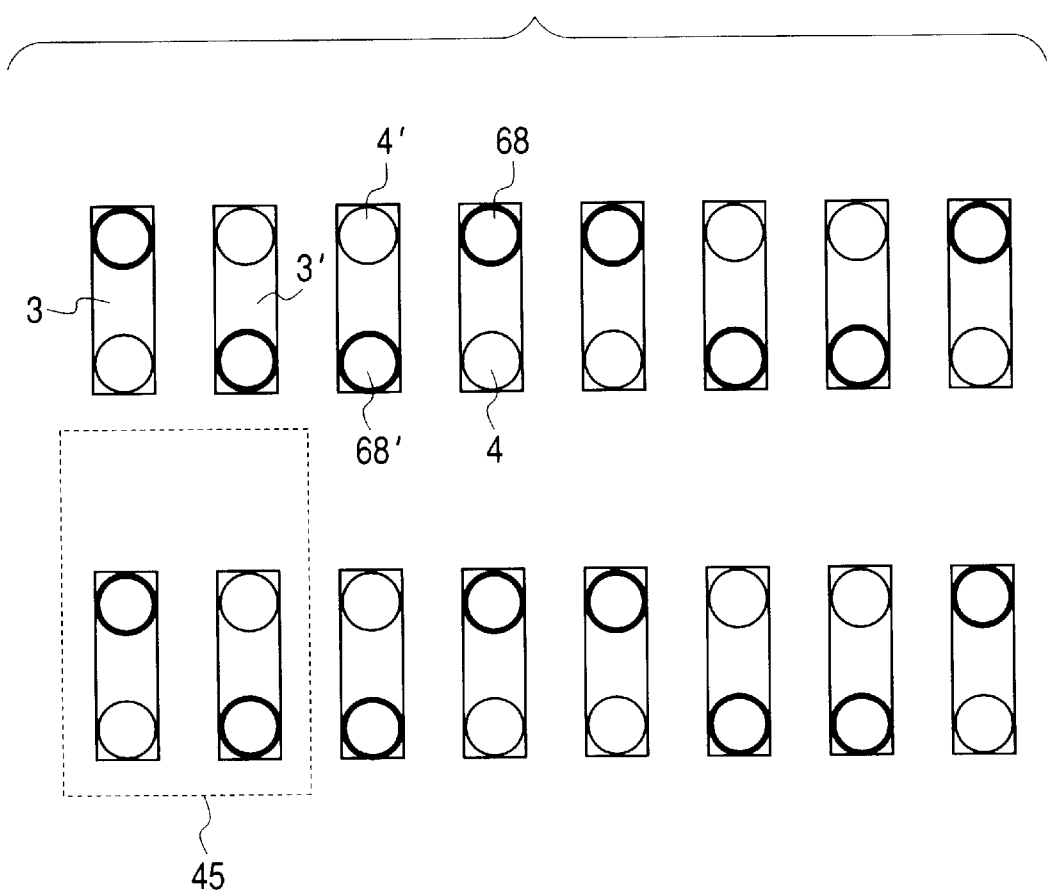
FIG. 42 schematically shows a top view of the horizontal interconnects in the layout of a plurality of SRAM cells of the fifth embodiment of FIG. 39.

By looking down from a plane I'—I' in FIG. 40, FIG. 42 schematically shows the top view of the horizontal interconnects in the layout of a plurality of SRAM cells of the fifth embodiment of FIG. 39. 68, 68' denote the position of the vertical transistors Q3, Q4. The interconnects 3, 3' are perpendicular to the gate electrodes of the vertical transistors in FIG. 39. 45 denotes an area for one unit cell of the fifth embodiment in FIG. 39. Comparing with the third/fourth embodiments respectively, FIG. 42 looks almost the same as FIGS. 29/37 except its both rows are longer, such as 50%/20% longer, than those of the third/fourth embodiments. This is a direct result of the layout in FIG. 44 and the 3D structure in FIG. 39.

Figure 43:
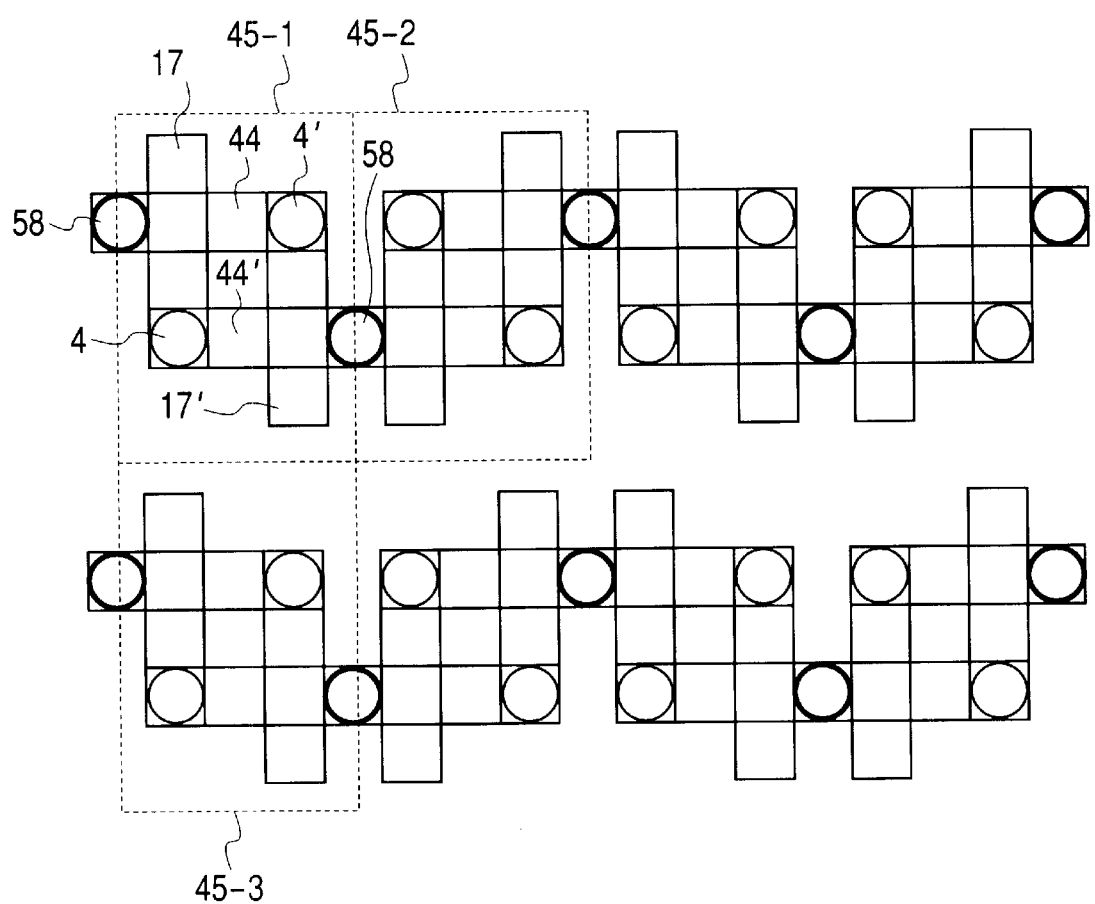
FIG. 43 schematically shows a top view of the horizontal transistors in the layout of a plurality of SRAM cells of the fifth embodiment of FIG. 39.

By looking down from a plane II'—II' in FIG. 40, FIG. 43 schematically shows the top view of the horizontal transistors in the layout of a plurality of SRAM cells of the fifth embodiment of FIG. 39. 4 & 4' denote the two vertical interconnects. 17, 17' denote the two horizontal interconnects. 58 denotes Vss/Vcc contacts. 44, 44' denote the active regions of the horizontal transistors Q1, Q2. By arranging the lower portion of the unit cell 45-1 head to head with the lower portion of the unit cell 45-2, the two unit cells share Vss and Vcc. On the other hand, by arranging the lower portion of the unit cell 45-1 parallel with the lower portion of the unit cell 45-3, the two unit cells do not share Vss and Vcc. Comparing with other embodiments (FIGS. 11, 20, 34), this embodiment takes bigger area space over the substrate due to its three parallel gate electrode blocks in one vertical level. On the other hand, the first, third, and fourth embodiments only have two parallel gate electrode blocks in the same vertical level, and the second embodiment has merely one single gate electrode block in each vertical level.

Figure 44:
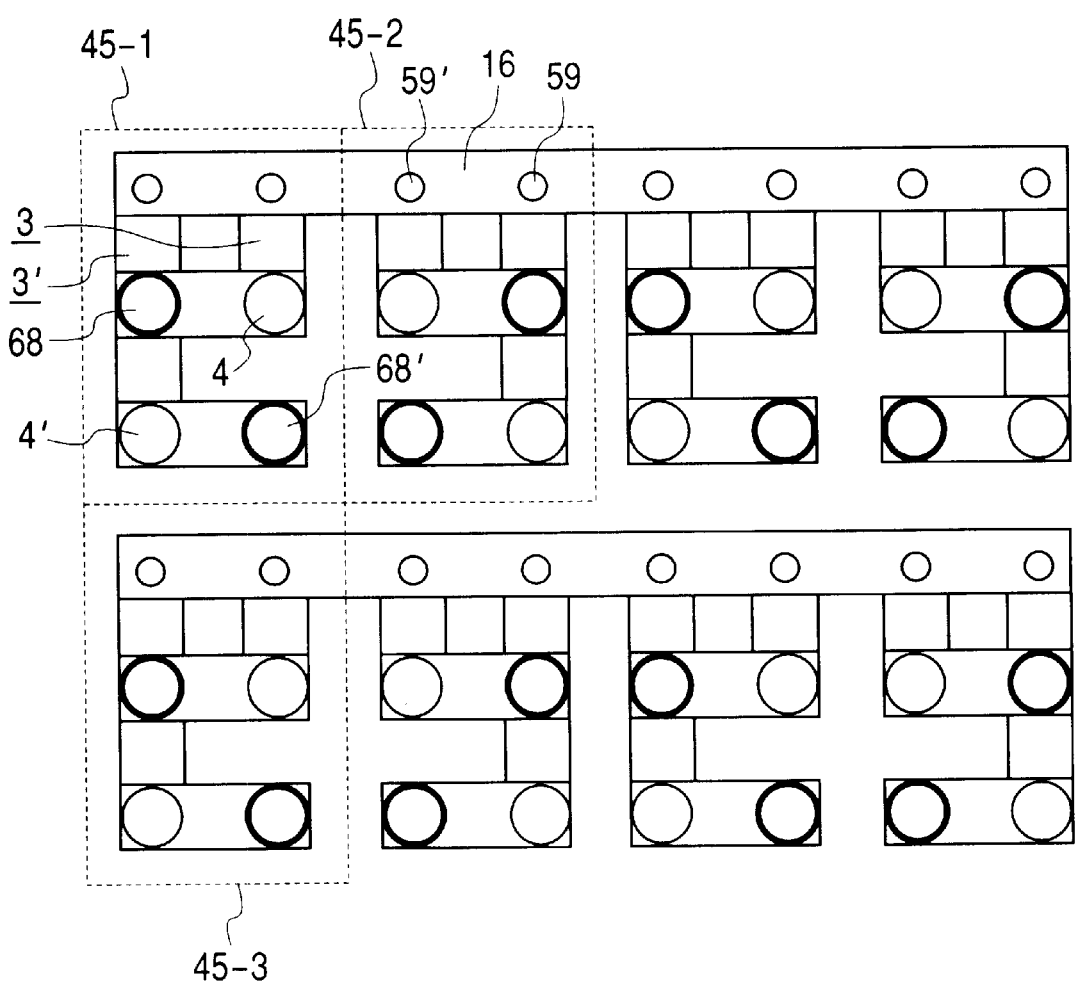
FIG. 44 schematically shows a top view of the four vertical transfer transistors Q3, Q4, Q5, Q6 in the layout of a plurality of SRAM cells of the fifth embodiment of FIG. 39.

By looking down from a plane III'—III' in FIG. 40, FIG. 44 schematically shows the top view of the four vertical transfer transistors Q3, Q4, Q5, Q6 in the layer of a plurality of SRAM cells of the fifth embodiment of FIG. 39 (by ignoring the intermediate horizontal interconnects and the Vss). The word line 16, which is embedded with the gate electrodes of Q5, Q6, is shown as the top of the drawing. 59 & 59' denote the positions of the two vertical transistors Q6, Q5, and 68 & 68' denote the positions of the two vertical transistors Q4, Q3. 3 & 3' denote the two horizontal interconnects connecting Q6, Q5 to the vertical interconnects 4, 4' respectively. Comparing with the third/fourth embodiments respectively, FIG. 44 looks almost the same as FIGS. 27/35 except its both rows are longer, such as 50%/20% longer, than those of the third/fourth embodiments. The fifth embodiment has a layout in FIG. 44 with a lower portion the same as the square of the third and fourth embodiments but an upper portion having a third pair of vertical transistors set at two end corners of a rectangular. Therefore, the smallest pitch of the fifth embodiment is larger than the respective one in the third and forth embodiments, and the respective one in the first and second embodiments.

Figure 45:
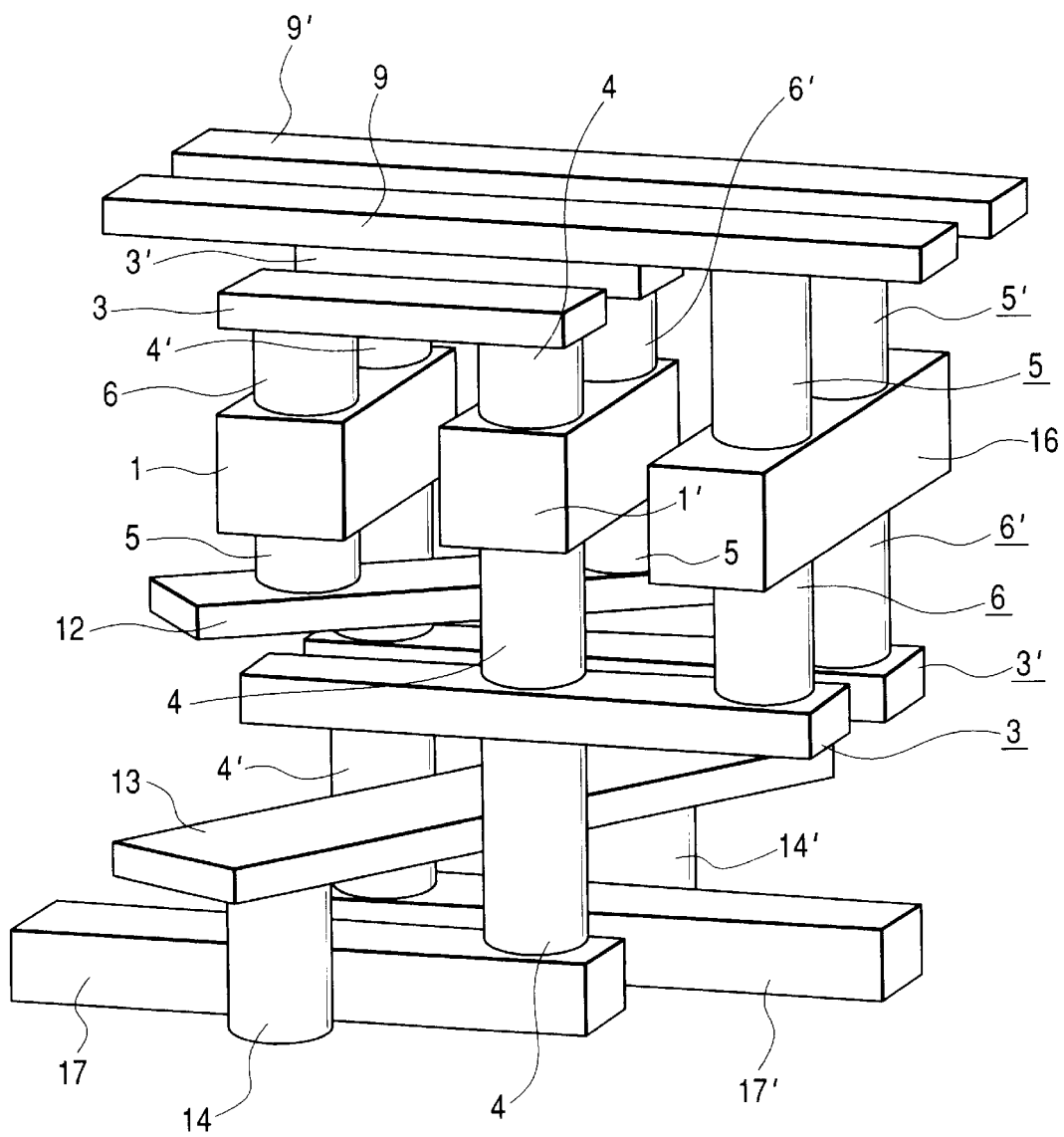
FIG. 45 shows the modified embodiment 5-1 modified from the fifth embodiment in FIG. 39.
Figure 46:
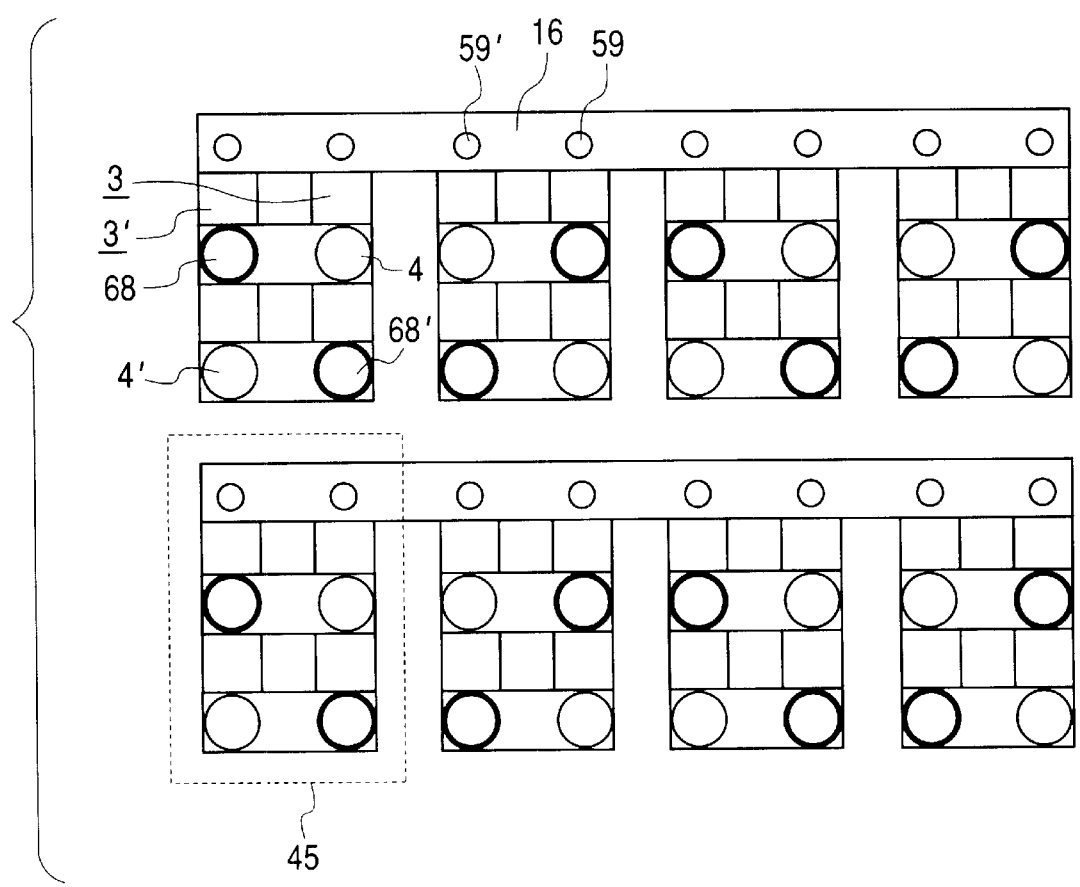
FIG. 46 schematically shows a top view of the four vertical transfer transistors Q3, Q4, Q5, Q6 in the layout of a plurality of SRAM cells of the fifth embodiment of FIG. 39.

The fifth embodiment can also be easily modified by shifting around the building blocks or their portions. For example, the shared gate electrode block of Q5, Q6 may be shifted to the left side of Q3, Q4. As shown in FIG. 45 the modified embodiment 5-1 extends the horizontal interconnect 3 to be as long as the horizontal interconnect 3'. As a result, the horizontal interconnect 3 also extends towards position 68 (FIG. 46). The extension of the horizontal interconnect 3 evens the length of horizontal interconnects 3, 3', which results in more homogeneous SRAM properties. As discussed later in the seventh embodiment, the load transistors may be eliminated from the fifth embodiment.

The process flow of the fifth embodiment is similar to the one of the first embodiment or any other prior embodiments which is easily to be figured out by one skilled in the art.

Sixth Embodiment

The sixth embodiment is obtained by separating the gate electrode block of Q5, Q6 in the fifth embodiment into two blocks. The circuit diagram of a 6T vertical SRAM according to the sixth embodiment is the same as the fifth embodiment (FIG. 38) of the invention includes two transfer NMOS transistors Q5 and Q6 formed in the same level with the two drive NMOS transistors Q3 and Q4 above of two load PMOS transistors Q1 and Q2 made in the substrate. The drive MOSs are preferred to be the same conductivity type as the transfer MOSs so as to combine the manufacturing process for the drive MOSs with the transfer MOSs into one. As shown in the 3D diagram of the sixth embodiment (FIG. 47), Q3 includes a source 6, a gate electrode 1, and a drain 5. Q4 includes a source 6', a gate electrode 1', and a drain 5'. Q5 includes a source 6, a gate electrode 16, and a drain 5. Q6 includes a source 6', a gate electrode 16' and a drain 5'. Q1, Q2 (not shown) are constructed underneath the 3D structure shown in FIG. 47.

A pair of bit lines 9, 9' are connected to the top of Q5, Q6 such that no bit line contact is necessary. Each of the load transistors includes an active region. A Vcc beam and a pair of horizontal interconnects 17, 17' are built above the horizontal transistors. The word line blocks 16, 16' are embedded with the gate electrodes of Q5, Q6 respectively. FIG. 48 shows a side view of the structure in FIG. 47 looking from the plane of the front end of the word line 16 (G/WL).

The horizontal interconnect beam 17 connects Q2 to the vertical interconnect column 4, and the horizontal interconnect beam 17' connects Q1 the vertical interconnect column 4'. Above the drive transistors Q3 and Q4 are a pair of horizontal interconnect beams 3, 3' buried in an inter-layer insulating film. The horizontal interconnect beam 3 connects Q3 to the vertical interconnect column 4, and the horizontal interconnect beam 3' connect Q4 to the vertical interconnect column 4'. An additional pair of horizontal interconnects 3, 3' are provided in this embodiment than the fourth embodiment. The horizontal interconnect beam 3 connects Q6 to the vertical interconnect column 4, and the horizontal interconnect beam 3' connect Q5 to the vertical interconnect column 4'. Q3, Q4 are connected to one shared Vss beam 12, and Q1, Q2 are connected to a Vcc beam 13 with Vcc contacts 14, 14'. Thus, high integration and low-drive-voltage operation become possible.

Comparing with the fifth embodiment, the unit cell height of this embodiment is the same as that of the fifth embodiment. As such, its height is lower than the first, second, third, and fourth embodiments. The separation of gate electrode blocks of Q5, Q6 evens the length of horizontal interconnects 3, 3', which results in more homogeneous SRAM properties. However, as this creates one more gate electrode block which requires more space.

Figure 47:
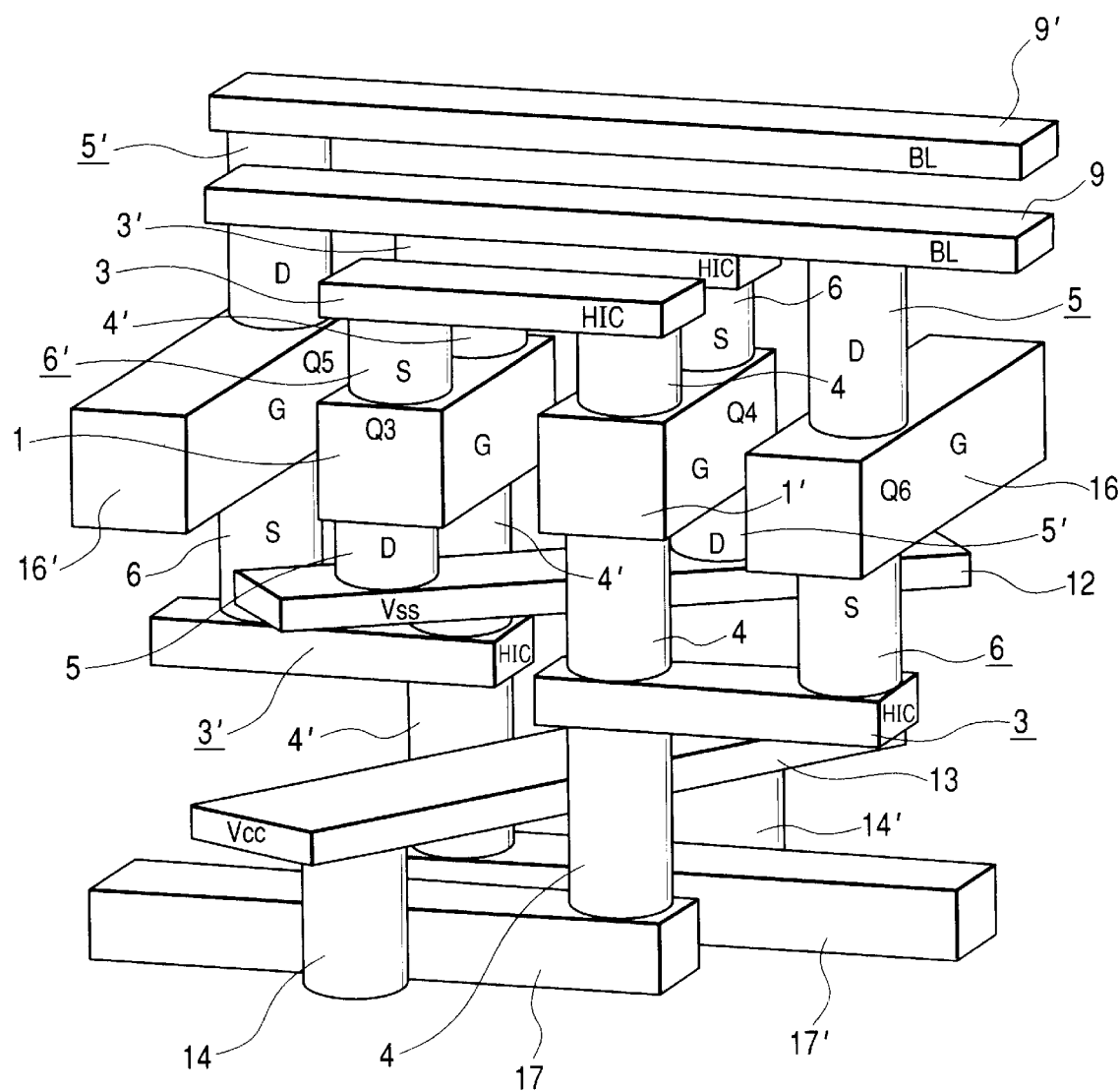
FIG. 47 is a 3D perspective view of the structure of the sixth embodiment of the vertical SRAM cell according to the invention.
Figure 48:
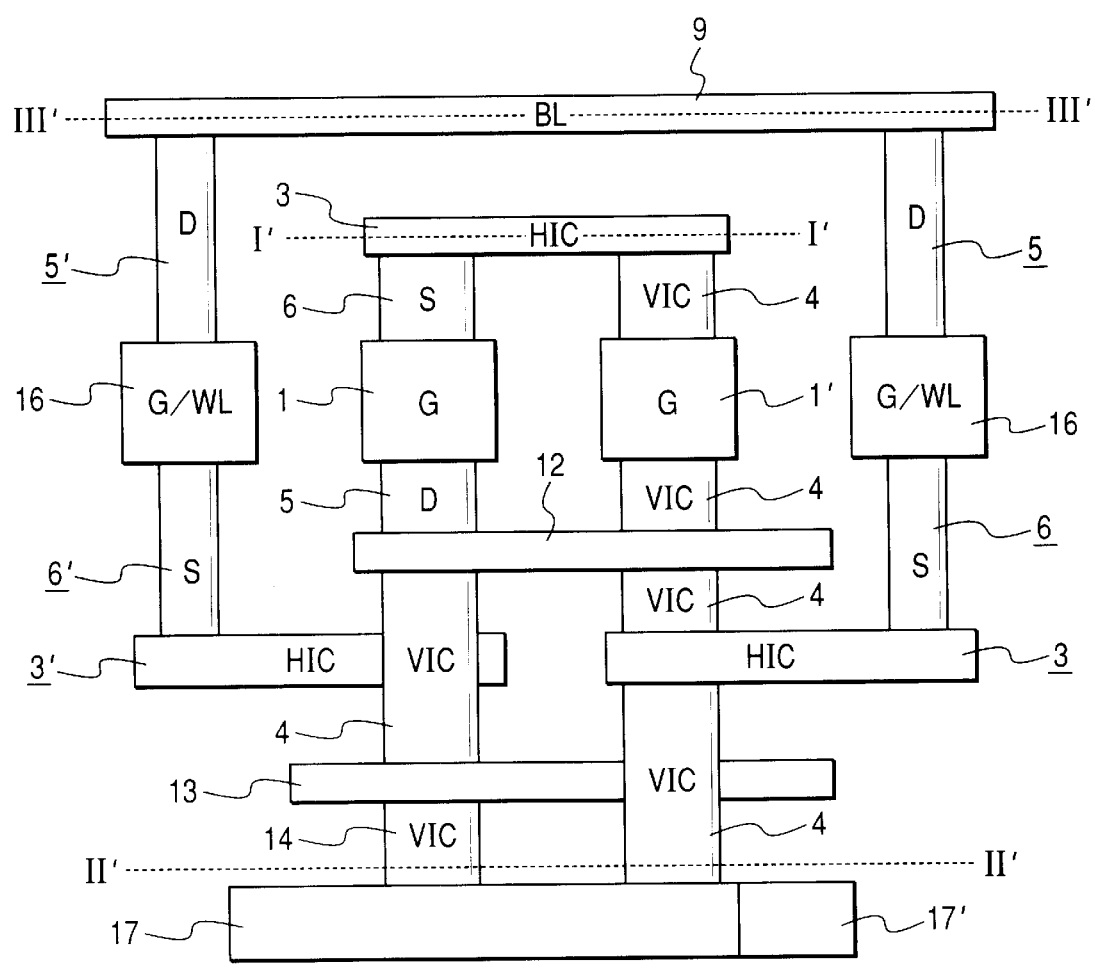
FIG. 48 shows a side view of the 3D structure in FIG. 47 from the plane of the front end of the word line 16 (G/WL).
Figure 49:
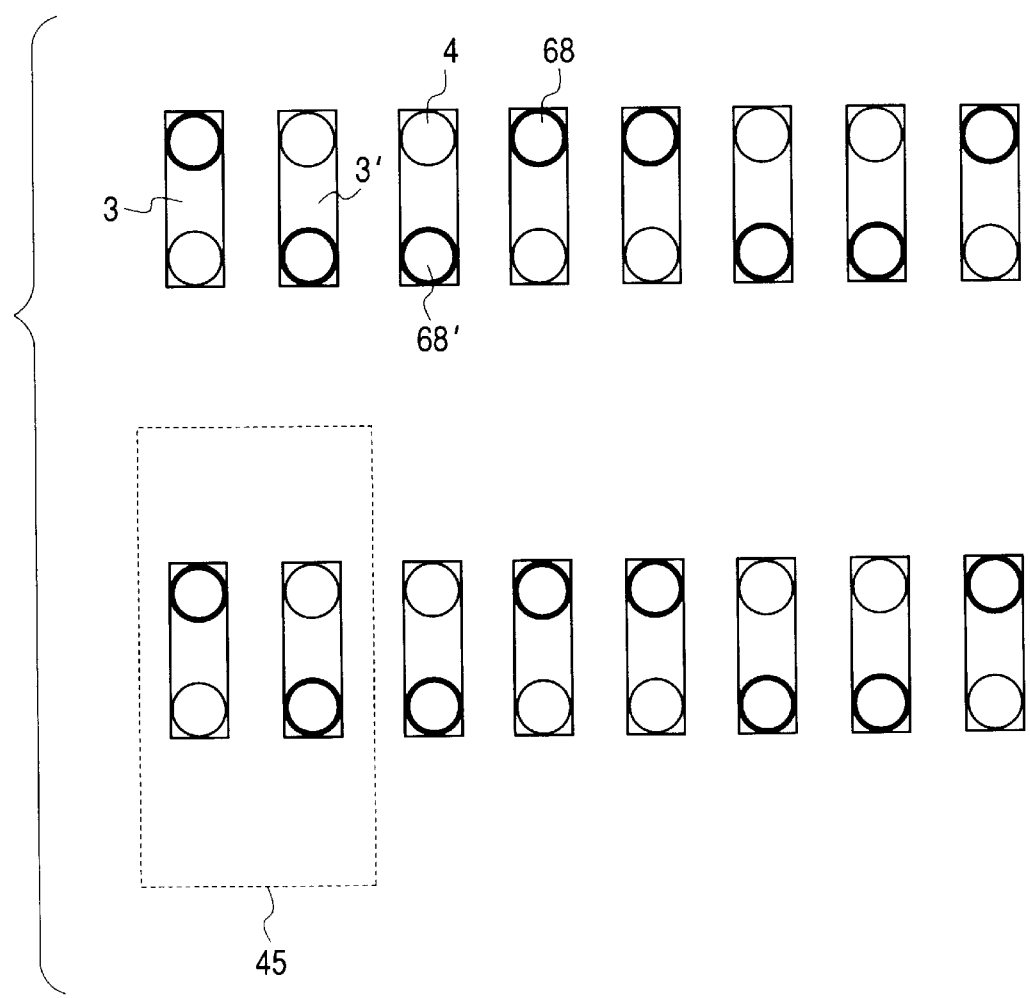
FIG. 49 schematically shows a top view of the horizontal interconnects in the layout of a plurality of SRAM cells of the sixth embodiment of FIG. 47.

By looking down from a plane I'—I' in FIG. 48, FIG. 49 schematically shows the top view of the horizontal interconnects in the layout of a plurality of SRAM cells of the sixth embodiment of FIG. 47. 68, 68' denote the position of the vertical transistors Q3, Q4. The interconnects 3, 3' are perpendicular to the gate electrodes of the vertical transistors in FIG. 47. 45 denotes an area for one unit cell of the sixth embodiment in FIG. 47. Comparing with the third/fourth/fifth embodiments respectively, FIG. 49 looks almost the same as FIGS. 29/37/42 except its both rows are longer, such as 100%/60%/33% longer, than the one of the third/fourth/fifth embodiments. This is a result of additional vertical gate electrode blocks. By analogy, this is a direct result of the layout in FIG. 51 and the 3D structure in FIG. 47.

Figure 50:
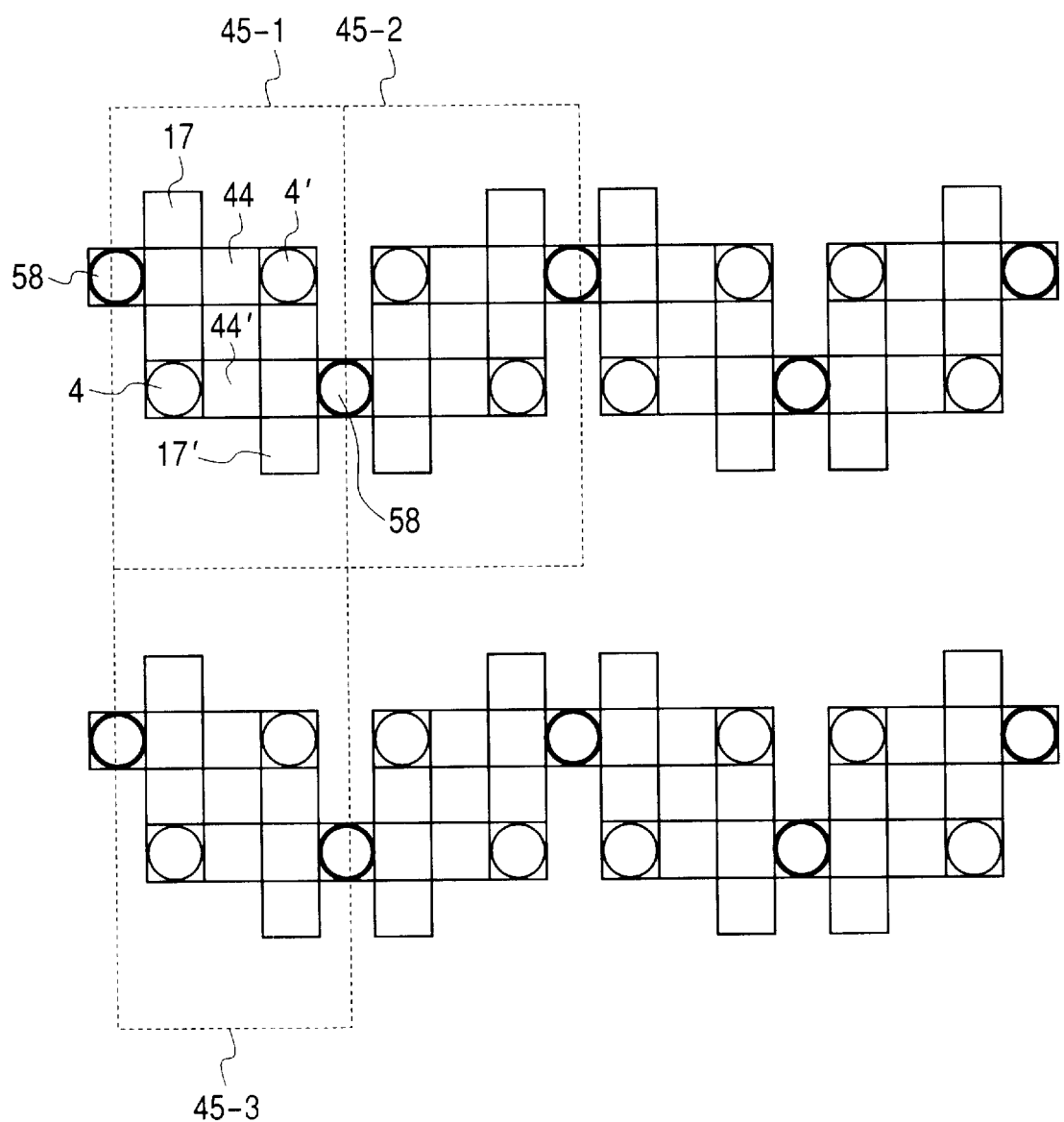
FIG. 50 schematically shows a top view of the horizontal transistors in the layout of a plurality of SRAM cells of the sixth embodiment of FIG. 47.

By looking down from a plane II'—II' in FIG. 48, FIG. 50 schematically shows the top view of the horizontal transistors in the layout of a plurality of SRAM cells of the sixth embodiment of FIG. 47. 4 & 4' denote two vertical interconnects. 17, 17' denote the two horizontal interconnects. 58 denotes Vss/Vcc contacts. 44 denotes the active regions of the horizontal transistors Q1, Q2. 45 denotes an area for one unit cell of the sixth embodiment in FIG. 47. Comparing with other embodiments (FIGS. 11, 20, 34, 43), this embodiment requires bigger area space over the substrate than the fifth embodiment due to its four parallel gate electrode blocks in one vertical level. Consequently, it also requires more area space than the second, third, first, and fifth embodiments. The fifth embodiment takes three parallel gate electrode blocks in the same vertical level, the first, third, and fourth embodiments only have two parallel gate electrode blocks in the same vertical level, and the second embodiment has merely one single gate electrode blocks in each vertical level. 45 denotes an area for the unit cell of the sixth embodiment in FIG. 47. By arranging the unit cell 45-1 parallel with the lower portion of the unit cell 45-2, the two unit cells share Vss and Vcc. On the other hand, by arranging the middle portion of the unit cell 45-1 parallel with the middle portion of the unit cell 45-3, the two unit cells do not share Vss and Vcc.

Figure 51:
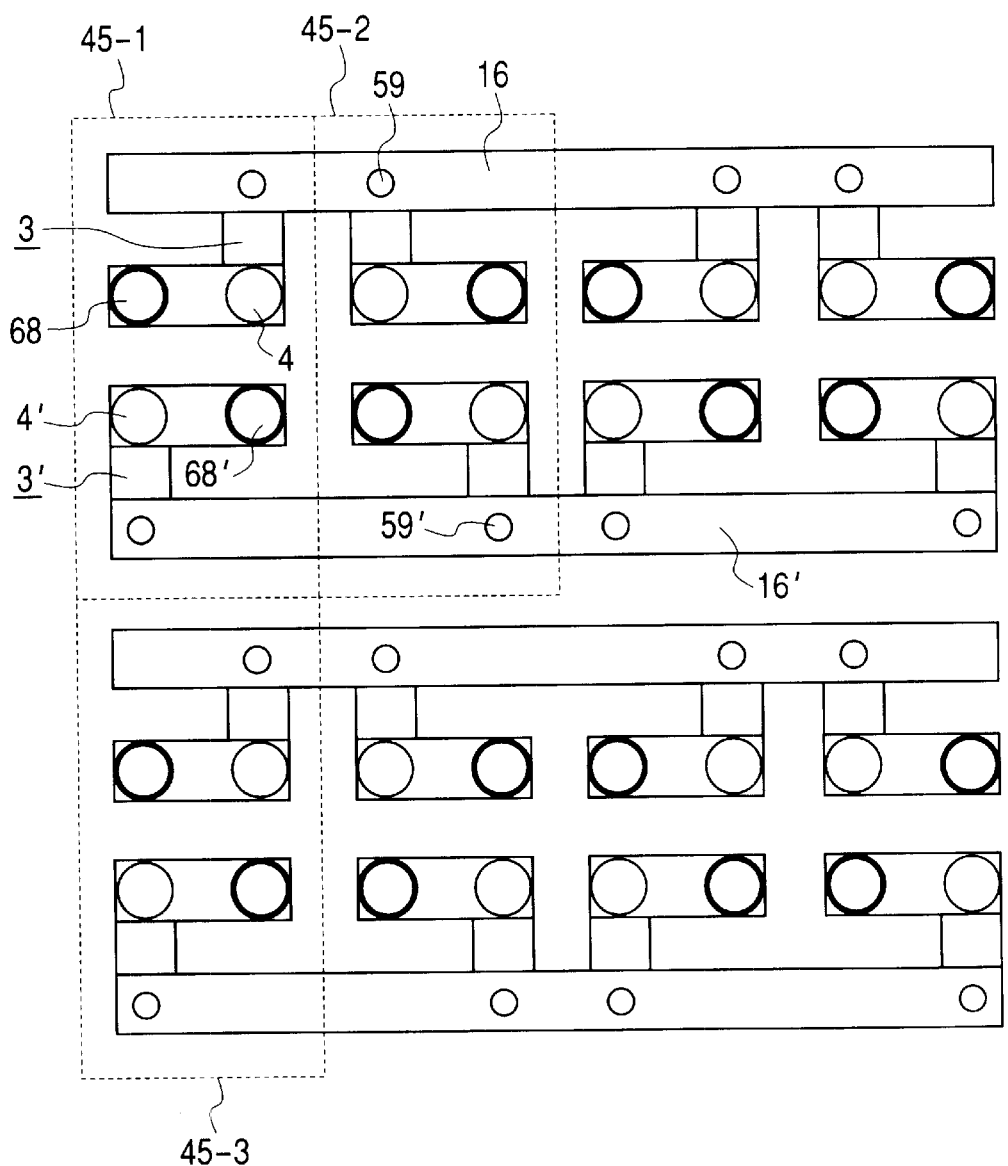
FIG. 51 schematically shows a top view of the four vertical transfer transistors Q3, Q4, Q5, Q6 in the layout of a plurality of SRAM cells of the sixth embodiment of FIG. 47.

By looking down from a plane III'—III' in FIG. 48, FIG. 51 schematically shows the top view of the four vertical transfer transistors Q3, Q4, Q5, Q6 in the layout of a plurality of SRAM cells of the sixth embodiment of FIG. 47 (by ignoring the intermediate horizontal interconnects and Vss). The word lines 16, 16' which are embedded with the gate electrodes of Q5, Q6 respectively. 59 & 59' denote the positions of the two vertical transistors Q6, Q5, and 68 & 68' denote the positions of the two vertical transistors Q4, Q3. 3 & 3' denote the two horizontal interconnects connecting Q6, Q5 to the vertical interconnects 4, 4' respectively. Comparing with the third/fourth/fifth embodiments respectively, FIG. 51 looks almost the same as FIGS. 27/35/44 except its both rows are longer, such as 100%/60%/33% longer, than the one of the third/fourth/fifth embodiments. This is a result of additional vertical gate electrode blocks. The sixth embodiment has a layout in FIG. 51 with a horizontal layout with a middle portion having the same square as the third and fourth embodiments but with two additional vertical transistors set at two sides of a larger rectangular than the fifth embodiment. Therefore, the smallest pitch of the sixth embodiment is larger than the respective one in the fifth, forth and third embodiments, and the respective one in the first and second embodiments.

The sixth embodiment can also be easily modified by shifting around the building blocks or their portions. As discussed later in the seventh embodiment, the load transistors may be eliminated from the six embodiment.

The process flow of the sixth embodiment is similar to the one of the first embodiment or any other prior embodiments, which is easily to be figured out by one skilled in the art.

Seventh Embodiment (4T SRAM)

In additional to the discussed six-transistor (6T) cell form, the invention includes another species of SRAM cells having only four transistors (without two load transistors). The seventh embodiment is obtained by substituting the load transistors with the parasitic resistance of the four drive and transfer transistors (as the load elements for controlling the flip-flop operation using the leakage current). Thus, the use of the 4T configuration is incorporated into the invention to further reduce the cell size by reducing the transistor number, but at the cost of increasing leakage current.

The four vertical transistors are preferably two n-channel devices with two p-channel devices. The process flow of the seventh embodiment is similar to the one of the first embodiment or any other prior embodiments, which is easily to be figured out by one skilled in the art.

There are many conceivable variations of the dimensions of the described layers, regions, masks and structures to be adapted to the respective requirements of the embodiments of the invention. The semiconductor structure does not have to be web-shaped, but rather can be adapted to the respective requirements. The sidewalls, the S-C-D columns, the vertical interconnects of the semiconductor structures do not have to run perpendicularly to the substrate surface of the semiconductor structure, but rather can form any desired angle with the surface of the semiconductor structure. Bit line and word line do not have to run parallel with the substrate, but rather can form any desired angle.

The principles, preferred embodiments and modes of operation of the present invention have been described in the foregoing specification. However, the invention which is intended to be protected is not limited to the particular embodiments disclosed. The embodiments described herein are illustrative rather than restrictive. Variations and changes may be made by one skilled in the art without departing from the spirit of the present invention. Accordingly, it is expressly intended that all such variations or changes which fall within the spirit and scope of the present invention as defined in the claims, be embraced thereby.

What is claimed is:

1. A semiconductor memory device comprising:

a plurality of word lines;

a plurality of bit lines; and a plurality of static memory cells each having a first, second, third, fourth, fifth, and sixth transistors;

wherein each of channels of said first, second, third, and fourth transistors are formed above a surface of a substrate of said semiconductor memory device, wherein currents flowing through said channels of said first, second, third, and fourth transistors flow in a vertical direction which is vertical against the surface of the substrate of the semiconductor memory device, wherein said first, second, third, and fourth, transistors are formed above said fifth and sixth transistors along the vertical direction.

2. The memory device according to claim 1, wherein each of semiconductor regions forming a source or a drain of said fifth and sixth transistors forms a PN junction against said substrate.

3. The memory device according to claim 2, wherein gate electrodes of said fifth and sixth transistors are coupled to said word lines, and wherein each source-drain path of said fifth and sixth transistors are coupled to said bit lines, and wherein each of said plurality of static memory cells uses plugs for interconnection.

4. The memory device according to claim 2, wherein a gate electrode of said fifth transistor is coupled to the drain of said sixth transistor, wherein a gate electrode of said sixth transistor is coupled to the drain of said fifth transistor, and wherein each of said fifth and sixth transistors has the same conductivity type as said first and second transistors.

5. The semiconductor memory device according to claim 2, wherein a gate electrode of said fifth transistor is coupled to the drain of said sixth transistor, wherein a gate electrode of said sixth transistor is coupled to the drain of said fifth transistor, and wherein each of said fifth and sixth transistors has a different conductivity type from said first and second transistors.

6. The semiconductor memory device according to claim 1,
wherein gate electrodes of the first and second transistors are formed on a first layer, and
wherein gate electrodes of the third and fourth transistors are formed on a second layer.

7. The semiconductor memory device according to claim 1,
wherein a gate electrode of the first transistor is formed on a first layer,
wherein a gate electrode of the second transistor is formed on a second layer,
wherein a gate electrode of the third transistor is formed on a third layer, and
wherein a gate electrode of the fourth transistor is formed on a fourth layer.

8. The semiconductor memory device according to claim 1,
wherein a column forming the channel of the first transistor is covered with a gate electrode surrounding a cylindrical surface of the column with an insulating layer therebetween.

9. The semiconductor memory device according to claim 1,
wherein the channels of said fifth, and sixth transistor are formed vertical against the substrate, and wherein said substrate is made of single crystal silicon.

10. A SRAM device having a plurality of SRAM cells, at least one of which is a SRAM cell comprising at least one transistor above a substrate surface and two other transistors having both sources and drains inside the substrate,
wherein said transistor above the substrate surface includes a source, a drain, and a channel therebetween aligning in one aligning line extending in a first direction,
wherein currents flowing through channels of said two other transistors flow in a second direction which crosses said first direction at an angle greater than zero degree and smaller than 90 degree.

11. The SRAM device according to claim 10, wherein said second direction is parallel with the substrate surface.

12. The SRAM device according to claim 10,
wherein said channel of said transistor above the substrate surface is surrounded with a gate insulating layer on all sides,
wherein the SRAM cell comprises four of said transistor above the substrate surface, and
wherein said two other transistors each includes a pair of P-N junctions against the substrate surface therein.

13. The SRAM device according to claim 12, wherein said two other transistors operate as a pair of drive MOS transistors, and wherein a pair of load transistors are formed by said transistors above the substrate surface.

14. The SRAM device according to claim 12, wherein the four transistors above the substrate surface are divided in two groups located in two different levels.

15. The SRAM device according to claim 14, wherein the transistors located in different levels are selectively connected to each other via at least one vertical interconnect which is parallel with said aligning line.

16. The SRAM device according to claim 15, wherein at least one vertical interconnect cross links with at least one of a horizontal interconnect, a horizontal Vcc beam, and a horizontal Vss beam, each of which is parallel with the substrate surface.

17. The SRAM device according to claim 15, wherein at least one vertical interconnect, which penetrates through at least one gate electrode of the transistors above the substrate surface, has a shape with a first dimension and a second dimension parallel with the substrate surface, and a third dimension parallel with said aligning line.

18. The SRAM device according to claim 17, wherein said at least one vertical interconnect penetrates through at least two gate electrodes of the transistors above the substrate surface.

19. The SRAM device according to claim 15, wherein said at least one vertical interconnect include two vertical interconnects connecting with two of the vertical transistors above the substrate surface respectively thereby forming one unit SRAM cell thereamong in a shape of a diagonal or parallelogram on a cross section parallel with the substrate surface.

20. The SRAM device according to claim 12, wherein the SRAM cell further comprises at least one pair bit lines being respectively connected to at least one of the transistors via two vertical interconnects which are parallel with said aligning line, and each of the bit lines is connected with a plurality of bit line contacts, each of which is shared by two adjacent SRAM cells of the plurality of SRAM cells.

21. The SRAM device according to claim 12, wherein said each of the transistors above the substrate surface further includes a gate electrode having a shape with a first dimension and a second dimension parallel with the substrate surface, and a third dimension parallel with said aligning line.

22. The SRAM device according to claim 10, further comprising at least another one of the SRAM cell being built above the vertical SRAM cell with a dielectric layer therebetween.

23. The SRAM device according to claim 10, wherein three different poly silicon layers are provided as a source layer, a channel layer, and a drain layer of said at least one transistor above the substrate surface.

* * * * *